(12) United States Patent
Brillhart et al.

(10) Patent No.: US 8,012,304 B2
(45) Date of Patent: *Sep. 6, 2011

(54) PLASMA REACTOR WITH A MULTIPLE ZONE THERMAL CONTROL FEED FORWARD CONTROL APPARATUS

(75) Inventors: Paul Lukas Brillhart, Pleasanton, CA (US); Richard Fovell, San Jose, CA (US); Hamid Tavassoli, Cupertino, CA (US); Douglas A. Buchberger, Jr., Livermore, CA (US); Douglas H. Burns, Saratoga, CA (US); Kallol Bera, San Jose, CA (US); Daniel J. Hoffman, Saratoga, CA (US)

(73) Assignees: Applied Materials, Inc., Santa Clara, CA (US); Advanced Thermal Sciences Corporation, Anaheim, CA (US)

( * ) Notice: Subject to any disclaimer, the term of this patent is extended or adjusted under 35 U.S.C. 154(b) by 337 days.

This patent is subject to a terminal disclaimer.

(21) Appl. No.: 11/408,559

(22) Filed: Apr. 21, 2006

(65) Prior Publication Data

US 2007/0089834 A1    Apr. 26, 2007

Related U.S. Application Data

(60) Provisional application No. 60/729,314, filed on Oct. 20, 2005.

(51) Int. Cl.
*H01L 21/306* (2006.01)
*C23C 16/46* (2006.01)
*C23C 16/52* (2006.01)

(52) U.S. Cl. ......... 156/345.27; 156/345.52; 156/345.53; 118/724; 118/725; 118/728

(58) Field of Classification Search .................. 361/234; 156/345.27, 345.52, 345.53; 118/724, 725, 118/728

See application file for complete search history.

(56) References Cited

U.S. PATENT DOCUMENTS 2,707,868 A    5/1955   Goodman ............................ 62/4
(Continued)

FOREIGN PATENT DOCUMENTS

JP          63029220 A    2/1988
(Continued)

OTHER PUBLICATIONS

*Advanced Thermal Sciences Corporation v. Applied Materials, Inc.*, Civil Action No. SACV 07-1384 JVS (JWJx), "Complaint For Correction of Inventorship; Reformation And Declaration Of Contract Rights; Breach Of Contract And Declaration Of Inventorship and Demand For Jury Trial", filed Nov. 29, 2007.

(Continued)

*Primary Examiner* — Jeffrie R Lund
(74) *Attorney, Agent, or Firm* — Knobbe, Martens, Olson & Bear, LLP

(57) ABSTRACT

A plasma reactor having a reactor chamber and an electrostatic chuck having a surface for holding a workpiece inside the chamber includes inner and outer zone backside gas pressure sources coupled to the electrostatic chuck for applying a thermally conductive gas under respective pressures to respective inner and outer zones of a workpiece-surface interface formed whenever a workpiece is held on the surface, and inner and outer zone heat exchangers coupled to respective inner and outer zones of said electrostatic chuck. The reactor further includes inner and outer zone temperature sensors in inner and outer zones of the electrostatic chuck and a thermal model capable of simulating heat transfer through the inner and outer zones, respectively, between the evaporator and the surface based upon measurements from the inner and outer temperature sensors, respectively. Inner and outer zone agile control processors coupled to the thermal model govern the inner and outer zone backside gas pressure sources, respectively, in response to predictions from the model of changes in the respective pressures that would bring the temperatures measured by the inner and outer zone sensors, respectively, closer to a desired temperature.

11 Claims, 31 Drawing Sheets

U.S. PATENT DOCUMENTS

| | | | |
|---|---|---|---|
| 3,826,304 A | 7/1974 | Withers et al. | 165/468 |
| 3,933,004 A | 1/1976 | Carter et al. | 62/199 |
| 4,042,686 A | 8/1977 | Pommer et al. | 424/705 |
| 4,313,783 A | 2/1982 | Davies et al. | 438/716 |
| 4,384,918 A | 5/1983 | Abe | 216/71 |
| 4,705,951 A | 11/1987 | Layman et al. | 250/442.11 |
| 4,752,141 A | 6/1988 | Sun et al. | 374/161 |
| 4,853,534 A | 8/1989 | Dakin | 250/227.17 |
| 4,883,354 A | 11/1989 | Sun et al. | 356/128 |
| 4,934,155 A | 6/1990 | Lowes | 62/197 |
| 5,057,968 A | 10/1991 | Morrison | 361/700 |
| 5,258,614 A | 11/1993 | Kidwell et al. | 250/227.16 |
| 5,320,982 A | 6/1994 | Tsubone et al. | 438/714 |
| 5,410,889 A | 5/1995 | Sjoholm et al. | 62/160 |
| 5,471,850 A | 12/1995 | Cowans | 62/223 |
| 5,549,756 A * | 8/1996 | Sorensen et al. | 118/715 |
| 5,551,249 A | 9/1996 | Van Steenburgh, Jr. | 62/196.4 |
| 5,556,204 A | 9/1996 | Tamura et al. | 374/161 |
| 5,567,267 A | 10/1996 | Kazama et al. | 156/345.27 |
| 5,625,526 A | 4/1997 | Watanabe et al. | 361/234 |
| 5,650,082 A | 7/1997 | Anderson | 219/390 |
| 5,701,758 A | 12/1997 | Haramoto et al. | 62/503 |
| 5,742,022 A | 4/1998 | Crawford | 219/86.25 |
| 5,748,435 A | 5/1998 | Parkhe | 361/234 |
| 5,761,023 A | 6/1998 | Lue et al. | 361/234 |
| 5,762,009 A | 6/1998 | Garrison et al. | 110/346 |
| 5,787,723 A | 8/1998 | Mueller et al. | 62/347 |
| 5,815,396 A | 9/1998 | Shimamura et al. | |
| 5,878,583 A | 3/1999 | Schlosser et al. | 62/73 |
| 5,886,866 A | 3/1999 | Hausmann | 361/234 |
| 5,888,907 A | 3/1999 | Tomoyasu et al. | 438/714 |
| 5,970,731 A | 10/1999 | Hare et al. | 62/196.4 |
| 5,994,675 A | 11/1999 | Bethune et al. | 219/483 |
| 6,015,465 A | 1/2000 | Kholodenko et al. | 118/719 |
| 6,018,616 A | 1/2000 | Schaper | 392/418 |
| 6,033,482 A | 3/2000 | Parkhe | 118/728 |
| 6,066,824 A | 5/2000 | Crawford et al. | 219/86.31 |
| 6,076,366 A | 6/2000 | Takano et al. | 62/196.4 |
| 6,091,060 A | 7/2000 | Getchel et al. | 219/483 |
| 6,094,334 A | 7/2000 | Bedi et al. | 361/234 |
| 6,098,408 A | 8/2000 | Levinson et al. | 62/3.2 |
| 6,125,025 A | 9/2000 | Howald et al. | 361/234 |
| 6,135,052 A | 10/2000 | Fuji et al. | 118/723 E |
| 6,169,274 B1 | 1/2001 | Kulp | 219/497 |
| 6,174,408 B1 | 1/2001 | Kadomura et al. | 156/345.27 |
| 6,196,553 B1 | 3/2001 | Arab-Sadeghabadi et al. | 277/603 |
| 6,205,803 B1 | 3/2001 | Scaringe | 62/259.2 |
| 6,246,567 B1 | 6/2001 | Parkhe | 361/234 |
| 6,283,632 B1 * | 9/2001 | Takaki | 374/161 |
| 6,318,384 B1 | 11/2001 | Khan et al. | 134/22.1 |
| 6,320,736 B1 | 11/2001 | Shamouilian et al. | 361/234 |
| 6,353,210 B1 * | 3/2002 | Norrbakhsh et al. | 219/497 |
| 6,397,629 B2 | 6/2002 | Wightman | 62/513 |
| 6,412,344 B1 | 7/2002 | Danicich et al. | 73/290 V |
| 6,461,980 B1 | 10/2002 | Cheung et al. | 438/765 |
| 6,468,384 B1 | 10/2002 | Singh et al. | 156/345.27 |
| 6,481,886 B1 | 11/2002 | Narendrnath et al. | 374/141 |
| 6,526,771 B2 | 3/2003 | Takano et al. | 62/228.3 |
| 6,543,246 B2 | 4/2003 | Wayburn et al. | 62/259.2 |
| 6,557,371 B1 | 5/2003 | Judge | 62/468 |
| 6,564,563 B2 | 5/2003 | Goth et al. | 62/157 |
| 6,581,398 B2 | 6/2003 | Wrightman | 62/222 |
| 6,583,980 B1 | 6/2003 | Wang et al. | 361/234 |
| 6,623,596 B1 | 9/2003 | Collins et al. | 156/345.48 |
| 6,645,871 B2 * | 11/2003 | Tamura et al. | 361/234 |
| 6,656,849 B2 | 12/2003 | Ogino et al. | 48/714 |
| 6,664,048 B1 | 12/2003 | Wanker et al. | 506/4 |
| 6,668,570 B2 | 12/2003 | Wall et al. | 62/223 |
| 6,681,580 B2 | 1/2004 | Shedivy et al. | 62/73 |
| 6,705,095 B2 | 3/2004 | Thompson, Jr. et al. | 62/117 |
| 6,709,715 B1 | 3/2004 | Lang et al. | 427/489 |
| 6,740,853 B1 | 5/2004 | Johnson et al. | 219/444.1 |
| 6,758,457 B2 | 7/2004 | Nicolino et al. | 251/149.6 |
| 6,758,602 B2 | 7/2004 | Yamaguchi et al. | 358/78 |
| 6,838,390 B2 | 1/2005 | Langley et al. | 438/715 |
| 6,853,141 B2 * | 2/2005 | Hoffman et al. | 315/111.21 |
| 6,893,533 B2 | 5/2005 | Holland et al. | 156/345.48 |
| 6,900,596 B2 | 5/2005 | Yang et al. | 315/111.21 |
| 6,946,053 B2 | 9/2005 | Donohoe | 156/345.44 |
| 6,993,922 B2 | 2/2006 | Wall et al. | 62/223 |
| 7,043,930 B2 | 5/2006 | Bussjager et al. | 62/196.4 |
| 7,138,067 B2 | 11/2006 | Vahedi et al. | 216/67 |
| 7,156,951 B1 * | 1/2007 | Gao et al. | 156/345.53 |
| 7,178,353 B2 * | 2/2007 | Cowans et al. | 62/196.4 |
| 7,415,835 B2 | 8/2008 | Cowans et al. | 62/190 |
| 2002/0000198 A1 | 1/2002 | Ishikawa et al. | 118/715 |
| 2002/0014894 A1 | 2/2002 | Yonezawa et al. | 324/760 |
| 2002/0139477 A1 | 3/2002 | Ni et al. | 156/345.44 |
| 2002/0108933 A1 | 8/2002 | Hoffman et al. | 219/121.43 |
| 2002/0135969 A1 | 9/2002 | Weldon et al. | 361/234 |
| 2003/0228772 A1 | 12/2003 | Cowans | 438/795 |
| 2004/0040664 A1 | 3/2004 | Yang et al. | |
| 2004/0056602 A1 | 3/2004 | Yang et al. | 315/111.21 |
| 2004/0134769 A1 | 7/2004 | Wang et al. | 204/192.17 |
| 2004/0173311 A1 | 9/2004 | Ichimaru et al. | 156/345.27 |
| 2004/0258130 A1 | 12/2004 | Gotthold et al. | |
| 2005/0016471 A1 | 1/2005 | Chiang et al. | 118/728 |
| 2005/0025500 A1 | 2/2005 | Hallemeier et al. | 398/186 |
| 2005/0045104 A1 | 3/2005 | Arai et al. | 118/724 |
| 2005/0155373 A1 | 7/2005 | Hirooka et al. | 62/498 |
| 2005/0230047 A1 | 10/2005 | Collins et al. | 156/345.33 |
| 2006/0076109 A1 | 4/2006 | Holland et al. | 156/345.27 |
| 2007/0095097 A1 | 2/2007 | Cowans et al. | 62/196.4 |
| 2007/0056512 A1 * | 3/2007 | Hwang et al. | 118/666 |
| 2007/0081294 A1 * | 4/2007 | Buchberger et al. | 361/234 |
| 2007/0081295 A1 | 4/2007 | Brillhart et al. | 361/234 |
| 2007/0081296 A1 | 4/2007 | Brillhart et al. | 361/234 |
| 2007/0089834 A1 * | 4/2007 | Brillhart et al. | 156/345.27 |
| 2007/0091537 A1 * | 4/2007 | Buchberger et al. | 361/234 |
| 2007/0091538 A1 * | 4/2007 | Buchberger et al. | 361/234 |
| 2007/0091539 A1 * | 4/2007 | Buchberger et al. | 361/234 |
| 2007/0091540 A1 * | 4/2007 | Brillhart et al. | 361/234 |
| 2007/0091541 A1 * | 4/2007 | Buchberger et al. | 361/234 |
| 2007/0097580 A1 | 5/2007 | Brillhart et al. | 361/103 |
| 2007/0102118 A1 | 5/2007 | Holland et al. | 156/345.27 |
| 2007/0139856 A1 | 6/2007 | Holland et al. | 361/234 |
| 2008/0225926 A1 | 9/2008 | Gotthold et al. | 374/131 |
| 2010/0319851 A1 | 12/2010 | Buchberger et al. | |

FOREIGN PATENT DOCUMENTS

| | | |
|---|---|---|
| JP | 05-144777 | 6/1993 |
| JP | 05163096 A | 6/1993 |
| JP | 06-331457 | 12/1994 |
| JP | 2003-174016 | 6/2003 |
| JP | 2003-243492 | 8/2003 |
| JP | 2005-085803 | 3/2005 |
| JP | 2005-089864 | 4/2005 |
| JP | 2005-527119 | 9/2005 |
| JP | 2005-528790 | 9/2005 |
| JP | 2001-358121 | 12/2009 |
| WO | WO 03/100818 | 12/2003 |
| WO | WO 03/103004 | 12/2003 |
| WO | WO 2004025199 A1 | 3/2004 |

OTHER PUBLICATIONS

*Advanced Thermal Sciences Corporation v. Applied Materials, Inc.*, Case No. 8:07-CV-1384 (JVS) (JWJx), "Defendant Applied Materials, Inc.'s Answer To Plaintiff's Complaint, Affirmative Defenses And Amended Counterclaims and Demand For Jury Trial", filed Aug. 21, 2008.

*Advanced Thermal Sciences Corporation v. Applied Materials, Inc.*, Civil Action No. SAVC 07-1384 JVS (JWJx), "Supplemental Complaint For Fraud and Demand For Jury Trial", filed Oct. 21, 2008.

Katzenellenbogen, letter to Robert M. Wallace, Jul. 25, 2008.

Official Action dated Dec. 18, 2009 issued in co-pending U.S. Appl. No. 11/410,782.

Official Action dated Dec. 29, 2009 issued in co-pending U.S. Appl. No. 11/409,183.

Official Action dated Dec. 29, 2009 issued in co-pending U.S. Appl. No. 11/408,567.

Official Action dated Jan. 5, 2010 issued in co-pending U.S. Appl. No. 11/408,333.

Official Action dated Jan. 11, 2010 issued in co-pending U.S. Appl. No. 11/408,558.
Official Action dated Sep. 23, 2009 issued in co-pending U.S. Appl. No. 11/408,558.
Official Action dated Oct. 13, 2009 issued in co-pending U.S. Appl. No. 11/509,184.
Official Action dated Oct. 15, 2009 issued in co-pending U.S. Appl. No. 11/409,292.
Official Action dated Oct. 26, 2009 issued in co-pending U.S. Appl. No. 11/409,326.
*Advanced Thermal Sciences Corporation* v. *Applied Materials, Inc.*, Civil Action No. SACV 07-1384 JVS (JWJx) , "Final Pretrial Conference Order", filed Oct. 28, 2009.
*Advanced Thermal Sciences Corporation* v. *Applied Materials, Inc.*, SACV 07-1384 JVS (JWJx), "Advanced Thermal Sciences Corp.'s Post-Trial Brief in Response to Applied Materials, Inc.'s [Proposed] Findings of Fact and Conclusions of Law", filed Dec. 14, 2009.
*Advanced Thermal Sciences Corporation* v. *Applied Materials, Inc.*, Case No. 8:07-CV-1384 (JVS) (JWJ), "Applied Materials, Inc.'s Post Trial Brief", filed Dec. 14, 2009.
*Advanced Thermal Sciences Corporation* v. *Applied Materials, Inc*, Case No. SACV07-01384-JVS (JWJx) , "Civil Minutes—Trial", filed Dec. 22, 2009.
Official Action Dated Mar. 9, 2010 Issued in Co-Pending U.S. Appl. No. 11/409,292.
Official Action Dated Mar. 22, 2010 Issued in Co-Pending U.S. Appl. No. 11/408,333.
Official Action Dated Apr. 2, 2010 Issued in Co-Pending U.S. Appl. No. 11/410,859.
Official Action Dated Apr. 15, 2010 Issued in Co-Pending U.S. Appl. No. 11/410,782.
Official Action Dated May 5, 2010 Issued in Co-Peding U.S. Appl. No. 11/409,326.
*Advanced Thermal Sciences Corporation* v. *Applied Materials, Inc.*, Civil Action No. SACV 07-1384 JVS (JWJx), "Judgment", filed Jul. 6, 2010.
*Advanced Thermal Sciences Corporation* v. *Applied Materials, Inc.*, Civil Action No. SACV 07-1384 JVS (JWJx), "Stipulated Order On Settlement", filed Jul 23, 2010.
Official Action Dated Jun. 7, 2010 Issued in Co-Pending U.S. Appl. No. 11/410,859.
Official Action Dated Jun. 8, 2010 Issued in Co-Pending U.S. Appl. No. 11/409,326.
Official Action Dated Jun. 16, 2010 Issued in Co-Pending U.S. Appl. No. 11/409,184.
Official Action Dated Jun. 21, 2010 Issued in Co-Pending U.S. Appl. No. 11/408,558.
Official Action Dated Jul. 23, 2010 Issued in Co-Pending U.S. Appl. No. 11/409,292.
Japanese Official Action Dated Nov. 24, 2009 in Japanese Application No. 2006-221559.
Japanese Official Action Dated Nov. 24, 2009 in Japanese Application No. 2006-221560.
Official Action Dated Jan. 25, 2010 in Co-Pending U.S. Appl. No. 11/409,184.
Official Action Dated Jan. 29, 2010 in Co-Pending U.S. Appl. No. 11/409,326.
Official Action Dated Apr. 15, 2010 in Co-Pending U.S. Appl. No. 11/409,326.
Official Action Dated Sep. 10, 2009 in Co-Pending U.S. Appl. No. 11/410,782.
Official Action Dated Sep. 17, 2009 in Co-Pending U.S. Appl. No. 11/409,183.
Official Action Dated Sep. 28, 2009 in Co-Pending U.S. Appl. No. 11/410,859.
Official Action Dated Dec. 4, 2009 in Co-Pending U.S. Appl. No. 11/409,183.

* cited by examiner

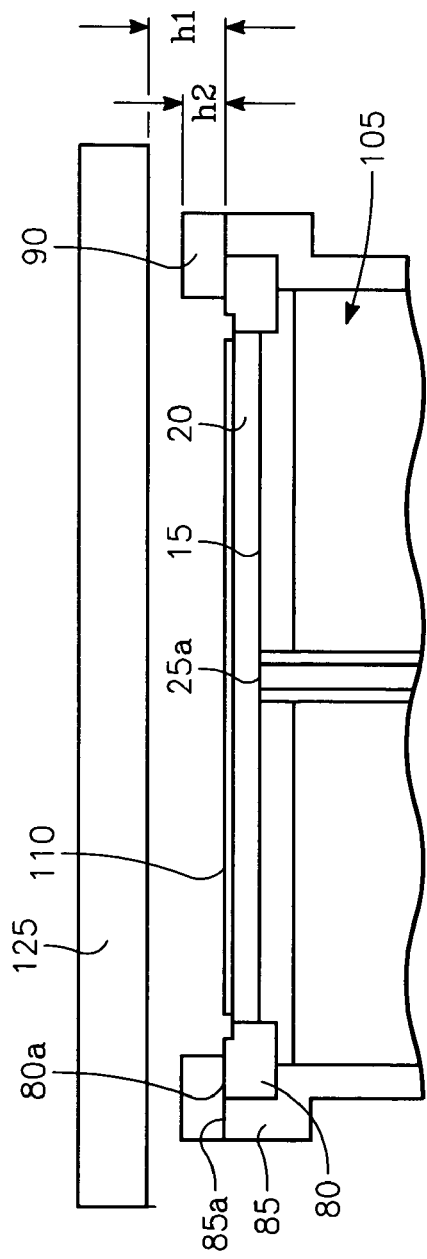
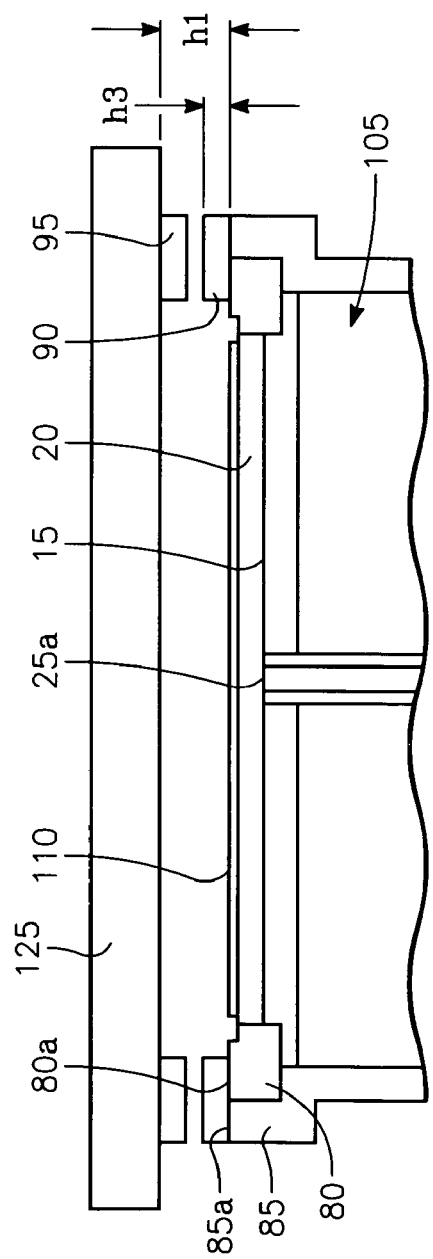

PLASMA REACTOR WITH A MULTIPLE ZONE THERMAL CONTROL FEED FORWARD CONTROL APPARATUS

CROSS-REFERENCE TO RELATED APPLICATIONS

This application claims the benefit of U.S. Provisional Application No. 60/729,314, filed Oct. 20, 2005.

BACKGROUND OF THE INVENTION

In a capacitively coupled plasma reactor, control over dissociation has been achieved with a wide impedance match space at very high RF source power over a very wide chamber pressure range. Such a wide operating range is attributable, at least in part, to a unique feature of the overhead electrode matched to the RF power source by a fixed impedance matching stub with the following features. First, the electrode capacitance is matched to the plasma reactance at a plasma-electrode resonant frequency. The stub resonant frequency, the plasma-electrode resonant frequency and the source frequency are nearly matched at a VHF frequency. A highly uniform etch rate across the wafer is attained through a number of features. These features include, among other things, the adjustment of the bias power feedpoint impedance on the electrostatic chuck to provide a radially uniform RF impedance across the chuck for both its role as an RF bias power applicator and as an RF return for the VHF source power from the overhead electrode. This adjustment is made by dielectric sleeves around the bias feed line of uniquely selected dielectric constants and lengths. Another feature is a dielectric ring process kit for the cathode periphery to combat edge effects. Other features that can further improve process or etch rate distribution uniformity include dual zone gas feeding, curving of the overhead electrode and plasma steering magnetic fields. A plasma reactor that includes many of these key features provides an etch rate distribution uniformity that surpasses the conventional art.

With rapid shrinking of circuit feature sizes, the requirements for etch rate distribution uniformity are so stringent that small temperature variations across the wafer must now be minimized or eliminated, with the added proviso that future sophisticated process recipes designed to meet the latest stringent requirements will require agile and highly accurate time-changing wafer temperature profiling, and/or RF heat load profiling. Such changes must be effected or compensated with the greatest temperature uniformity across the wafer. How to do all this without degrading the now highly uniform etch rate distribution currently afforded by the reactor is a difficult problem. Moreover, such highly accurate and agile temperature control or profiling requires accurate temperature sensing at the wafer. However, introduction of temperature probes near the wafer will create parasitic RF fields which distort the fine effects of the feed-point impedance dielectric sleeves and the dielectric ring process kit, defeating their purpose. Temperature non-uniformities at the wafer arising from lack of control, to the extent that they impact the etch chemistry, will have the same ultimate effect of distorting an otherwise uniform environment.

Conventional cooling systems for regulating the temperature of the wafer support pedestal or electrostatic chuck employ a refrigeration system that cools a refrigerant or coolant medium using a conventional thermal cycle and transfers heat between the coolant and the electrostatic chuck through a separate liquid heat transfer medium. The coolant may be a mixture of deionized water with other substances such as glycol and (or) perfluoropolyethers. One problem with such systems is that, at high RF power levels (high RF bias power or high RF source power or both), such cooling systems allow the wafer temperature to drift (increase) for a significant period before stabilizing after the onset of RF power. Such temperature drift has two phases. In a brief initial phase, the electrostatic chuck is at an ambient (cold) temperature when RF power is first applied, so that the temperature of the first wafer to be introduced climbs rapidly toward equilibrium as the RF heat load slowly heats the chuck. This is undesirable because the wafer temperature rises uncontrollably during processing. Even after the electrostatic chuck (ESC) has been heated by the RF heat load, the wafer temperature drifts upwardly and slowly approaches an equilibrium temperature. Such drift represents a lack of control over wafer temperature, and degrades the process. The drift is caused by the inefficiency of the conventional cooling process.

Another problem is that rapid temperature variations between two temperature levels cannot be carried out for two reasons. First, the heat transfer fluid that provides thermal transfer between the ESC and the coolant has a heat propagation time that introduces a significant delay between the time a temperature change is initiated in the refrigeration loop and the time that the wafer actually experiences the temperature change. Secondly, there is a heat propagation time delay between the cooled portion of the ESC base and the wafer at the top of the ESC, this time delay being determined by the mass and heat capacity of the materials in the ESC.

One of the most difficult problems is that under high RF heat load on the wafer requiring high rates of thermal transfer through the cooled ESC, the thermal transfer fluid temperature changes significantly as it flows through the fluid passages within the ESC, so that temperature distribution across the ESC (and therefore across the wafer) becomes non-uniform. Such non-uniformities have not presented a significant problem under older design rules (larger semiconductor circuit feature sizes) because etch rate uniformity across the wafer diameter was not as critical at the earlier (larger) feature sizes/design rules. However, the current feature sizes have dictated the extremely uniform electric fields across the ESC achieved by the features described above (e.g., RF bias feedpoint impedance adjustment, process kit dielectric edge rings). However, the high RF heat loads, dictated by some of the latest plasma etch process recipes, cause temperature non-uniformities across the wafer diameter (due to sensible heating of the thermal transfer fluid within the ESC) that distort an otherwise uniform etch rate distribution across the wafer. It has seemed that this problem cannot be avoided without limiting the RF power applied to the wafer. However, as etch rate uniformity requirements become more stringent in the future, further reduction in RF power limits to satisfy such requirements will produce more anemic process results, which will ultimately be unacceptable. Therefore, there is a need for a way of extracting heat from the wafer under high RF heat load conditions without introducing temperature non-uniformities across the ESC or across the wafer.

SUMMARY OF THE INVENTION

A plasma reactor having a reactor chamber and an electrostatic chuck having a surface for holding a workpiece inside the chamber includes inner and outer zone backside gas pressure sources coupled to the electrostatic chuck for applying a thermally conductive gas under respective pressures to respective inner and outer zones of a workpiece-surface interface formed whenever a workpiece is held on the surface, and inner and outer evaporators inside respective inner and outer zones of the electrostatic chuck and a refrigeration loop having respective inner and outer expansion valves for controlling flow of coolant through the inner and outer evaporators respectively. The reactor further includes inner and outer zone temperature sensors in inner and outer zones of the electrostatic chuck and a thermal model capable of simulating heat transfer through the inner and outer zones, respectively, between the evaporator and the surface based upon measurements from the inner and outer temperature sensors, respectively. Inner and outer zone agile control processors coupled to the thermal model govern the inner and outer zone backside gas pressure sources, respectively, in response to predictions from the model of changes in the respective pressures that would bring the temperatures measured by the inner and outer zone sensors, respectively, closer to a desired temperature.

The reactor can further include inner and outer zone large range control processors coupled to the thermal model and governing the inner and outer zone expansion valves, respectively, in response to predictions from the model of changes thermal conditions in or near the inner and outer zone evaporators, respectively, that would bring the temperatures measured by the inner and outer zone sensors closer to a desired temperature.

BRIEF DESCRIPTION OF THE DRAWINGS

FIG. 5 illustrates a first dielectric ring process kit in the reactor of FIG. 1.

FIG. 6 illustrates a second dielectric ring process kit in the reactor of FIG. 1.

DETAILED DESCRIPTION OF THE INVENTION

Figure 1:
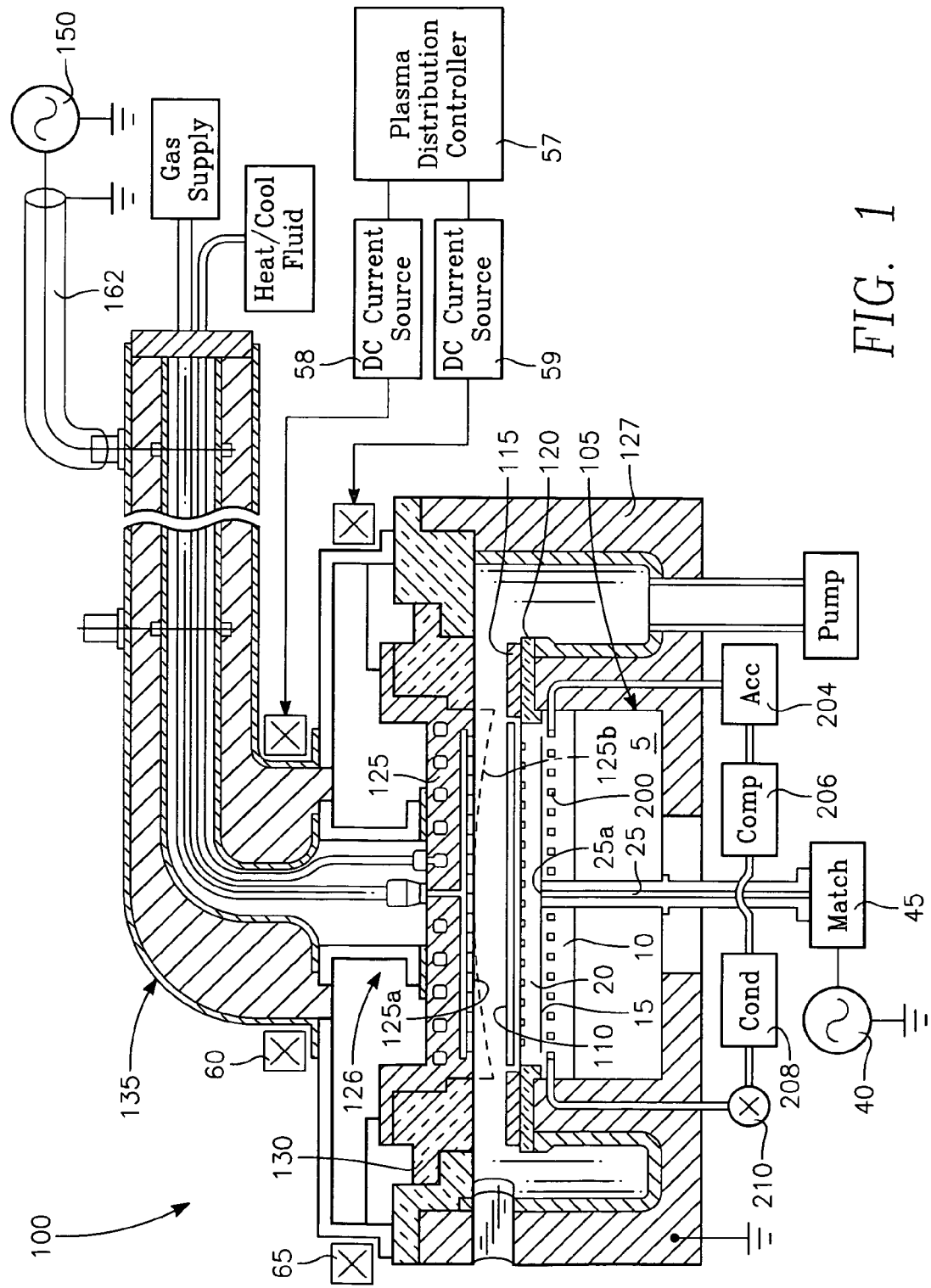
FIG. 1 illustrates a capacitively coupled plasma reactor embodying features of the invention.

Referring to FIG. 1, a plasma reactor includes a reactor chamber 100 with a wafer support 105 at the bottom of the chamber supporting a semiconductor wafer 110. A semiconductor ring 115 surrounds the wafer 110. The semiconductor ring 115 is supported on the grounded chamber body 127 by a dielectric (quartz) ring 120. The chamber 100 is bounded at the top by a disc shaped overhead electrode 125 supported at a predetermined gap length above the wafer 110 on grounded chamber body 127 by a dielectric (quartz) seal 130. An RF generator 150 applies RF plasma source power to the electrode 125. RF power from the generator 150 is coupled through a coaxial cable 162 matched to the generator 150 and into a coaxial stub 135 connected to the electrode 125. The stub 135 has a characteristic impedance, resonant frequency determined by its length, and provides an impedance match between the electrode 125 and the 50 Ohm coaxial cable 162 or the 50 Ohm output of the RF power generator 150. The chamber body is connected to the RF return (RF ground) of the RF generator 150. The RF path from the overhead electrode 125 to RF ground is affected by the capacitance of the semiconductor ring 115, the dielectric ring 120 and the dielectric seal 130. The wafer support 105, the wafer 110 and the semiconductor ring 115 provide the primary RF return path for RF power applied to the electrode 125.

A large impedance match space is realized when the source power frequency, the plasma electrode resonance frequency and the stub resonance frequency are nearly matched. Preferably, three frequencies are slightly offset from one another, with the source power frequency being 162 MHz (optimized for 300 mm wafers), the electrode-plasma resonant frequency being slightly below 162 MHz, and the stub resonance frequency being slightly above 162 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The electrode capacitance is matched to the magnitude of the negative capacitance of the plasma, and the resulting electrode-plasma resonant frequency and the source power frequency are at least nearly matched. For the typical metal and dielectric etch process conditions (i.e., plasma density between $10^9$-$10^{12}$ ions/cc, a 2-inch gap and an electrode diameter on the order of roughly 12 inches), the match is possible if the source power frequency is a VHF frequency.

An advantage of choosing the capacitance of the electrode 125 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. Matching the stub resonance frequency to the electrode plasma resonant frequency minimizes reflections at the stub-electrode interface. The entire processing system is rendered less sensitive to variations in operating conditions, e.g., shifts in plasma impedance, and therefore more reliable along with a greater range of process applicability.

In accordance with a further aspect, the system Q is reduced to broaden the process window by slightly offsetting the stub resonant frequency, the electrode plasma resonant frequency and the plasma source power frequency from one another. The use of the higher VHF source power frequency proportionately decreases the Q as well. Decreasing system Q broadens the impedance match space of the system, so that its performance is not as susceptible to changes in plasma conditions or deviations from manufacturing tolerances.

Bias Circuit Tuning for Uniform Radial Plasma Distribution:

Continuing to refer to FIG. 1, the workpiece support cathode 105 includes a metal base layer 05 supporting a lower insulation layer 10, an electrically conductive mesh layer 15 overlying the lower insulation layer 10 and a thin top insulation layer 20 covering the conductive mesh layer 15. The semiconductor workpiece or wafer 110 is placed on top of the top insulation layer 20. RF bias power is coupled to the conductive mesh layer 15 to control ion bombardment energy at the surface of the wafer 110. The conductive mesh 15 also can be used for electrostatically chucking and de-chucking the wafer 110, and in such a case can be connected to a chucking voltage source in the well-known fashion. The conductive mesh 15 therefore is not necessarily grounded and can have, alternately, a floating electric potential or a fixed D.C. potential in accordance with conventional chucking and de-chucking operations. The metal base layer 05 typically (but not necessarily) is connected to ground, and forms part of a return path for VHF power radiated by the overhead electrode 125.

An RF bias generator 40 produces power in the HF band (e.g., 13.56 MHz). Its RF bias impedance match element 45 is coupled to the conductive mesh 15 by an elongate conductor 25 (hereinafter referred to as an RF conductor) extending through the workpiece support cathode 105. The RF conductor 25 is insulated from grounded conductors such as the aluminum base layer 05. The RF conductor 25 has a top termination or bias power feed point 25a in electrical contact with the conductive mesh 15.

Figure 2:
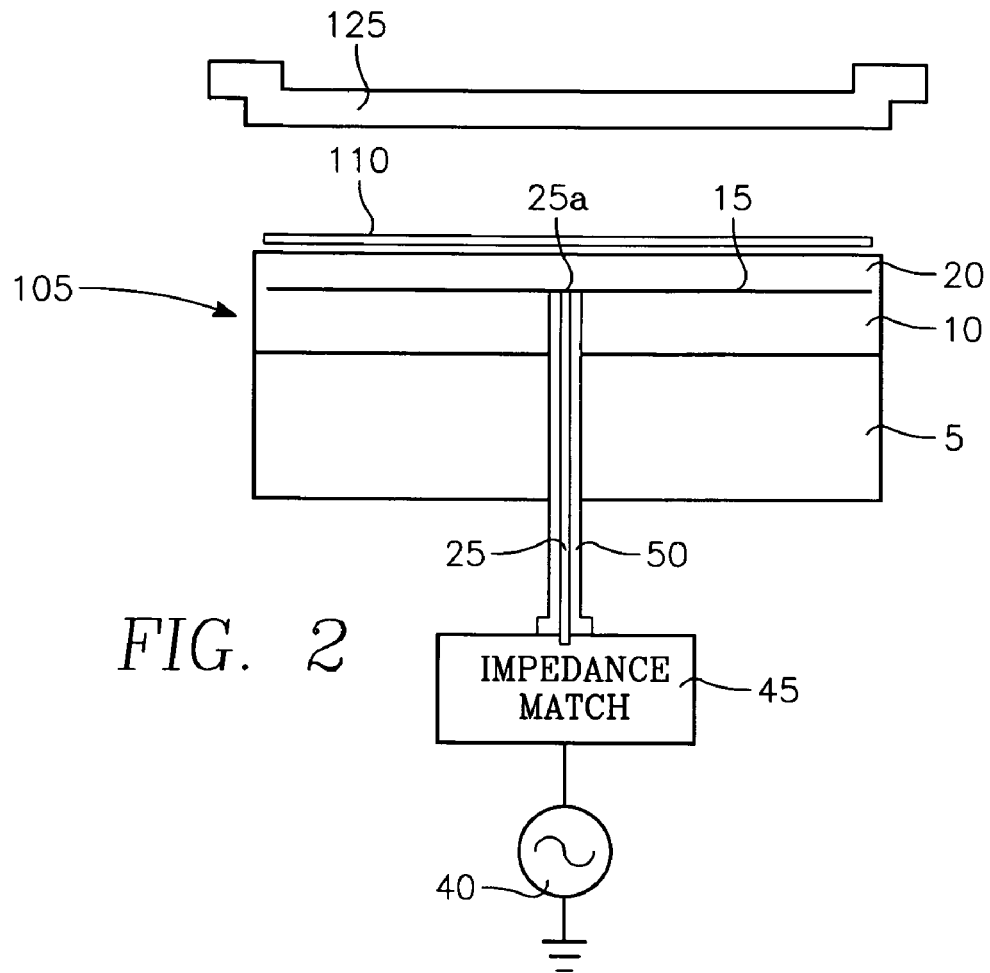
FIG. 2 is a schematic diagram of the RF bias power feed circuit of the reactor of FIG. 1.
Figure 3:
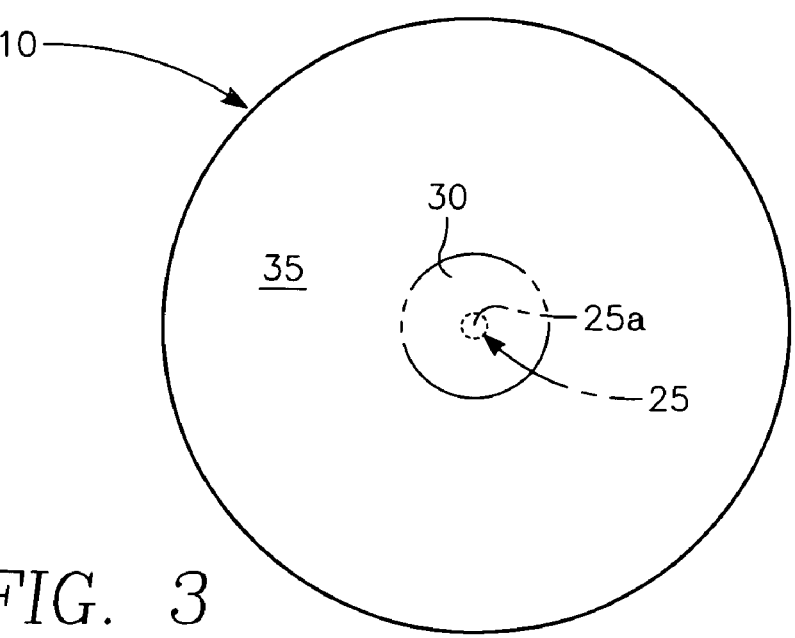
FIG. 3 is a top view corresponding to FIG. 2.

FIG. 2 is a schematic illustration corresponding to FIG. 1 of the circuit consisting of the VHF overhead electrode 125, the RF bias applied through the workpiece support cathode 105 and the elements of the cathode 105. FIG. 3 is a top plan view corresponding to FIG. 1 of the plane of the wafer 110, with the termination or feed point 25a of the RF conductor 25 being shown in hidden (dashed) line. The RF return path provided by the workpiece support cathode 105 consists of two portions in the plane of the wafer 110, namely a radially inner portion 30 centered about and extending outwardly from the feed point 25a and a radially outer annular portion 35. The RF return paths provided by the two portions 30, 35 are different, and therefore the two portions 30, 35 present different impedances to the VHF power radiated by the overhead electrode 125. Such differences may cause non-uniformities in radial distribution across the wafer surface of impedance to the VHF power, giving rise to nonuniform radial distribution of plasma ion density near the surface of the workpiece.

In order to solve this problem, a dielectric cylindrical sleeve 50 (shown in the enlarged view of FIG. 2) surrounds the RF conductor 25. The axial length and the dielectric constant of the material constituting the sleeve 50 determine the feed point impedance presented by the RF conductor 25 to the VHF power. In one example, the length and dielectric constant of the sleeve 50 is selected to bring the feed point impedance to nearly zero at the VHF source power frequency (e.g., 162 MHz). The impedance presented by the outer region 35 surrounding the feed point 25a is nearly a short at 162 MHz (due mainly to the presence of the conductive mesh 15). Therefore, in the latter example the sleeve 50 may bring the feed point impedance at the source power frequency to a value closer to that of the surrounding region. Here, the impedance of the region surrounding the feed point is determined mainly by the conductive mesh 15. As a result, a more uniform radial distribution of impedance is attained, for more uniform capacitive coupling of VHF source power.

The sleeve 50 can include additional features facilitating the foregoing improvement in VHF power deposition while simultaneously solving a separate problem, namely improving the uniformity in the electric field created by the RF bias power (at 13.56 MHz for example) applied to the wafer 110 by the RF conductor 25. The problem is how to adjust radial distribution of VHF power coupling for maximum uniformity of plasma ion density while simultaneously adjusting the HF bias power electric field distribution across the wafer surface for maximum uniformity.

Figure 4:
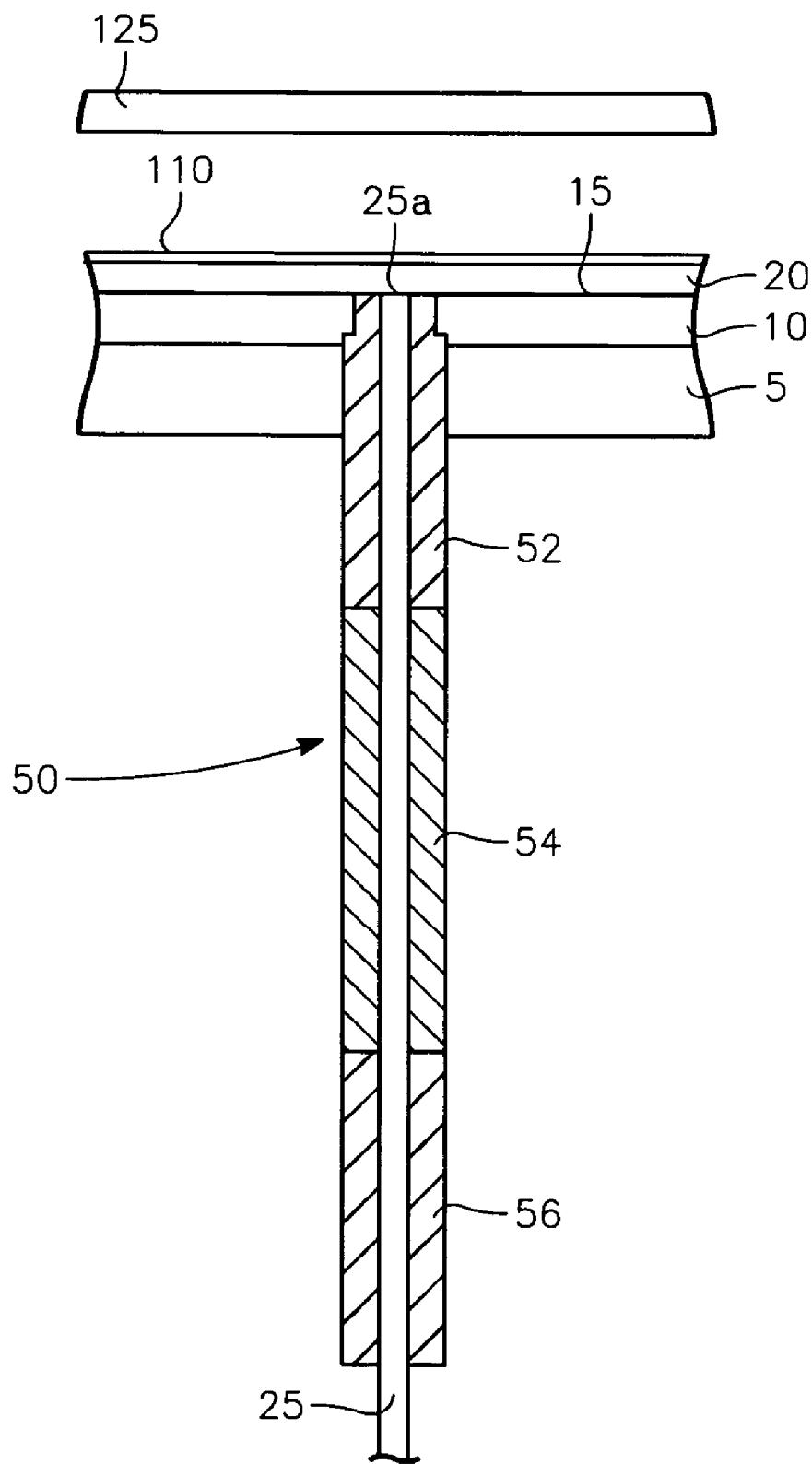
FIG. 4 is a detailed diagram of a coaxial feed portion of the circuit of FIG. 2.

FIG. 4 is an enlarged view corresponding to FIGS. 1-3 showing how the sleeve 50 can be divided into three sections, namely a top section 52, a middle section 54 and a bottom section 56. The length and dielectric constant of the sleeve top section 52 is selected and fixed to optimize the HF bias power deposition exclusively, and the lengths and dielectric constants of the remaining sleeve sections 54, 56 are then selected to optimize VHF source power deposition by the overhead electrode while leaving the HF bias power deposition optimized.

RF Coupling Ring for Enhancing Plasma Uniformity:

Center-high plasma distribution non-uniformity is reduced by selectively enhancing capacitive coupling from the overhead electrode 125 to the plasma in the vicinity of the workpiece periphery. FIG. 5 corresponds to an enlarged view of FIG. 1 illustrating the additional feature of an annular RF coupling ring that is placed over and in electrical contact with the outer periphery of the wafer support cathode 105. As shown in FIG. 5, the top insulation layer 20 is surrounded by a removable ring 80 whose top surface 80a is coplanar with the top surface of the wafer 110. The removable ring 80 can be formed of a process-compatible material such as silicon, for example. Optionally, removable metal ground ring 85 surrounds the removable ring 80, its top surface 85a being coplanar with that of the removable ring 80. A generally planar surface is provided across the top of the wafer support cathode 105 bounded by the periphery of the ground ring 85, facing the generally planar surface of the bottom of the overhead electrode 125. As a result, capacitive coupling across the entire processing zone bounded by the overhead electrode 125 and the wafer support cathode 105 is generally uniform. In order to overcome non-uniformity inherent in the center-high plasma ion density distribution of the reactor, capacitive coupling by the overhead electrode 125 is enhanced near the outer portion of the workpiece 110 by placing an RF coupling ring 90 over the removable ring 80 and over grounded ring 85. The RF coupling ring 90 may be a conductor, a semiconductor or a dielectric. If the coupling ring 90 is a dielectric, then capacitive coupling to the plasma near the wafer periphery is enhanced by the presence of the dielectric material. If the RF coupling ring 90 is a conductor, it in effect narrows the electrode-to-counterelectrode spacing and thereby enhances capacitance near the peripheral region of the wafer 110. Thus, the electrode-to-counterelectrode spacing is h1 everywhere in the process zone except at the periphery occupied by the RF coupling ring 90 where the spacing is reduced from h1 by the height h2 of the coupling ring 90. The increased capacitive coupling of source power enhances ion density at the periphery. The increase in ion density extends inwardly from the RF coupling ring 90 and extends over a peripheral portion of the workpiece 110. Thus, the plasma ion density over the workpiece 110 is less center high and may tend toward being more nearly uniform, or possibly slightly edge-high. This condition is optimized by a careful selection of the height (thickness) h2 of the RF coupling ring 90.

FIG. 6 illustrates a modification of the reactor of FIG. 5 in which a second RF coupling ceiling ring 95 is attached to the periphery of the bottom surface of the overhead electrode 125 and overlies the first RF coupling ring 90. If each ring 90, 95 has a thickness (height) of h3, then the electrode-to-counterelectrode distance near the wafer periphery is reduced by twice h3 and the capacitance in that region is enhanced proportionately, as in the reactor of FIG. 5.

With the RF coupling ring 90 and the dielectric sleeve 50, plasma ion density distribution uniformity is improved. Any remaining non-uniformities can be corrected by plasma-steering magnetic fields controlled by a plasma distribution controller 57 (shown in FIG. 1) governing D.C. current sources 58, 59 that drive overhead coils 60, 65.

Another modification that can be employed to enhance plasma processing uniformity across the diameter of the wafer 110 is to change the planar electrode surface 125a to a convex curved electrode surface 125b. The degree of curvature can be selected to compensate for non-uniform plasma ion density radial distribution that may exist with the planar electrode surface 125a.

Figure 7:
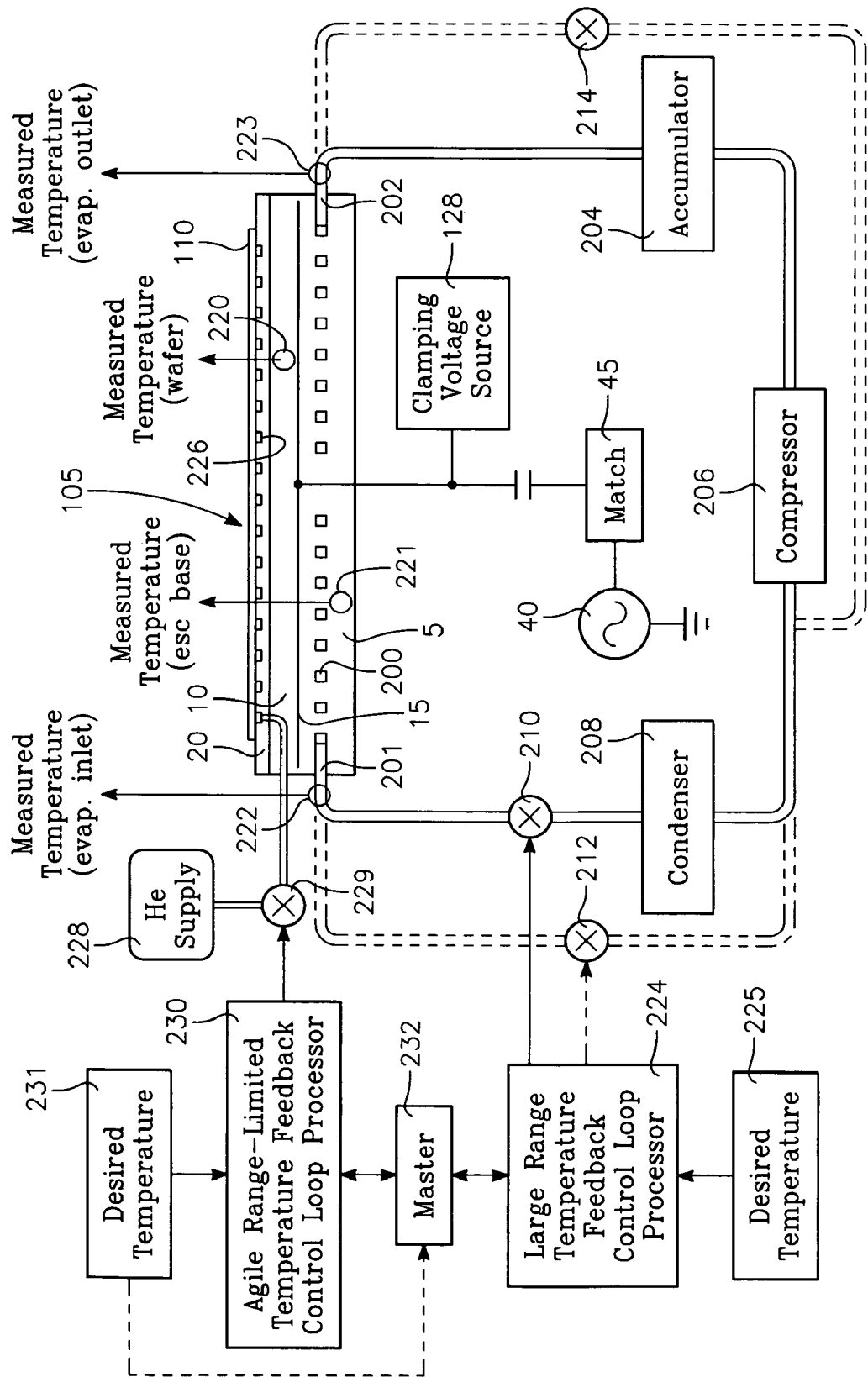
FIG. 7 illustrates a system including the reactor of FIG. 1 embodying the invention.

Highly Efficient Temperature Control Apparatus:

FIG. 7 is an enlarged view of the wafer support pedestal 105 of FIG. 1, revealing the internal structure of the pedestal 105. The pedestal 105 embodies an electrostatic chuck (ESC), as described in FIG. 2, FIG. 7 showing that the aluminum base 5 contains flow passages 200 for a PCHT medium with an inlet 201 and an outlet 202. The internal flow passages 200 constitute the heat exchanger of a PCHT loop, the heat exchanger 200 being internally contained with the ESC base 5. The PCHT loop can operate in either of two modes, namely a cooling mode (in which the heat exchanger 200 functions as an evaporator) and a heating mode (in which the heat exchanger 200 functions as a condenser). The remaining elements of the PCHT loop are external of the ESC 105, and include (in order of PCHT medium flow direction, starting from the outlet 202) an accumulator 204, a compressor 206 (for pumping the PCHT medium through the loop), and (for the cooling mode of operation) a condenser 208 and an expansion valve 210 having a variable orifice size, all of which are of the type well-known in the art. An advantage of locating the heat exchanger 200 inside the ESC base 05 is that the delay and losses inherent in the thermal transfer fluid of the prior art are eliminated. The PCHT loop (i.e., the heat exchanger 200, the accumulator 204, the compressor 206, the condenser 208, the expansion valve 210 and the conduits coupling them together, contain the PCHT medium (which functions as a refrigerant or coolant when the PCHT operates in the cooling mode) of a conventional type and can have low electrical conductivity to avoid interfering with the RF characteristics of the reactor. The accumulator 204 prevents any liquid form of the PCHT medium from reaching the compressor 206 by storing the liquid. This liquid is converted to vapor by appropriately operating the bypass valve 214.

In order to overcome the problem of thermal drift during processing, the efficiency of the PCHT loop is increased ten-fold or more by operating the PCHT loop 200, 204, 206, 208, 210 so that the PCHT medium inside the heat exchanger is divided between a liquid phase and a vapor phase. The liquid-to-vapor ratio at the inlet 201 is sufficiently high to allow for a decrease in this ratio at the outlet 202. This guarantees that all (or nearly all) heat transfer between the ESC base 05 and the PCHT medium (coolant) within the heat exchanger (evaporator) 200 occurs through contribution to the latent heat of evaporation of the PCHT medium. As a result, the heat flow in the PCHT loop exceeds, by a factor of 10, the heat flow in a single-phase cooling cycle. This condition can be satisfied with a decrease in the CPHT medium's liquid-to-vapor ratio from the inlet 201 to the outlet 202 that is sufficiently limited so that at least a very small amount of liquid remains at (or just before) the outlet 202. In the cooling mode, this requires that the coolant capacity of the PCHT loop is not exceeded by the RF heat load on the wafer. One way of ensuring this is to provide the PCHT loop with a maximum cooling capacity that is about twice the maximum anticipated heat load on the wafer. In one implementation of a reactor of the type depicted in FIGS. 1-7, the maximum cooling rate of the PCHT loop was between about three and four times the maximum anticipated heat load on the wafer. The heat load on the wafer was about 30% of the applied RF power on the wafer. The liquid-to-vapor ratio was between about 40% and 60% at the inlet 201 and about 10% at the outlet 202.

While the PCHT loop has been described with reference primarily to the cooling mode of operation, it can also be employed in a heating mode whenever it is desired to raise the temperature of the ESC (e.g., at a faster rate than plasma heating alone is capable of). For operation of the PCHT loop in the heating mode, the condenser 206 and expansion valve 210 are bypassed by at least some of the PCHT medium by opening the bypass valve 212, so as to allow superheated PCHT medium to flow to the heat exchanger 200. In this case, the heat exchanger 200 functions as a condenser rather than an evaporator. In this mode (the heating mode), overheating of the compressor 206 may be prevented by providing an additional bypass (not shown) from the output of the condenser 206 to the input of the compressor 208. In the heating mode, the liquid-to-vapor ratio in the heat exchanger 200 may be zero.

Figure 8:
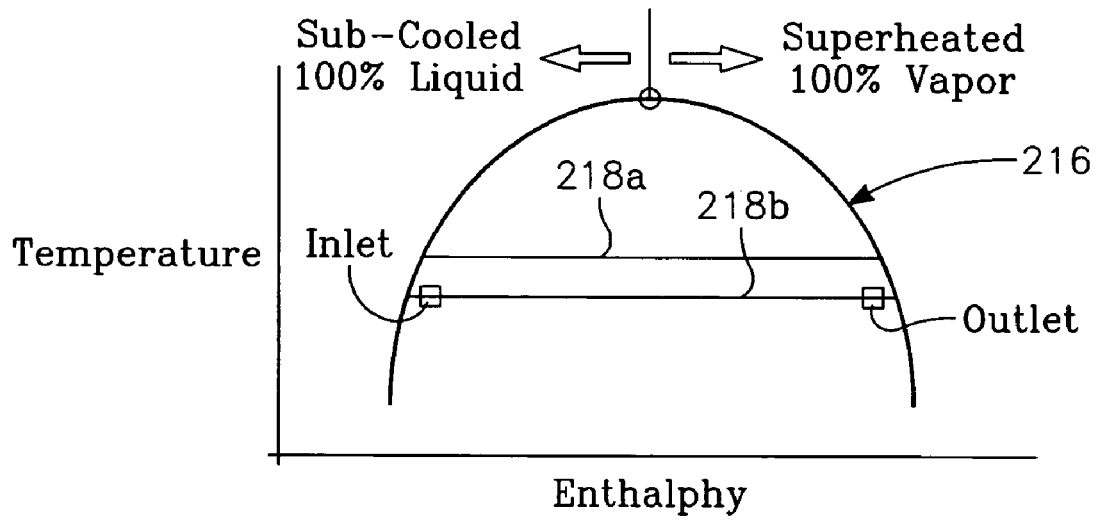
FIG. 8 is a graph of the temperature as a function of enthalpy of the coolant inside the evaporator of FIG. 7, and further depicting the dome-shaped liquid-vapor phase boundary.

FIG. 8 is a phase diagram depicting the enthalpy of the PCHT medium inside the heat exchanger 200 as a function of temperature. The temperature-enthalpy boundary between the three phases (liquid, solid, vapor) is a liquid-vapor dome 216 beneath which the PCHT medium exists in both liquid and vapor phases. To the lower enthalpy side of the dome 216, the PCHT medium is a sub-cooled (100%) liquid phase while to the higher enthalpy side of the dome 216 the PCHT medium is a superheated (100%) vapor. At the apex of the dome is the triple point at which all three phases of the PCHT medium are present simultaneously. The controllable parameters of the PCHT loop of FIG. 7, (i.e., the PCHT medium flow rate established by the compressor 206, the orifice size of the expansion valve 210 and the opening size of a bypass valve 212 that will be discussed later herein) are selected by the skilled worker so that the temperature and enthalpy of the PCHT medium inside the heat exchanger 200 stays under or within the liquid-vapor dome 216 of the phase diagram of FIG. 8. The pressure inside the heat exchanger 200 is maintained at a constant level provided that a constant ESC base temperature is desired, so that there is theoretically no temperature change as the coolant flows through the heat exchanger 200, as indicated by the perfectly horizontal lines of constant pressure 218a, 218b of FIG. 8. (In actual practice, there is a negligible temperature difference across the ESC inlet and outlet 201, 202 of about 5 degrees C. or less under typical operating conditions.) As the PCHT medium inside the evaporator 200 absorbs heat from the ESC base 5, its internal energy U increases, causing its enthalpy to increase (where enthalpy is U+PV, P and V being pressure and volume inside the evaporator 200). To satisfy the requirement for two-phase heat transfer through latent heat of evaporation exclusively (or nearly exclusively) as defined above, the PCHT medium's enthalpy/temperature coordinates must remain inside the liquid-vapor dome 216 of FIG. 8. Thus, for a constant pressure, the PCHT medium's temperature/enthalpy coordinates follow a line of constant pressure (e.g., line 218a) entering the heat exchanger 200 at a low enthalpy (labeled "inlet" in FIG. 8) and exiting at a higher enthalpy (labeled "outlet" in FIG. 8), with the entry and exit enthalpies lying inside or on the boundary of the liquid-vapor dome 216. FIG. 8 shows that a greater increase in enthalpy (absorbed heat) is achieved at lower coolant temperatures.

Solution to the Problem of Non-Uniform Temperatures Across the ESC and Wafer:

Maintaining the PCHT medium (hereinafter referred to as "coolant") inside the evaporator 200 of FIG. 7 within the liquid-vapor dome of FIG. 8 —to guarantee heat extraction through the latent heat of vaporization almost exclusively— solves the problem of non-uniform temperature across the wafer under high RF heat loads. This is because heat transfer via the latent heat of vaporization is a constant-temperature process. In the cooling mode of the PCHT loop, as it absorbs heat, the coolant inside the evaporator 200 does not change temperature. Instead, it changes phase, going from liquid to vapor. Thus, all the coolant throughout the evaporator 200 (the fluid passages inside the ESC base 5) is at a uniform temperature regardless of the magnitude of the RF heat load on the wafer. The advantage is that the wafer temperature distribution is about as uniform as the electric field distribution across the ESC, so that the etch rate uniformity achieved under the most favorable conditions by the electrical features discussed earlier herein (e.g., the RF bias feedpoint impedance adjustment by multiple dielectric sleeves and the dielectric edge ring process kit) is maintained even under the highest RF heat loads, a result heretofore unattainable. This result renders the reactor of FIGS. 1-7 useful for plasma processing under the current design rules (small feature sizes) and for several generations of future design rules in which feature sizes may shrink even further, a significant advantage. This advantage is combined with the extremely high heat capacity of cooling through latent heat of vaporization (discussed above), which provides about an order of magnitude greater heat flow rate than conventional (sensible) heat transfer via the coolant mass heat capacity.

Figure 9:
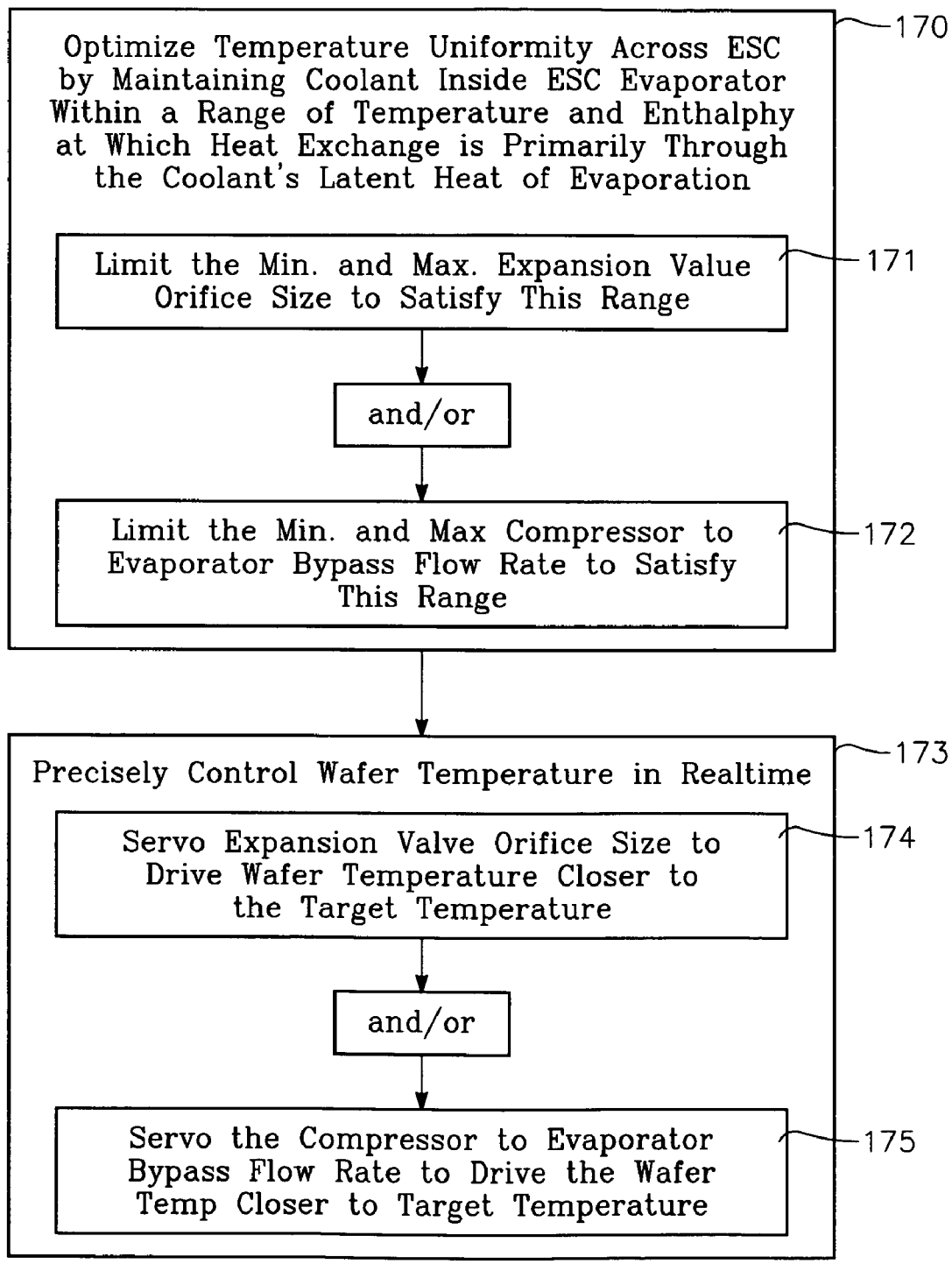
FIG. 9 is a block flow diagram of a two-phase constant temperature cooling process of the invention.

Operation of the reactor of FIG. 7 in the foregoing manner that results in heat transfer through the coolant's latent heat of vaporization corresponds to the method illustrated in FIG. 9. The first step in this method is to enhance or optimize uniformity of radial distribution of the ESC temperature by maintaining the coolant that is inside the evaporator 200 within a range of temperatures and enthalpies at which the heat transfer is through contributions to (or deductions from) the coolant's latent heat of vaporization. This step is depicted in block 300 of FIG. 9. The step of block 300 may be carried out by limiting variation in the orifice or opening size of the expansion valve 210 to a range which confines the temperature and enthalpy of the coolant in the evaporator 200 to lie inside the liquid-vapor dome 216 of the temperature-enthalpy diagram of FIG. 8 (block 302 of FIG. 9). For a given coolant and for a given coolant flow rate, the adjustment range of the expansion valve that confines the coolant inside the liquid-vapor dome 216 of FIG. 8 is readily determined and can be pre-programmed into a microprocessor controlling the entire system, for example. The step of block 300 may also be carried out by adjusting the compressor-to-evaporator bypass flow valve 212 within a range in which the coolant inside the evaporator 200 is maintained inside the liquid-vapor dome 216 of FIG. 8 (block 304 of FIG. 9). The adjustment of the bypass valve 212 (in the step of block 304) and the adjustment of the expansion valve 210 (in the step of block 302) may be combined to achieve the desired result.

Once heat transfer through the latent heat of vaporization in the evaporator 200 has been established by the step of block 300, the next step is to control the ESC temperature (block 306 of FIG. 9). This may be accomplished by adjusting the expansion valve 210 within the range established in the step of block 300 until a desired ESC temperature is reached (block 308 of FIG. 9). Alternatively, the ESC temperature may be controlled by adjusting the compressor-to-evaporator bypass valve 212 within the range established in the step of block 304. This latter step corresponds to block 310 of FIG. 9. Temperature control may also be carried out by performing the steps of blocks 308 and 310 together.

Working Example:

While the variable orifice size of the expansion valve 210 is the primary control over cooling rate and wafer temperature, additional or alternative temperature control and, if desired, heating of the wafer, is provided by a compressor-to-evaporator bypass valve 212. Complete conversion of all liquid coolant to the gas phase in the accumulator 204 can be ensured using a compressor-to-accumulator bypass valve 214.

While selection is readily made of a suitable coolant, a flow rate by the compressor 206 and an orifice size of the expansion valve that satisfies the foregoing conditions, the following is provided as a working example in which two-phase cooling is achieved:

ESC Inlet temperature: −10 to +50 deg C.
ESC Inlet pressure: 160 to 200 PSIG
ESC Inlet liquid-vapor ratio: 40%-60% liquid
ESC Inlet-Outlet max temperature difference: 5 deg C.
ESC Inlet-Outlet max pressure difference: 10 PSI
ESC Outlet Liquid-vapor ratio: 10% liquid
Accumulator outlet temperature: 60 to 80 deg C.
Accumulator outlet pressure: 25 to 35 PSIG
Accumulator outlet liquid-vapor ratio: 100% vapor
Compressor flow rate: 4 gal per min
Compressor outlet pressure: 260-270 PSIG
Compressor outlet temperature: 80-100 deg C.
Compressor outlet liquid-vapor ratio: 100% vapor
Condenser outlet temperature: 20-40 deg C.
Condenser outlet pressure: 250 PSIG
Condenser liquid-vapor ratio: 100% vapor
Expansion valve outlet liquid-vapor ratio: 80%

Some evaporation occurs between the expansion valve outlet and the ESC coolant inlet 201, which explains the decrease in liquid-vapor ratio from 80% to 60% from the expansion valve 210 to the ESC inlet 201. While it may be preferable to constrain the thermal cycle within the liquid-vapor dome 216 of FIG. 8 (as discussed above), the invention may be implemented with some excursion beyond that limit. In particular, the coolant's liquid-vapor ratio may at least nearly reach zero at the evaporator outlet 202, or may reach zero just before the evaporator outlet 202, in which case a small amount of sensible heating may occur. In such a case, the vast majority of heat transfer still occurs through the latent heat of vaporization, only a small fraction occurring through sensible heating, so that the advantages of the invention are realized nonetheless.

Large Range Temperature Feedback Control Loop:

Referring again to FIGS. 1 and 7, the wafer temperature may be controlled or held at a desired temperature under a given RF heat load on the wafer 110 using a temperature feedback control loop governing either (or both) the expansion valve 210 and the bypass valve 212, although the simplest implementation controls the expansion valve 210 only. The actual temperature is sensed at a temperature probe, which may be a temperature probe 220 in the ESC insulating layer 10, a temperature probe 221 in the ESC base 05, a temperature probe 222 at the ESC evaporator inlet 201 or a temperature probe 223 at the ESC evaporator outlet 202 or a combination of any or all of these probes. For this purpose, a feedback control loop processor 224 governs the orifice opening size of the expansion valve 210 in response to input or inputs from one or more of the temperature probes. The processor 224 is furnished with a user-selected desired temperature value, which may be stored in a memory or user interface 225. As a simplified explanation, during each successive processing cycle, the processor 224 compares the current temperature measured by at least one of the probes (e.g., by the probe 220 in the ESC insulating layer) against the desired temperature value. The processor 224 then computes an error value as the difference between the desired and measured temperature values, and determines from the error a correction to the orifice size of either the bypass valve 212 or the expansion valve 210, that is likely to reduce the error. The processor 224 then causes the valve orifice size to change in accordance with the correction. This cycle is repeated during the entire duration of a wafer process to control the wafer temperature.

Agile Wafer Temperature Feedback Control Loop:

In conventional reactors, the wafer is cooled to avoid overheating from absorbed RF power by cooling the electrostatic chuck or wafer support pedestal. Thermal conductivity between the wafer 110 and the cooled ESC 105 is enhanced by injection under pressure of a thermally conductive gas (such as helium) into the interface between the backside of the wafer 110 and the top surface of the ESC 105, a technique well-known in the art. For this purpose, gas channels 226 are formed in the top surface of the ESC insulating layer 20 and a pressurized helium supply 228 is coupled to the internal ESC gas channels 226 through a backside gas pressure valve 229. The wafer 110 is electrostatically clamped down onto the top surface of the insulating layer 20 by a D.C. clamping voltage applied by a clamp voltage source 128 to the grid electrode 15. The thermal conductivity between the wafer 110 and the ESC top layer 20 is determined by the clamping voltage and by the thermally conductive gas (helium) pressure on the wafer backside. Highly agile (quick) wafer temperature control is carried out in accordance with the present invention by varying the backside gas pressure (by controlling the valve 229) so as to adjust the wafer temperature to the desired level. As the backside gas pressure is changed, the thermal conductivity between the wafer and the ESC top layer 20 is changed, which changes the balance between (a) the heat absorbed by the wafer 110 from RF power applied to the grid electrode 15 or coupled to the plasma and (b) the heat drawn from the wafer to the cooled ESC. Changing this balance necessarily changes the wafer temperature. A feedback control loop governing the backside gas pressure can therefore be employed for agile or highly responsive control of the wafer temperature. The response of the wafer temperature to changes in the backside gas pressure is extremely quick (temperature changes reaching equilibrium within a second or less). By way of comparison, changing the temperature of the base of the ESC or wafer support pedestal 105 does not cause the wafer to reach a new (elevated or depressed) equilibrium or steady state wafer temperature for on the order of minute (depending upon the thermal mass of the ESC 105). Therefore, a temperature regulation system employing the backside gas pressure provides agile temperature control capable of making fast adjustments to wafer temperature.

FIG. 7 illustrates such an agile temperature feedback control system, in which a feedback control loop processor 230 governs the backside gas pressure valve 229. One (or more) of the temperature sensors 220, 221, 222 or 223 in the ESC may be connected to an input of the processor 230. A user interface or memory 231 may provide a user-selected or desired temperature to the processor 230. During each successive processing cycle, the processor 230 computes an error signal as the difference between the current temperature measurement (from one of the sensors 220, 221, 222) and the desired temperature. The processor 230 determines from that difference a correction to the current setting of the backside gas pressure valve that would tend to reduce the temperature error, and changes the valve opening in accordance with that correction. For example, a wafer temperature that is deviating above the desired temperature would require increasing the backside gas pressure to increase thermal conductivity to the cooled ESC and bring down the wafer temperature. The converse is true in the case of a wafer temperature deviating below the desired temperature. The wafer temperature can thus be controlled and set to new temperatures virtually instantly within a temperature range whose lower limit corresponds to the chilled temperature of the ESC and whose upper limit is determined by the RF heat load on the wafer. For example, the wafer temperature cannot be increased in the absence of an RF heat load and the wafer temperature cannot be cooled below the temperature of the ESC. If this temperature range is sufficient, then any conventional technique may be used to maintain the ESC at a desired chilled temperature to facilitate the agile temperature feedback control loop governing the backside gas pressure.

Dual Temperature Feedback Control Loops:

The agile temperature feedback control loop governing the backside gas pressure valve 229 and the large range temperature feedback control loop governing the refrigeration expansion valve 210 may be operated simultaneously in a cooperative combination under the control of a master processor 232 controlling both feedback control loop processors 224, 230.

The large range temperature feedback control loop (involving the PCHT loop consisting of the evaporator 200, the compressor 206, the condenser 208 and the expansion valve 210) controls the workpiece temperature by changing the temperature of the electrostatic chuck 105. The temperature range is limited only by the thermal capacity of the PCHT loop and can therefore set the workpiece temperature to any temperature within a very large range (e.g., −10 deg C. to +150 deg C.). However, the rate at which it can effect a desired change in workpiece temperature at a particular moment is limited by the thermal mass of the electrostatic chuck 105. This rate is so slow that, for example, with an electrostatic chuck for supporting a 300 mm workpiece or silicon wafer, a 10 degree C. change in workpiece temperature can require on the order of a minute or more from the time the refrigeration unit begins to change the thermal conditions of the coolant to meet the new temperature until the workpiece temperature finally reaches the new temperature.

In contrast, in making a desired change or correction in workpiece temperature, the agile temperature feedback control loop does not change the electrostatic chuck temperature (at least not directly) but merely changes the thermal conductivity between the workpiece and the electrostatic chuck. The rate at which the workpiece temperature responds to such a change is extremely high because it is limited only by the rate at which the backside gas pressure can be changed and the thermal mass of the workpiece. The backside gas pressure responds to movement of the valve 229 in a small fraction of a second in a typical system. For a typical 300 mm silicon wafer, the thermal mass is so low that the wafer (workpiece) temperature responds to changes in the backside gas pressure within a matter of a few seconds or a fraction of a second. Therefore, relative to the time scale over which the large range temperature control loop effects changes in workpiece temperature, the workpiece temperature response of agile feedback loop is comparatively instantaneous. However, the range over which the agile feedback loop can change the workpiece temperature is quite limited: the highest workpiece temperature that can be attained is limited by the RF heat load on the wafer, while the lowest temperature cannot be below the current temperature of the electrostatic chuck 105. However, in combining the agile and large range temperature control loops together, the advantages of each one compensate for the limitations of the other, because their combination provides a large workpiece temperature range and a very fast response.

Figure 10:
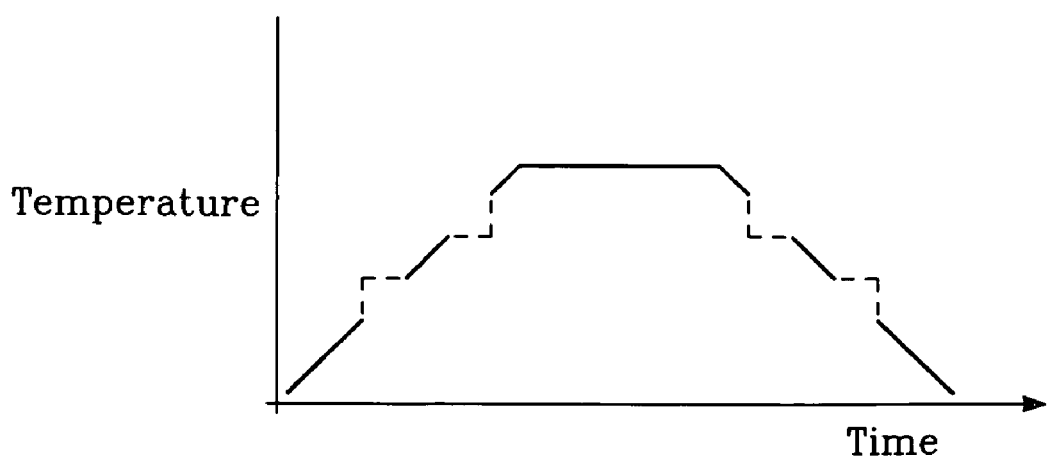
FIG. 10 depicts an exemplary wafer temperature-time profile that may be realized using the invention.

The master processor 232 may be programmed to effect large temperature changes using the large range feedback control loop (the processor 224) and effect quick but smaller temperature changes using the agile feedback control loop (the processor 230). FIG. 10 is a graph of one example of wafer temperature behavior over time. The solid line depicts the long term temperature behavior, in which the master processor 232 effects slow large changes in wafer temperature using the large range feedback control loop with the processor 224. The dashed line depicts fast perturbations in temperature, in which the master processor 232 effects fast but small changes in wafer temperature using the agile feedback control loop with the processor 230.

Figure 11A:
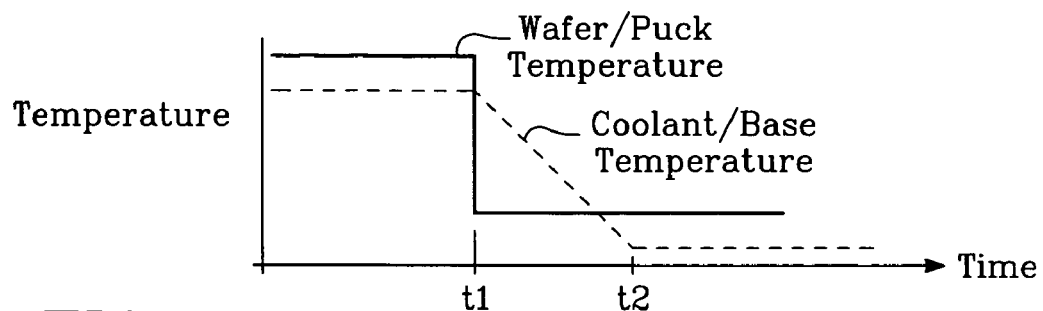
FIGS. 11A and 11B are contemporary timing diagrams of the wafer temperature and wafer backside gas pressure, respectively, in accordance with a process for stepping the wafer temperature down in advance of a corresponding ESC temperature change.
Figure 11B:
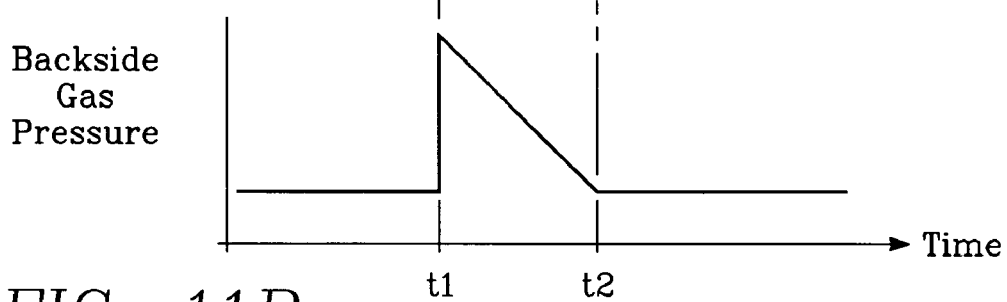

The dual loop control afforded by the master processor 232 can be employed to (nearly) instantly move the wafer temperature to a new desired level and hold it there while the ESC temperature slowly changes to the new desired temperature. This is illustrated in FIGS. 11A and 11B. The solid line in FIG. 11A depicts the wafer temperature behavior over time in which the wafer temperature is stepped down to a lower temperature at time t1 and held there, at which time the PCHT loop (dashed line) begins to cool down the ESC to the lower temperature, which is not reached by the ESC until time t2. The fast change in wafer temperature at time t1 and its temperature stability thereafter is accomplished by the agile control loop 230. The agile control loop processor 230 receives the new (lower) desired wafer temperature at time t1 and responds by immediately increasing the backside gas pressure (FIG. 11B) to step the wafer temperature down to the new temperature at time t1. In the meantime, the ESC temperature begins to fall in order to drive the ESC to (or slightly below) the new temperature at time t1, so that processor 224 increases the refrigeration cooling rate of the ESC to drive its temperature down. This forces the agile control loop processor 230 to decrease backside gas pressure after time t1 to maintain the desired wafer temperature, until the ESC reaches the correct temperature at time t2, after which the backside gas pressure remains constant.

Figure 12A:
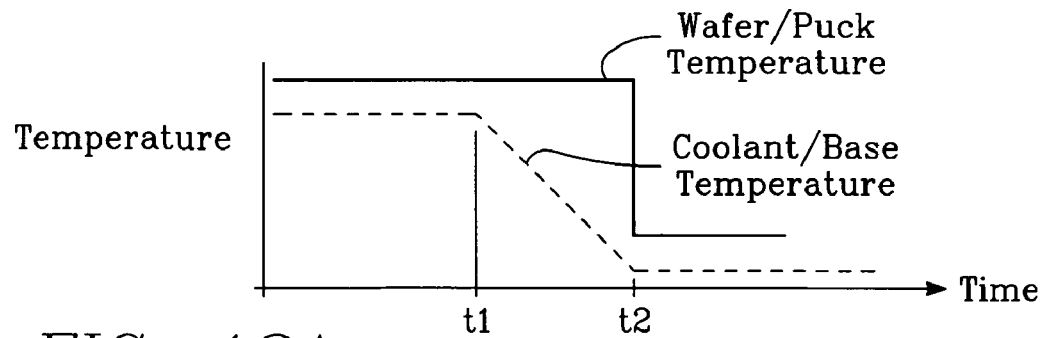
FIGS. 12A and 12B are contemporary timing diagrams of the wafer temperature and wafer backside gas pressure, respectively, in accordance with a process for stepping the wafer temperature down after completion of a corresponding ESC temperature change.
Figure 12B:
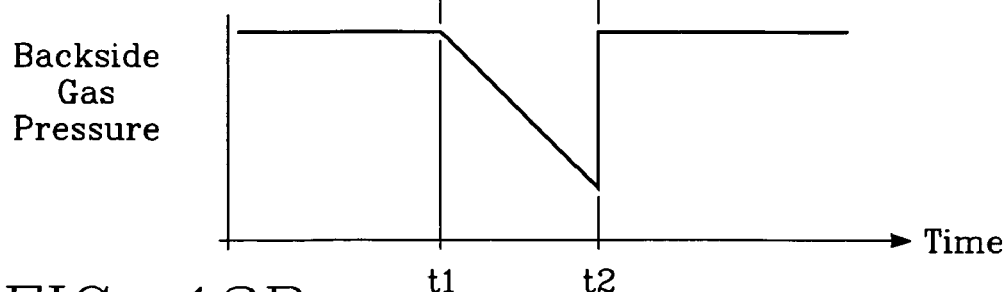

The example of FIGS. 12A and 12B illustrates how the ESC temperature change may be delayed while the PCHT loop is allowed to slowly adjust to a new temperature (to accommodate a time lag to the ESC surface of about 50 degrees over 5 seconds). FIG. 12A depicts temperature behavior over time while FIG. 12B depicts the corresponding backside gas pressure profile over time. As illustrated in FIGS. 12A and 12B, the dual loop control afforded by the master processor 232 can be employed to temporarily hold the wafer temperature constant (solid line of FIG. 12A) at an initial temperature level while, beginning at time t1, the PCHT loop takes the ESC through a large but slow temperature excursion (dashed line of FIG. 12A). Then, the wafer temperature is allowed to step down to the new ESC temperature. This is accomplished by cooling the ESC while constantly decreasing the backside gas pressure beginning at time t1. Then, after the desired ESC temperature is reached at time t2, the agile temperature control loop steps up the backside gas pressure to step the wafer temperature down to the ESC temperature.

Figure 13:
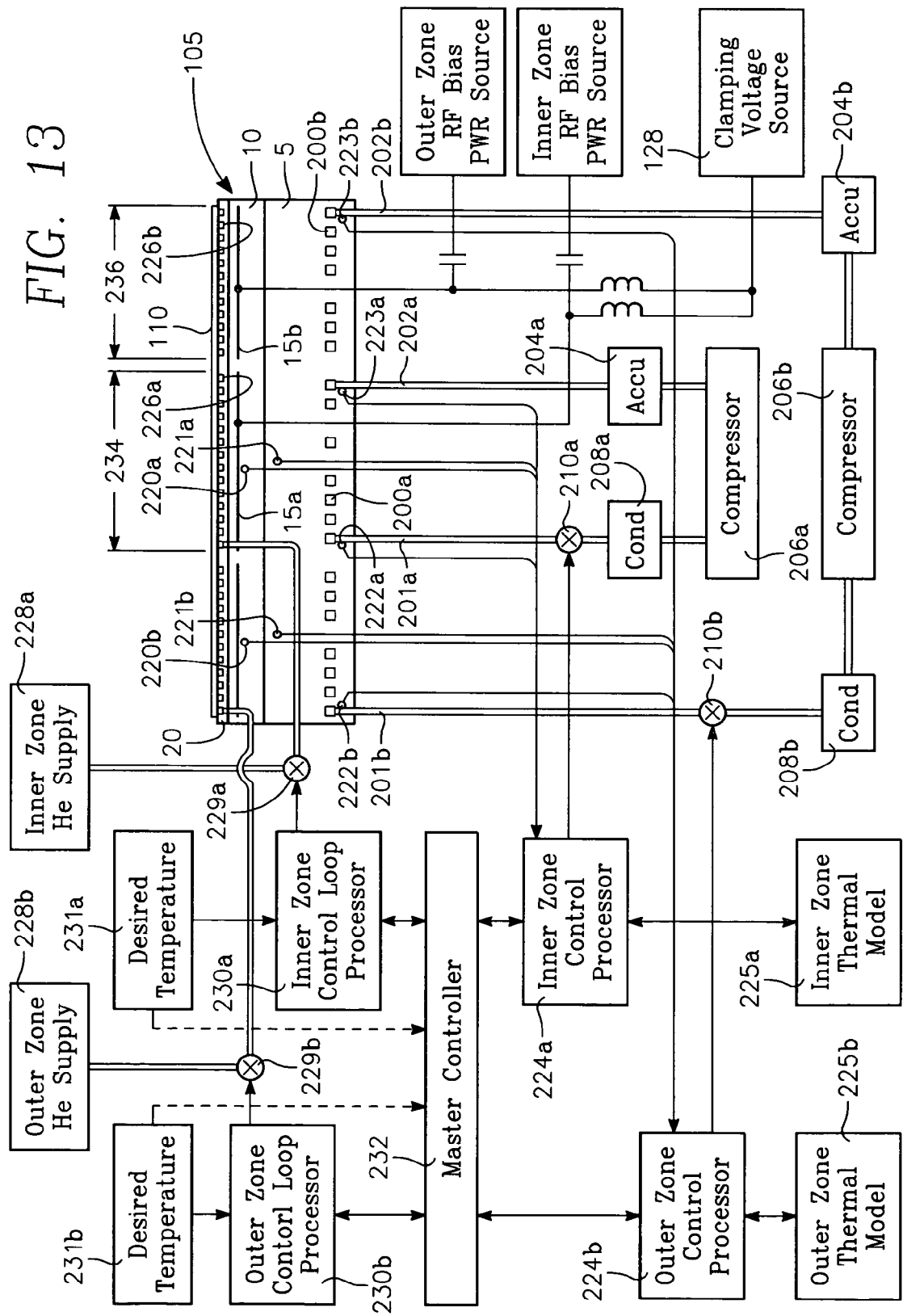
FIG. 13 illustrates a system similar to that of FIG. 7 but having multiple temperature control loops governing respectively multiple temperature zones.

Multiple Temperature Zones:

1. Large Range Temperature Control Loop:

The ESC 105 may be divided into plural radial zones, and different independent feedback control loops may separately control the temperature in each zone. An advantage of this feature is that different radial zones of the wafer 110 may be kept at different temperatures during processing so as to further reduce process or etch rate distribution non-uniformities. In the example of FIG. 13, the ESC 105 is divided into two temperature control zones, namely a radially inner zone 234 and a radially outer zone 236, and a separate temperature control apparatus is provided for each zone 234, 236. In some embodiments having such plural radial zones, it may be preferable to divide the ESC conductive mesh or electrode 15 into plural radial zones (such as concentric inner and outer zones 15a, 15b, for example).

The radially inner zone 234 of the aluminum base 05 contains inner zone coolant flow passages 200a with a coolant inlet 201a and a coolant outlet 202a. The inner zone coolant flow passages 200a constitute the inner zone evaporator of an inner zone PCHT loop, the evaporator 200a being internally contained with the inner zone 234 of the ESC base 05. The remaining elements of the inner zone PCHT loop are external of the ESC 105, and include (in order of coolant flow direction, starting from the coolant outlet 202a) an accumulator 204a, a compressor 206a, a condenser 208a and an expansion valve 210a having a variable orifice size, all of which are of the type well-known in the art. The radially outer zone 236 of the aluminum base 05 contains outer zone coolant flow passages 200b with a coolant inlet 201b and a coolant outlet 202b. The outer zone coolant flow passages 200b constitute the outer zone evaporator of an outer zone PCHT loop, the evaporator 200b being internally contained with the outer zone 236 of the ESC base 05. The remaining elements of the outer zone PCHT loop are external of the ESC 105, and include (in order of coolant flow direction, starting from the coolant outlet 202b) an accumulator 204b, a compressor 206b, a condenser 208b and an expansion valve 210b having a variable orifice size, all of which are of the type well-known in the art. Temperature in the inner zone 234 is sensed at one or more of the following inner zone temperature probes: probe 220a in the inner zone 234 of the ESC insulating layer 10, probe 221a in the inner zone of the ESC base 05, probe 222a at the inner zone evaporator inlet 201a or probe 223a at the inner zone evaporator outlet 202a.

An inner zone feedback control loop processor 224a governs the orifice opening size of the inner zone expansion valve 210a in response to input or inputs from one or more of the inner zone temperature probes. The inner zone processor 224a is furnished with a user-selected desired inner zone temperature value, which may be stored in a memory or user interface 225a. During each successive processing cycle, the inner zone processor 224a compares the current temperature measured by at least one of the probes (e.g., the probe 220a in the ESC insulating layer) against the desired temperature value and corrects the orifice size of the inner zone expansion valve 210a accordingly. An outer zone feedback control loop processor 224b governs the orifice opening size of the outer zone expansion valve 210b in response to input or inputs from one or more of the outer zone temperature probes. The outer zone processor 224b is furnished with a user-selected desired outer zone temperature value, which may be stored in a memory or user interface 225b. During each successive processing cycle, the outer zone processor 224b compares the current temperature measured by at least one of the probes (e.g., the outer zone probe 220b in the ESC insulating layer) against the desired temperature value and corrects the orifice size of the outer zone expansion valve 210b accordingly.

2. Agile Temperature Feedback Control Loop:

In both temperature zones 234 and 236, thermal conductivity between the wafer 110 and the cooled ESC 105 is enhanced by injection under pressure of a thermally conductive gas (such as helium) into the interface between the backside of the wafer 110 and the top surface of the ESC 105, a technique well-known in the art. In the inner temperature zone 234, inner zone gas channels 226a are formed in inner zone 234 of the top surface of the ESC insulating layer 20 and a pressurized helium supply 228a is coupled to the inner zone gas channels 226a through an inner zone backside gas pressure valve 229a. The wafer 110 is electrostatically clamped down onto the top surface of the insulating layer 20 by a D.C. clamping voltage applied by a clamp voltage source 128 to the grid electrode 15 (i.e., 15a and 15b). The thermal conductivity between the wafer 110 and the ESC top layer 20 is determined by the clamping voltage and by the thermally conductive gas (helium) pressure on the wafer backside. Highly agile (quick) wafer temperature control is carried out in the inner temperature zone 234 by controlling the inner zone valve 229a so as to adjust the wafer temperature to the desired level. An inner zone agile feedback control loop processor 230a governs the inner zone backside gas pressure valve 229a. One (or more) of the inner zone temperature sensors 220a, 221a, 222a or 223a in the ESC inner zone 234 may be connected to an input of the inner zone agile processor 230a. An inner zone user interface or memory 231a may provide a user-selected or desired temperature to the inner zone agile processor 230a. During each successive processing cycle, the processor 230a senses an error as the difference between the current temperature measurement (from one of the inner zone sensors 220a, 221a, 222a) and the desired temperature, and changes the opening of the inner zone backside gas valve 229a accordingly.

In the outer temperature zone 236, outer zone gas channels 226b are formed in outer zone 236 of the top surface of the ESC insulating layer 20 and the pressurized helium supply 228b is coupled to the outer zone gas channels 226b through an outer zone backside gas pressure valve 229b. Highly agile (quick) wafer temperature control is carried out in the outer temperature zone 236 by controlling the outer zone valve 229b so as to adjust the wafer temperature to the desired level. An outer zone agile feedback control loop processor 230b governs the outer zone backside gas pressure valve 229b. One (or more) of the outer zone temperature sensors 220b, 221b, 222b or 223b in the ESC outer zone 236 may be connected to an input of the outer zone agile processor 230b. An outer zone user interface or memory 231b may provide a user-selected or desired temperature to the inner zone agile processor 230b. During each successive processing cycle, the processor 230b senses an error as the difference between the current temperature measurement (from one of the outer zone sensors 220b, 221b, 222b) and the desired temperature, and changes the opening of the outer zone backside gas valve 229b accordingly.

With the combination of the agile and large range inner and outer feedback control loops described above with reference to FIG. 13, the radial profile of the wafer temperature may be controlled over a large range with agile response.

Figure 14:
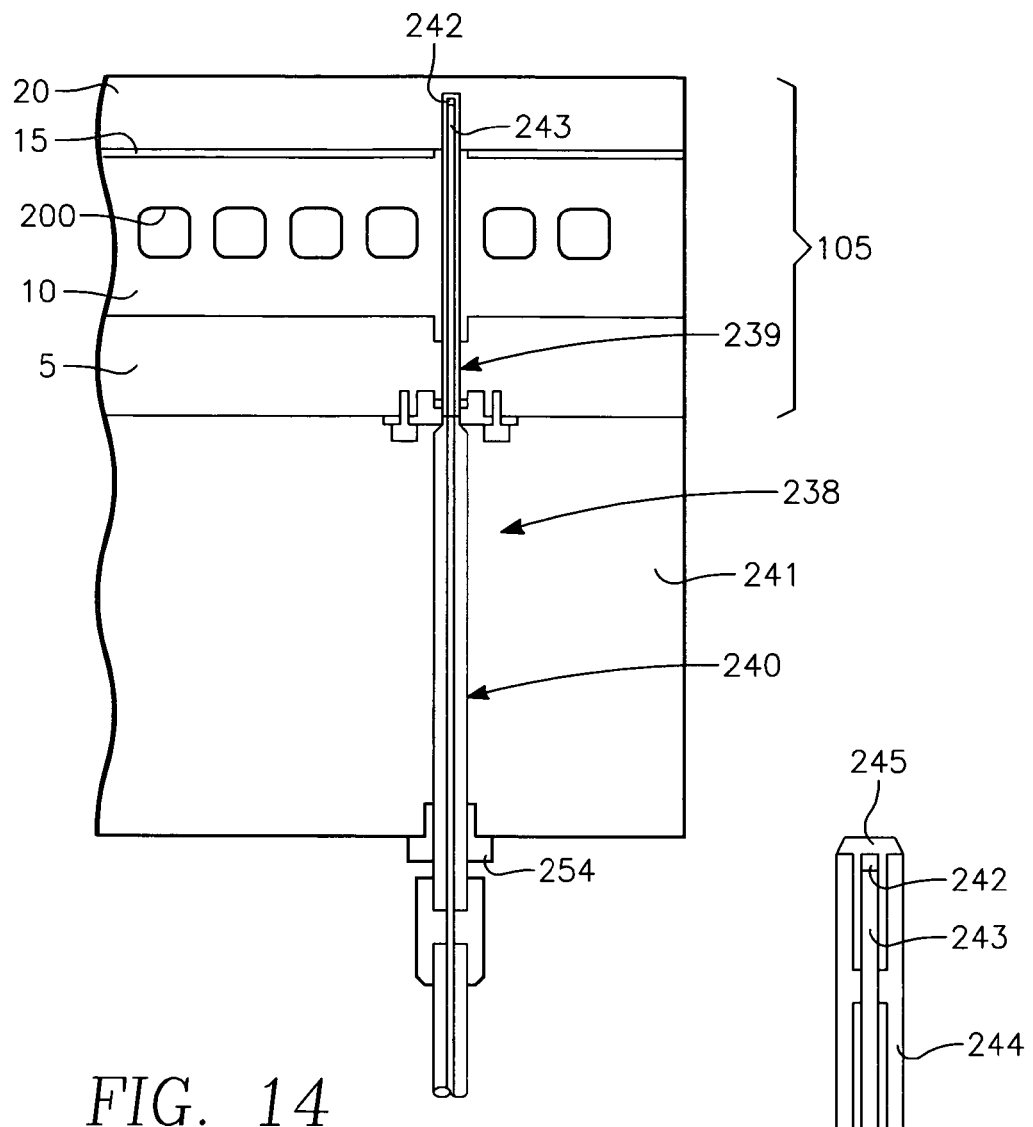
FIG. 14 illustrates an optical temperature sensor of the invention as installed in the ESC of FIG. 7 or FIG. 13.
Figure 15:
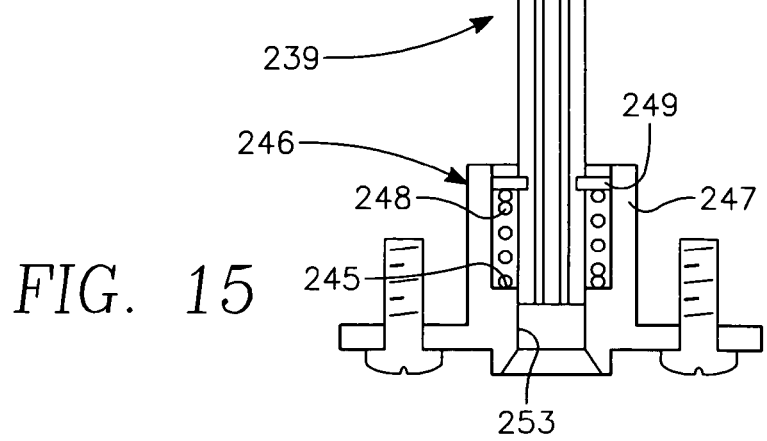
FIG. 15 illustrates an upper probe of the temperature sensor of FIG. 14.

Temperature Probe with Minimal or No RF Parasitics:

FIG. 14 depicts a preferred temperature probe 238 installed in the plasma reactor of FIG. 1. The probe 238 consists of two separable portions, namely an upper probe 239 installed in the ESC 105 and a lower probe 240 installed in a portion of the reactor chamber beneath and supporting the ESC 105, namely a chamber host base 241. The upper probe 239 is depicted in the enlarged view of FIG. 15, and lies in an area of high RF electric potential (i.e., inside the ESC insulating layer or puck 10, 20). The upper probe 239 is firmly inserted in an elongate axial hole within the ESC 105 that closely fits the upper probe 239, and the tip of the upper probe 239 lies very close (e.g., within 3 to 3.5 mm) to the top surface of the puck 20. (The advantage is that the probe 239 is sufficiently close to the wafer 110 to minimize or eliminate temperature measurement errors.) This area of the ESC has very high electric field potential during processing so that any electrical properties that the upper probe 239 may have would have profound effects on plasma processing on the wafer. The upper probe 239 therefore includes RF compatibility features which minimize or eliminate any effect that the probe 239 might otherwise have on the electric field or on the RF impedance distribution. Such RF compatibility features ensure that the probe 239 does not distort or perturb the ESC electric field or RF impedance distribution that has been so carefully adjusted with the features of the feedpoint impedance adjustment of FIGS. 2-4 and/or the dielectric ring process kit of FIGS. 5-6 (for example). The RF compatibility features of the upper probe 239 include a complete absence of any conductive materials within the probe 239, an orientation of the probe in the axial direction (to minimize its effect on the radial electric field or RF impedance distribution) and its small diameter, which is on the order of a fraction of a Debeye length of the plasma in the chamber. These features are made possible by employing an electrically nonconductive optical temperature transducer 242 (e.g., a phosphor material) whose blackbody radiation spectrum is a well-known function of its temperature. The optical temperature transducer 242 is coupled to a long thin optical fiber 243 contained within the thin axial upper probe 239. The upper probe 239 further includes an opaque cylindrical dielectric sleeve 244 surrounding the optical fiber 243 and preferably consisting of glass-impregnated plastic. The optical temperature transducer 242 is capped by a dielectric cap 245 of a material that is, preferably, identical to the dielectric material of the ESC puck 10, 20, which in the preferred embodiment is aluminum nitride. This latter feature ensures that the temperature behavior of the material contacting the optical temperature transducer 242 (i.e., the cap 245) is identical to the material whose temperature is to be measured (i.e., the ESC puck layer 20 that is in direct contact with the wafer 110).

The upper probe 239 further includes a mounting plate 246 that is removably fastened to the bottom surface of the ESC base 05. The mounting plate 246 supports a spring housing 247 containing a coil spring 248 compressed between a shoulder 245 of the housing 247 and an annular ring 249 fastened to a portion of the probe sleeve 244 lying within the housing 247. As the upper probe 239 is inserted into the ESC 105 and presses against the top end of the hole within the ESC, the coil spring 248 is compressed to force the tip of the probe 239 to self-align to the top end of the hole.

Figures 16, 17:
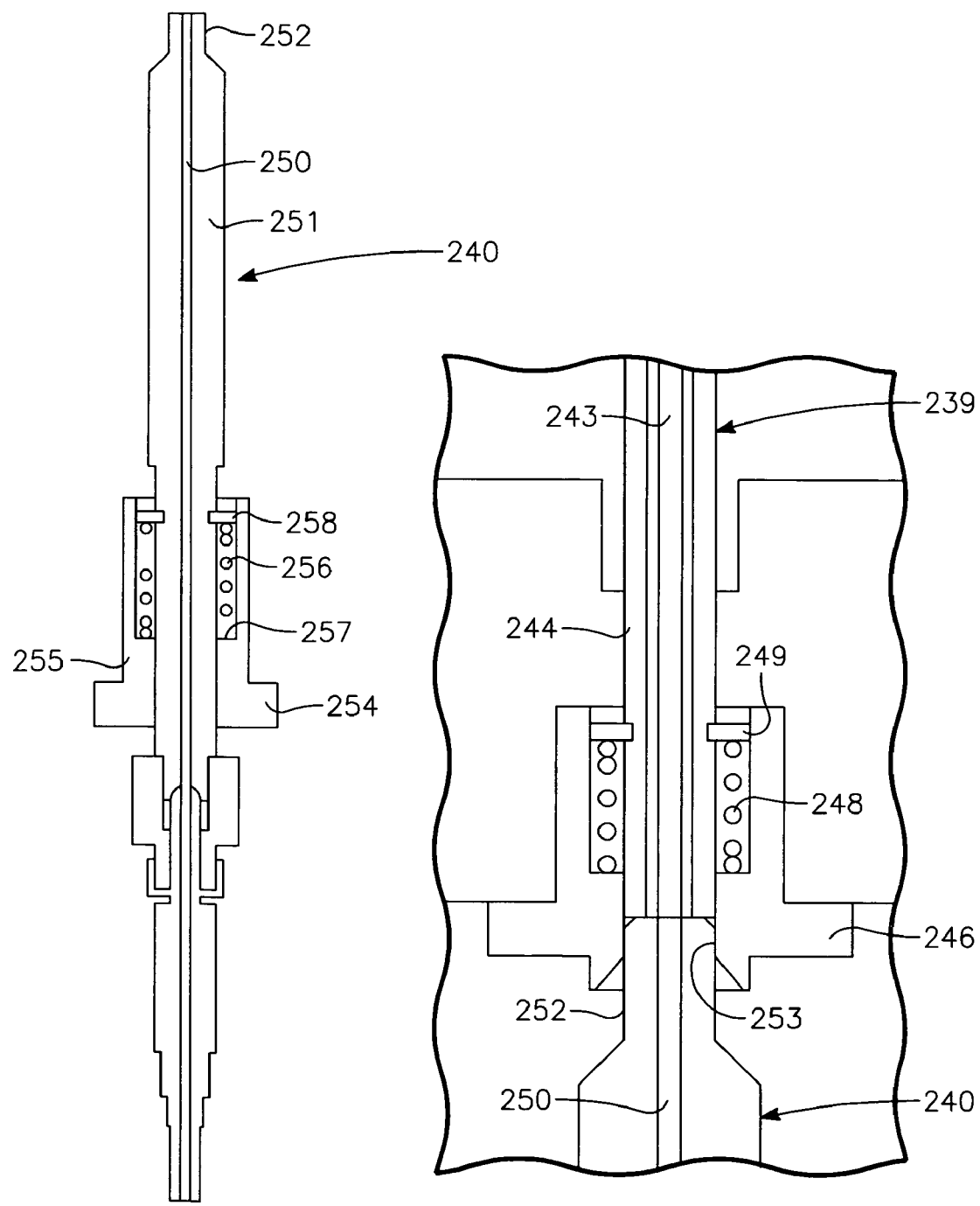
FIG. 16 illustrates a lower probe of the temperature sensor of FIG. 14.
FIG. 17 is an enlarged view of a portion of FIG. 14 showing how the upper and lower probes are joined together within the ESC.

The lower probe 240 is shown in the enlarged view of FIG. 16 and includes an optical fiber 250 surrounded by an opaque lower cylindrical sleeve 251. Since the lower probe 240 is below the grounded conductive ESC base 05, it is located outside of areas of high RF electric fields, and therefore need not be formed of non-conductive materials. In fact, the lower cylindrical sleeve 251 may be formed of steel, for example. The top end 252 of the lower probe 240 is tightly received within a hole 253 in the mounting plate 246 of the upper probe 239. The lower probe 240 further includes a mounting plate 254 that is removably fastened to the bottom surface of the chamber housing host base 241. The mounting plate 254 supports a spring housing 255 containing a coil spring 256 compressed between a shoulder 257 of the housing 255 and an annular ring 258 fastened to a portion of the lower probe sleeve 251 lying within the housing 255. As the tip 252 of the lower probe 240 is inserted into the hole 253 of the upper probe mounting plate 246 and pressed against the top end of the hole 253, the coil spring 256 is compressed to force the tip of the lower probe 240 to self-align to the top end of the hole 253. The resulting self-alignment of the lower probe 240 against the upper probe 239 is illustrated in FIG. 17, which shows that the facing ends of the upper probe optical fiber 243 and the lower probe optical fiber 250 are in nearly perfect alignment. Signal conditioning circuitry converts the light received from the optical fiber at the bottom end of the lower probe fiber 250 and converts it to a digital signal for use by one of the feedback control loop processors. While FIG. 14 depicts a single temperature probe whose tip lies near the top of the ESC 105, another identical probe may be placed in a lower portion of the ESC but at the same radial location as first probe. Other identical probes may be placed at different radial (azimuthal) locations within the ESC but in the same height (axial location) as other probes. Thus, the temperature probes 220a, 220b of the different temperature zones 234, 236 of FIG. 13 may each be of the type described above in FIGS. 13-16 and are located at different radial locations at a common axial height.

While certain embodiments of the invention have been described as including different feedback control loop processors, any or all such processors may be implemented in a single common processor programmed to perform the functions of each of the individual feedback control loop processors. Similarly, other resources associated with the different control loops, such as the dual helium supplies 228a, 228b, may be implemented with a single supply or resource with separately controlled interfaces (e.g., such as a single helium supply and dual pressure control valves 229a, 229b). Moreover, if (for example) the conductive mesh electrode 15 is divided into inner and outer electrodes 15a, 15b as suggested earlier in this specification, then a common RF bias power source may be employed to apply different levels of RF bias power to the inner and outer mesh electrodes 15a, 15b. Alternatively, separate RF bias power generators may be employed to realize the separate RF bias power levels.

Figure 18:
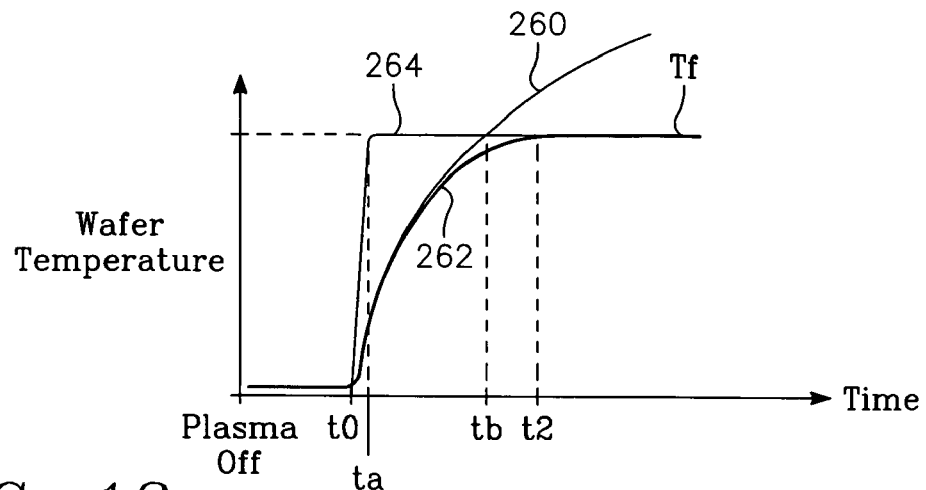
FIG. 18 is a graph of wafer temperature behavior over time beginning at plasma ignition for three different processes.

Workpiece Temperature Ramping Using Backside Gas Pressure:

As discussed above in this specification, the large range temperature control loop controls workpiece temperature by regulating the temperature of the electrostatic chuck 105. It therefore has a slow response attributable to the thermal mass of the electrostatic chuck. Another problem with a conventional electrostatic chuck cooling system is that its efficiency is too limited to avoid upward temperature drift after the wafer temperature has reached the desired level. This leads to workpiece temperature drift during initial processing, which is most pronounced when processing the "first" wafer after the reactor has been idle. This problem is illustrated by the curve labeled 260 in the graph of FIG. 18 depicting a typical wafer temperature response over time when plasma power is turned on at time t0. Initially the wafer temperature and the ESC temperature are below the desired temperature, and the thermal mass of the cooled electrostatic chuck 105 slows down the reaction of the wafer temperature to the RF heat load on the wafer. This delays the wafer temperature from reaching the desired temperature from time t0 until time tb. This delay is typically on the order of tens of seconds or a minute or more. After that, the conventional electrostatic chuck cooling apparatus has such limited heat transfer efficiency that it cannot compensate for the accumulation of heat from the RF heat load on the wafer, so that the wafer temperature continues to increase or drift above the desired temperature after time tb. Such uncontrolled changes in temperature degrade control of the plasma process.

The problem of the temperature drift after time tb (corresponding to the curve 260 of FIG. 18) is solved by the superior efficiency of the two-phase refrigeration loop of FIG. 7. As discussed above in this specification, the two phase refrigeration loop achieves improved response by locating its evaporator 200 inside the electrostatic chuck 105. Its efficiency is further improved by an order of magnitude by carrying out heat transfer in the evaporator 200 primarily through latent heat of vaporization. This improved efficiency enables the refrigeration loop to stop the wafer temperature from increasing after the desired temperature has been reached. This improved wafer temperature behavior is depicted by the curve of 262 of FIG. 18, in which the wafer temperature levels off after reaching the desired temperature at time t2, and has little or no drift thereafter. This solution nevertheless leaves a significant delay (from time t0 to time t2) in the wafer temperature reaching the desired level.

The problem of the delay in bringing the wafer temperature to the desired temperature (i.e., from time t0 to time t2) is solved by employing the agile feedback control loop processor 230. When RF power is first turned on and the wafer temperature is below the desired temperature (at time t0), the valve 229 is served so as to reduce (or turn off) the backside gas pressure in order to decrease wafer-to-chuck conductance and thus reduce the cooling effect and thermal mass of the electrostatic chuck 105 on the wafer 110. This allows the wafer 110 to be quickly heated by the RF heat load with little or no opposition from the cooled chuck 105, producing a steep rise in temperature beginning at time t0, as indicated by the curve labeled 264 of FIG. 18. As the curve labeled 264 of FIG. 18 shows, the wafer temperature reaches the desired temperature at time ta, the time delay from time t0 to time ta being extremely short, e.g., on the order of only several seconds or a fraction of a second.

Figure 19:
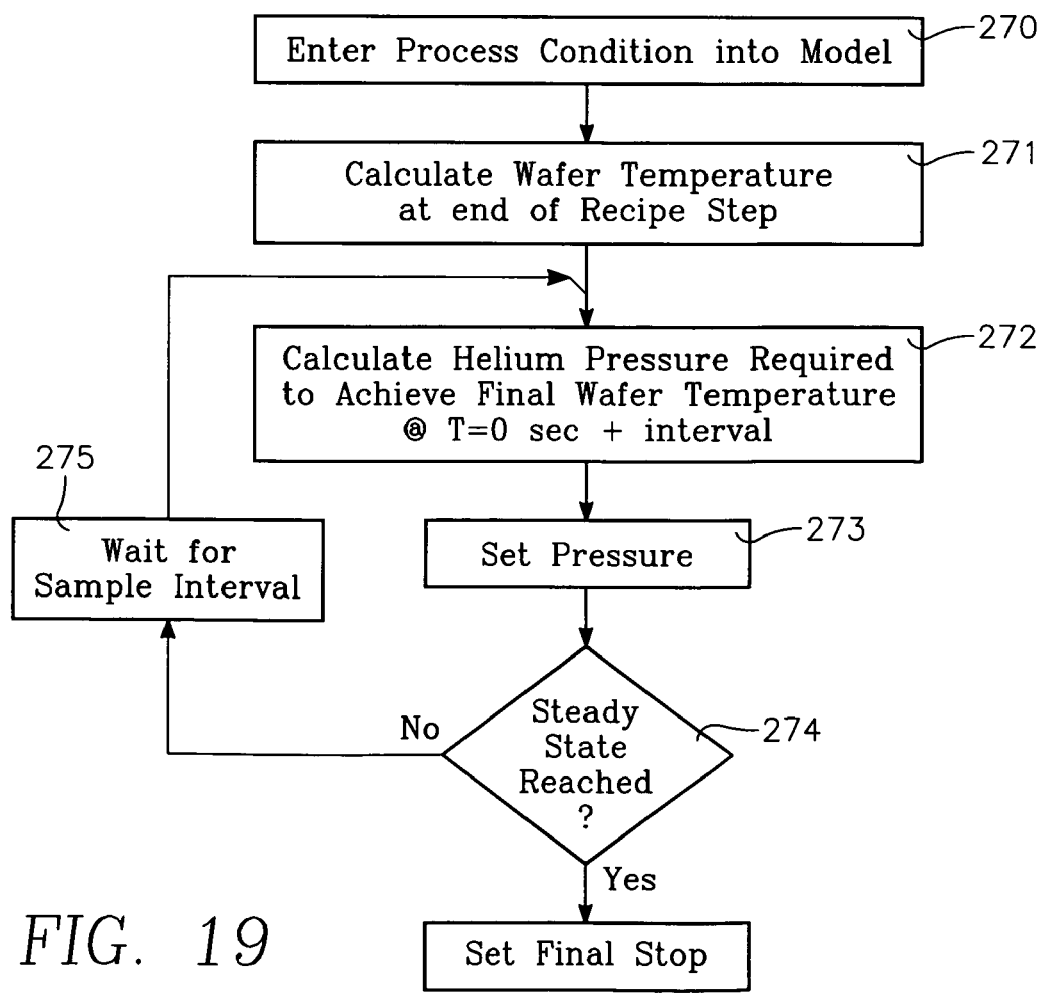
FIG. 19 is a diagram of a process of the invention for controlling wafer temperature at and shortly after plasma ignition.

As the wafer reaches the desired temperature, the agile control loop processor 230 must increase the backside gas pressure (by controlling the valve 229) in order to increase the cooling effect of the electrostatic chuck 105 so that the rapid increase in wafer heating beginning at time t0 does not overshoot the desired temperature. In order to counteract temperature drift, the backside gas pressure can be continually increased to maintain the desired wafer temperature. All these adjustments in backside gas pressure must be carried out accurately and timely. In order to accomplish this, a preferred embodiment of the present invention includes a thermal model of the electrostatic chuck 105 that simulates heat transfer through the various layers of the electrostatic chuck between under given conditions. This feature predicts the optimum backside gas pressure to attain and hold the desired wafer temperature in view of the prevailing conditions. FIG. 19 depicts one cycle of a control process employing a thermal model. An example of the thermal model which will be described subsequently in this specification. The master processor 232 can be programmed to interactively repeat the cycle of FIG. 19 to carry out the control process.

Referring to FIG. 19, the cycle begins with inputting the current process conditions into the thermal model (block 270). These conditions may include the RF heat load on the wafer (which may be expressed as a predetermined fraction of the total applied RF power), the electrostatic chuck temperature at or near the evaporator 200, the electrostatic chuck wafer clamping D.C. voltage, and the backside gas pressure. The next step (block 271) is to obtain from the thermal model a prediction of the final or steady state temperature Tf of the wafer produced under the current process condition (i.e., the temperature reached at time tb of FIG. 18). For example, to do this the thermal model may generate a function T(z,t) defining the evolution over time t of the distribution of the temperature T along the axial direction z through the electrostatic chuck 105. As one possible option, if Tf is not the desired temperature, the initial conditions may be modified and the foregoing steps repeated until the thermal model yields a satisfactory prediction of Tf. Then, the thermal model is used to find a backside gas pressure (i.e., a setting of the valve 229) that would immediately advance the wafer temperature to the predicted steady state temperature Tf (block 272 of FIG. 19). This may be accomplished by varying the value of the backside gas pressure inputted to the model and monitoring the change in predicted steady state wafer temperature until the desired temperature is predicted, indicating that an optimum backside gas pressure value has been found. The backside gas pressure is then set to the optimum value thus identified (block 273). If steady state has been reached (block 274), the process is stopped. Otherwise, the time index is incremented (block 275) and the process cycles back to the step of block 272.

Figure 20:
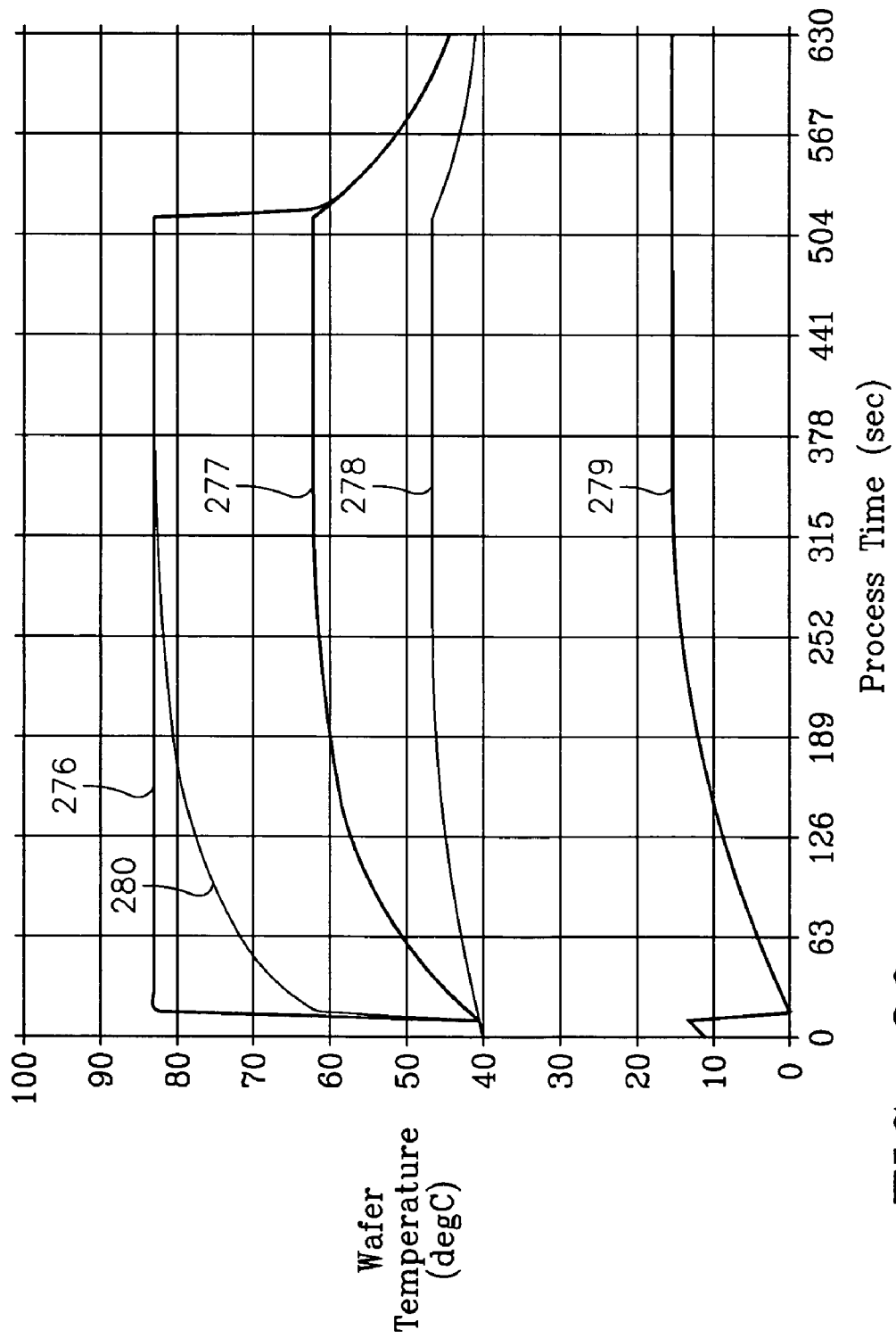
FIG. 20 is a graph of wafer and ESC temperature behaviors over time and a corresponding backside gas pressure profile over time.

FIG. 20 is a graph depicting the temperature behavior over time of the wafer 110 (curve labeled 276), the top surface or puck layer 20 of the electrostatic chuck 105 (curve labeled 277), the bottom or base 5 of the electrostatic chuck 105 (curve labeled 278). In addition, the curve labeled 279 depicts the behavior over the same time scale of the backside gas pressure required to achieve the wafer temperature step behavior of curve 276. For the sake of comparison, the curve labeled 280 depicts the problematic temperature behavior of the wafer in the absence of any change in backside gas pressure, in which the wafer temperature initially reaches the desired process temperature very slowly during a significant portion of the wafer process. Curve 279 of FIG. 20 depicts the initial steep drop in backside gas pressure at the time of plasma ignition that provides the simultaneous steep rise in wafer temperature, and the slow increase thereafter in backside gas pressure to compensate for the rising temperature of the electrostatic chuck 105 corresponding to curve 277. In obtaining the data represented by FIG. 20, the following process conditions existed: 100 Watts of plasma RF (VHF) source power was applied to the overhead ceiling electrode, 4000 Watts of plasma RF (HF) bias power was applied to the ESC, the chamber pressure was 15 Torr, the ESC wafer clamping D.C. voltage was 400 Volts, the ESC evaporator temperature was 40 deg. C., the coolant flow rate was 3.75 gallons per minute over the first 500 seconds.

Figure 21:
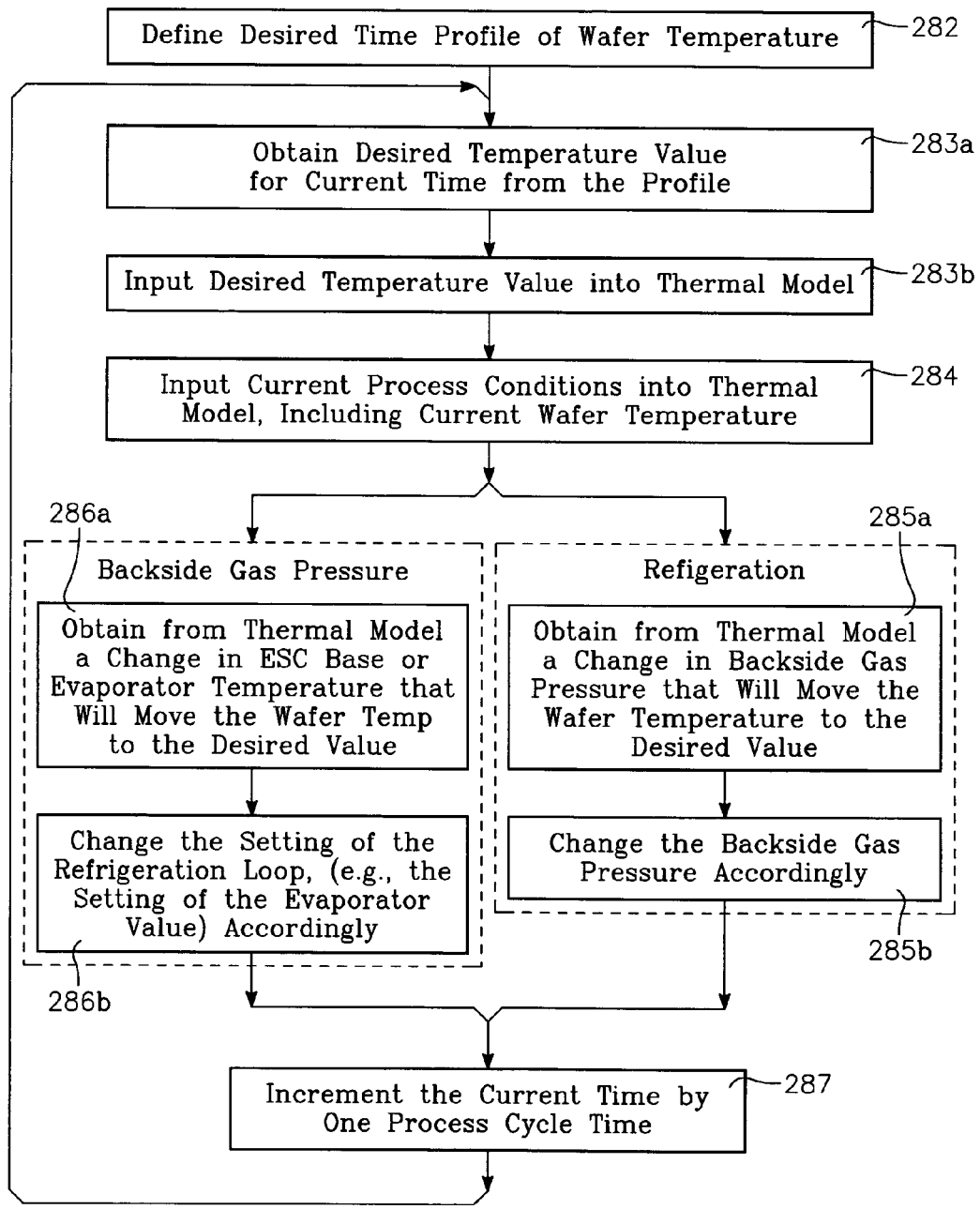
FIG. 21 is a diagram of a temperature ramping control process of the invention.

FIG. 21 illustrates how backside gas pressure ramping (by the agile control loop processor 230) may control wafer temperature during the entire wafer process. It can do this to maintain the wafer temperature at a constant desired temperature or, alternatively, to accurately follow a rapidly changing wafer temperature profile that may be specified in the user's process recipe. In the process of FIG. 21, the first step is to define a desired wafer temperature profile of the desired time evolution of the wafer temperature (block 282 of FIG. 21). The desired temperature for the current time is determined from the profile (block 283a) and input to the thermal model (block 283b). The current process conditions are also input to the thermal model (block 284), such as wafer backside gas pressure, current wafer temperature, RF heat load on the wafer, ESC base temperature and electrostatic wafer clamping force, for example. The thermal model is then used (block 285*a*) to obtain a correction to the wafer backside gas pressure that would move the current wafer temperature to the current desired temperature value obtained from the user-defined profile. This correction is then made to the wafer backside gas pressure (block 285*b*). The value of the current time is incremented to the next sample time or processor cycle time, and the process cycles back (block 287) to the step of block 283*a*.

While the backside gas pressure can be used with the thermal model in the manner depicted in FIG. 21 to control wafer temperature, it is limited to a narrow temperature range defined by a low temperature that is no lower than the ESC evaporator temperature and a high temperature that is limited by the RF heat load on the wafer. Therefore, if the user-specified temperature profile requires changes exceeding this range, then the large range (refrigeration) temperature control loop is be used in conjunction with the agile control loop processor 230. For this purpose the following steps are carried out contemporaneously with the steps of block 285*a* and 285*b*: The thermal model is used (block 286*a*) to obtain a correction to the ESC evaporator (or base) temperature that would move the current wafer temperature to the current desired temperature value obtained from the user-defined profile. This correction is then made to the refrigeration loop, e.g., by adjusting the expansion valve 210 (block 286*b*).

Dual Loop Temperature Control Using the Thermal Model:

By performing the steps of blocks 285*a*, 285*b* and 286*a*, 286*b* of FIG. 21 contemporaneously, the respective advantages of the two control loops (the large range control loop governed by the processor 224 and the agile control loop governed by the processor 230) are automatically selected for maximum effect depending upon the temperature change to be made. Thus, if the next desired temperature change is a very large temperature change that is beyond the capability of the agile control loop, then the effect of the large range temperature control loop will dominate. Similarly, if the next desired temperature range is a very quick temperature change that is too fast for the large range temperature control loop 229, 230, then the large temperature control loop cannot even respond, while the agile temperature control loop 229, 230 effects the needed temperature change.

Figure 22A:
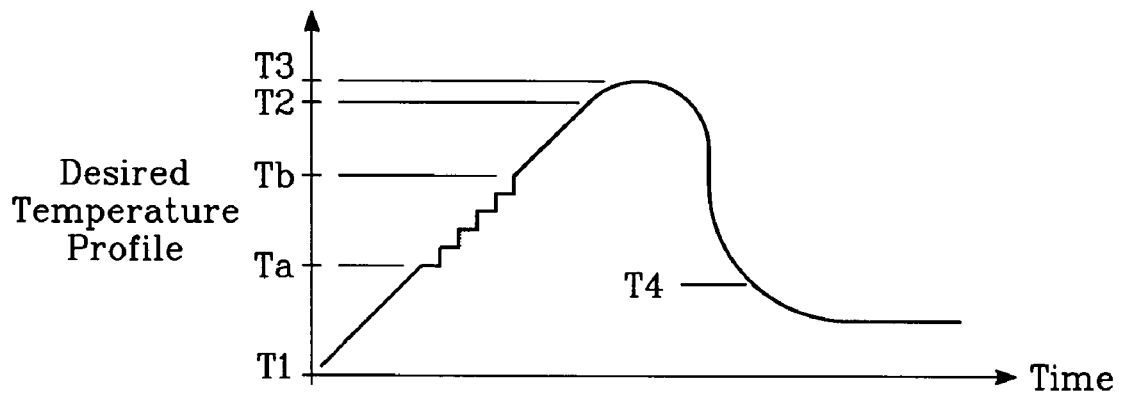
FIGS. 22A and 22B illustrate wafer temperature behavior over time in different modes of the process of FIG. 21.
Figure 22B:
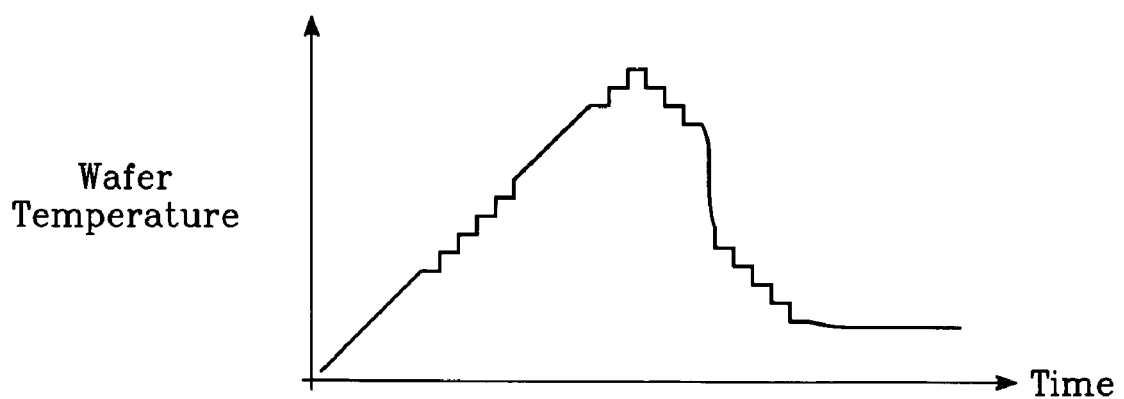

This concept is depicted in the example of FIGS. 22A and 22B. FIG. 22A illustrates an example of a temperature-time profile required by a process recipe. It includes a number slow very large rise in temperature from temperature T1 to temperature T2 that is punctuated by a series of sharp steps between Ta and Tb. At the peak (T3), the temperature change is along an arc having a negative rate of change followed by another arc (around temperature T4) having a positive rate of change. The temperature scale of FIG. 22A is such that the agile control processor 230, using backside gas pressure as in steps 285*a*, 285*b* of FIG. 21, is incapable of making the change from T1 to T2, and therefore this large change is made by the large range control processor 224 in steps 286*a*, 286*b*. However, the time scale of FIG. 21 is such that the large range control processor 224 is incapable of effecting the sharp steps between Ta and Tb. The small deviation represented by these sharp steps is made by the agile control processor 230 in the steps of 285*a*, 285*b*, whose small changes are superimposed upon the long-term temperature rise from T1 to T2 made by the large range control processor 224. Similarly, the sharp arc paths of the temperature profile around T3 and T4 cannot be emulated by the slow moving large range temperature control loop. The agile temperature control loop processor 230 provides the fine response (in steps 285*a*, 285*b* of FIG. 21) required to emulate such arcuate paths in the temperature profile. In doing so, the time resolution of the agile temperature control processor 230, corresponding to the time period of a single process cycle, can create a staircase effect in tracing the arcuate paths of the desired temperature profile of FIG. 22A if these changes occur over a small time period, as indicated in the corresponding portions of FIG. 22B having a staircase appearance. In general, then, small fine changes or corrections effected by the agile control processor 230 in carrying out the steps of blocks 285*a*, 285*b* of FIG. 21 are superimposed upon the long term large temperature changes made by the large range temperature control processor 224 in carrying out the steps of blocks 286*a*, 286*b* of FIG. 21.

Figure 23A:
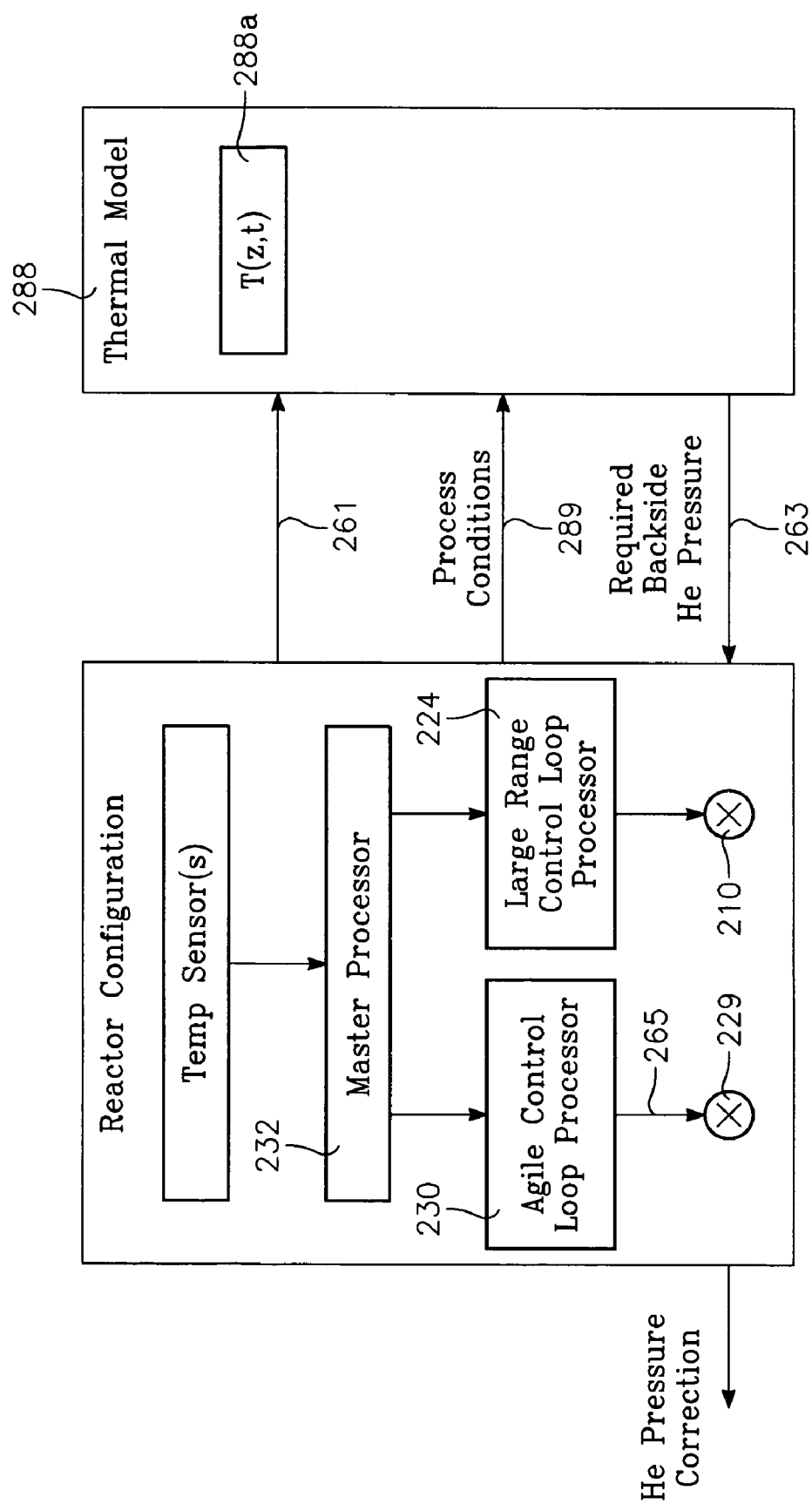
FIGS. 23A and 23B are schematic block diagrams of a wafer temperature ramping control system for carrying out the process of FIG. 21.
Figure 23B:
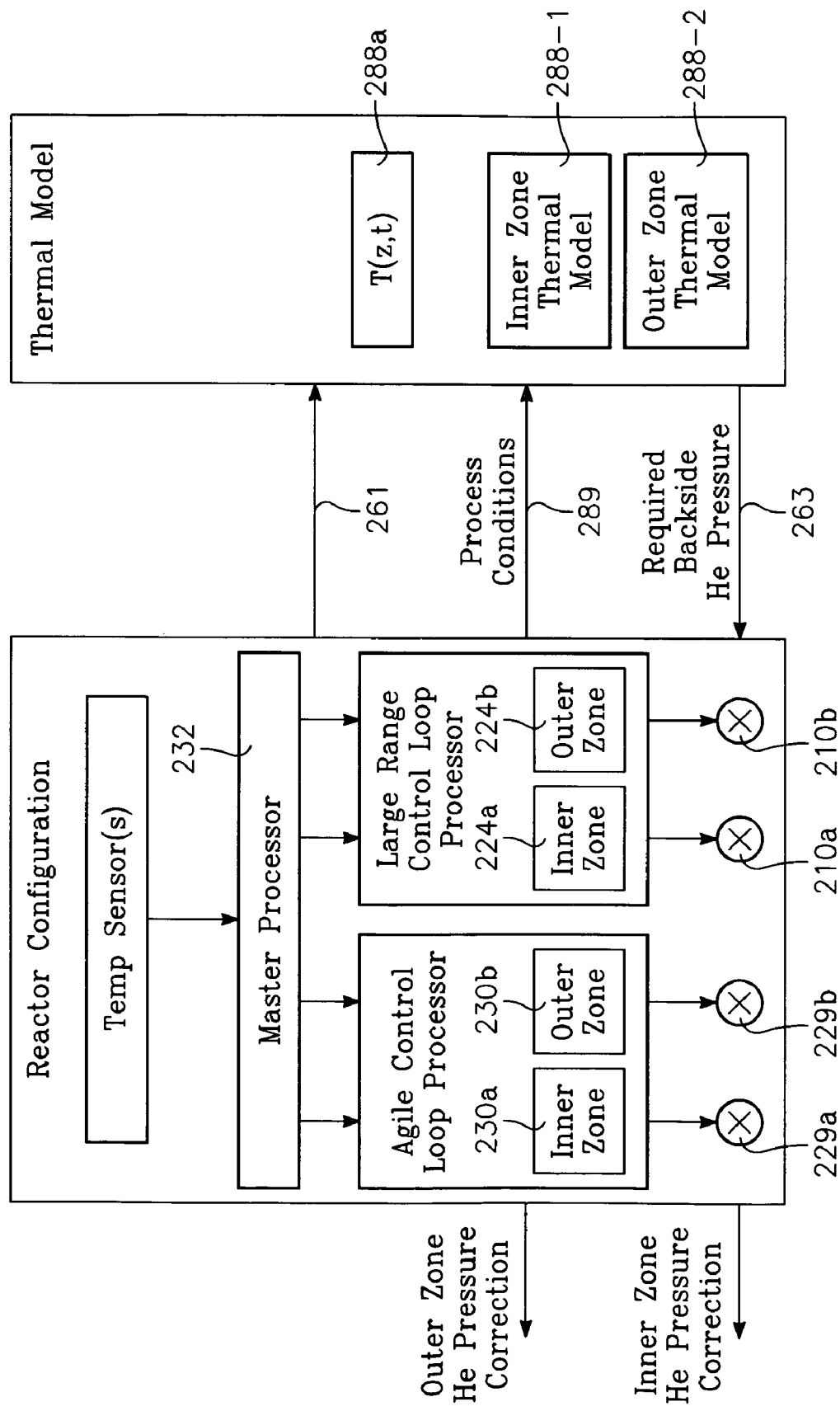

FIGS. 23A and 23B (hereinafter referred to collectively as FIG. 23) depict a modification of the apparatus of FIG. 7 capable of performing the process of FIG. 21. In FIG. 23, a thermal model 288 of the type referred to above is accessible to the apparatus of FIG. 7, and specifically is accessed by any one or all of the following processors: the master control processor 232, the large range feedback control loop processor 224 and the agile feedback control loop processor 230. If both the agile and large range control loop processors 230, 224 are to access the thermal model 288, then the agile and large range control loop processors 230, 224 preferably access the thermal model 288 through the master processor 232 so that the master processor 232 can perform any arbitration that may be necessary. Inputs corresponding to the current process conditions are received at an input 289 of the thermal model. Based upon these inputs, the thermal model 288 generates a time-evolving spatial temperature distribution, T(z,t) that may be exploited to predict steady state temperatures or searched for temperature control settings that could result in achieving a desired temperature, for example.

If the processor 230 is performing the process of FIG. 19, then it makes a request at a model input 261 for the model 288 to obtain, from T(z,t), the steady state wafer temperature that is reached some time after plasma ignition, and this steady state temperature is defined as the target temperature. On the other hand, if the processor 230 is performing the process of FIG. 21, then the desired temperature for the current time according to the user profile (e.g., of FIG. 22) is applied to the model input 261. In either case, the processor 230 obtains from an output 263 of the thermal model 288 a correction to the backside gas pressure that will move the wafer temperature closer to the desired temperature. A corresponding command to the pressure valve 229 is transmitted at an output 265 of the processor 230.

Figure 24:
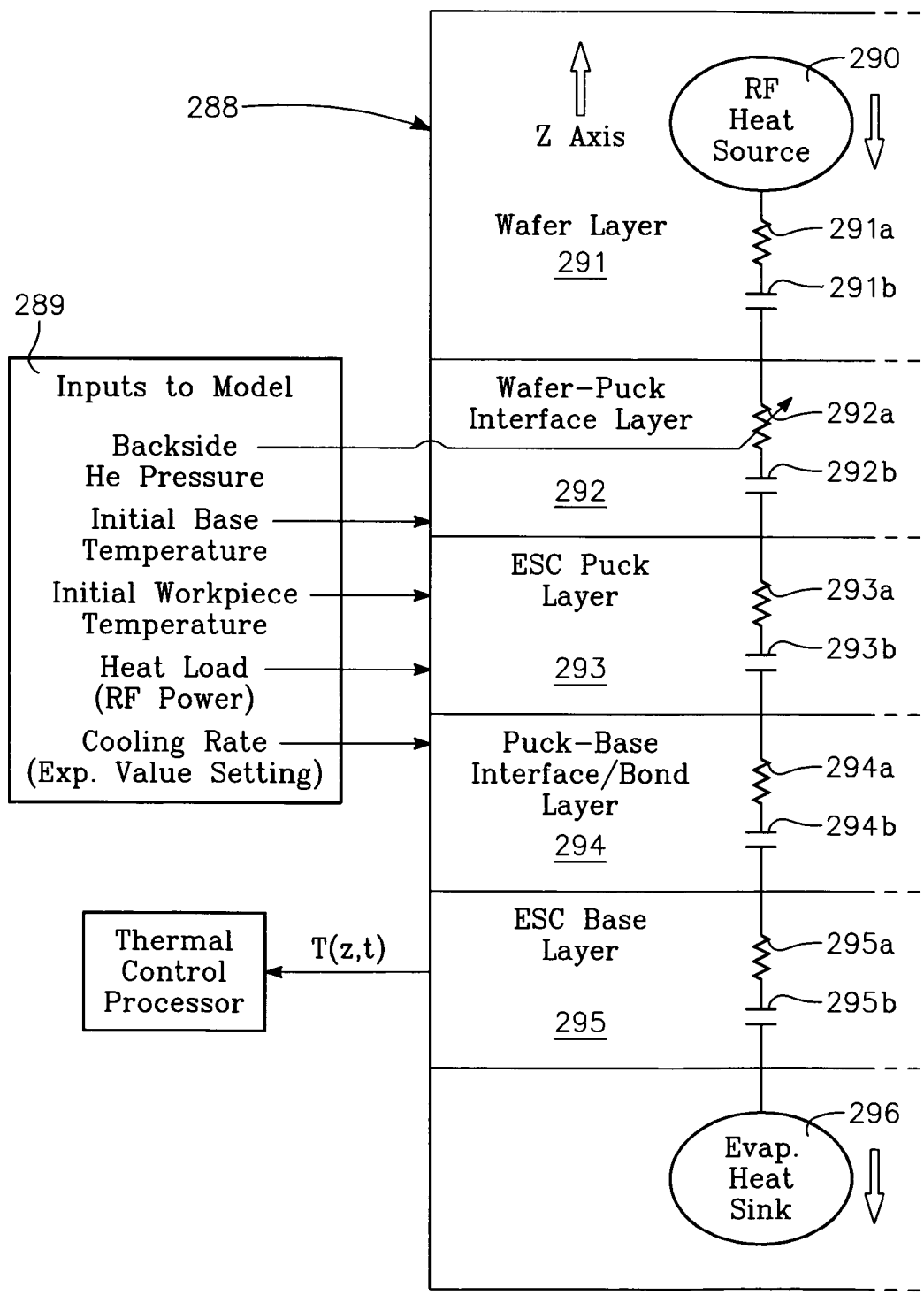
FIG. 24 is a simplified schematic block diagram of an ESC thermal model employed in carrying out certain embodiments of the invention.

FIG. 24 is a simplified schematic block diagram of one possible embodiment of the thermal model 288. The model is divided into layers corresponding to the thermal path between the wafer 110 and the evaporator 200. Layer 290 represents the heat load on the wafer and is specified as a heat flow rate. This heat flow rate is a function of the RF power applied to the reactor and can be readily determined by the skilled worker. Subsequent layers are represented as thermal resistances and heat capacitances. The thermal resistance is a function of the dimensions of the layer and its thermal resistivity or conductivity. The heat capacitance is a function of the layer's specific heat, density and dimensions. Layer 291 represents the wafer 110 as a thermal resistance 291*a* and a thermal capacitance 291*b*. Layer 292 represents the interface between the wafer 110 and the top surface of the ESC puck 20 as a variable thermal resistance 292*a* (that change with the backside gas pressure) and a heat capacitance 292*b*. Layer 293 represents the ESC puck 10, 20 as a puck thermal resistance 293*a* and heat capacitance 293*b*. Layer 294 represents the bond or interface between the puck 10 and the ESC base 5 as a thermal resistance 294*a* and a heat capacitance 294*b*. Layer 295 represents the ESC base 5 as a base thermal resistance 295a and a base heat capacitance 295b. Optionally the model 288 can represent the cooling action of the internal evaporator 200 as a heat sink 296 which is specified by a heat flow rate. This heat flow rate may be determined from the setting of the expansion valve 210 based upon a look-up table that has been previously constructed by the skilled worker from measurement data.

The thermal model 288 must be furnished with the essential initial conditions in order to simulate heat flow through the ESC 105. For this purpose, input 289 of the model 288 receives the following inputs, which, in one example, may be supplied by the control processor 230: the backside gas pressure (from the setting of the valve 229), the initial temperature of the ESC base 5, the initial temperature of the wafer 110 or puck 20, the power of the heat source 290 representing the wafer RF heat load, and (optionally) the cooling rate (power) of the heat sink 296.

The thermal model 288 can then be queried (e.g., by the processor 230) for specific information, such as the temperature at the wafer 110 as a function of time to determine or predict a steady state temperature after plasma ignition (for example). This corresponds to the step of block 271 of FIG. 19. Or, the thermal model 288 may be searched for the best backside gas pressure (or setting of the valve 229) that ramps the wafer temperature to a desired value. This latter feature corresponds to the step of block 272 of FIG. 19 and/or to the step of block 286 of FIG. 21.

Figure 25:
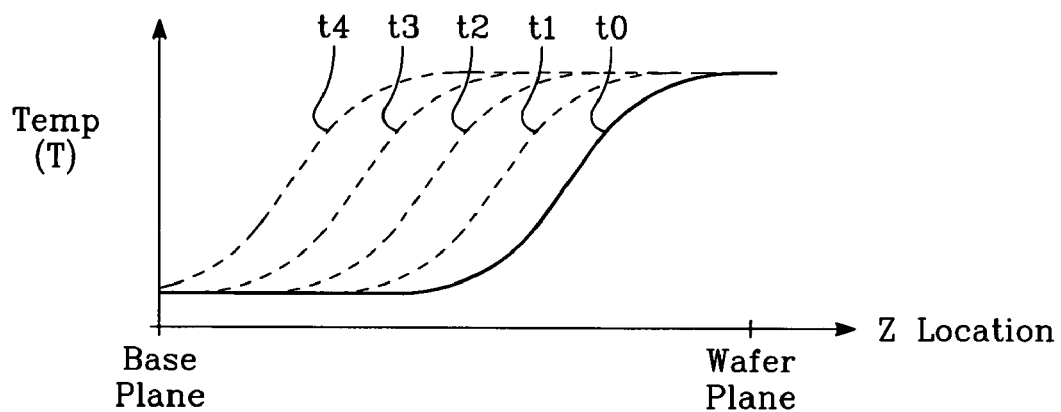
FIG. 25 is a graph depicting the propagation of a temperature change through the ESC simulated by the thermal model of FIG. 24.

Alternatively, in a robust version of the thermal model 288, the model 288 may produce a spatial distribution T(Z) of the temperature along the Z-axis (i.e., along the stack if layers 291 through 295) for each discrete processor sample time, t, within a selected time window. This collection of spatial temperature distributions corresponds to a time-dependent spatial temperature distribution T(Z,t). Its time evolution is depicted qualitatively in FIG. 25, showing the progress over time of a high temperature zone located at the wafer upon plasma ignition and propagating steadily over time toward the ESC base 5. The thermal model can produce different temperature distributions T(Z,t) for different hypothetical backside gas pressure values. Using such robust information, either the thermal model 288 or the control processor 230 can search different distributions T(Z,t) obtained for different backside gas pressure settings for the ideal backside gas pressure setting that provides the desired steady state temperature at the wafer (or other specified location).

The model of FIG. 24 has been described with reference to a lumped element technique employing heat transfer equations in which the thermal characteristics of each layer is inferred from the layer's dimensions and thermal properties. However, the thermal response may be characterized from a set of look-up tables empirically constructed from prior measurement data that define the layer's response (e.g., the temperature difference across the layer) as a function of both time and heat flow rate. Such a look-up table represents a three dimensional surface depicted in FIG. 26 lying in a space defined by three orthogonal axes corresponding to heat flow rate, time and temperature difference across the layer. Each layer may be thus characterized by one (or more) look-up tables or surfaces of the type depicted in FIG. 26. However, layers whose thermal response can be varied by a user-controllable external parameter, such as the wafer-ESC interface layer 292 whose thermal resistance is controlled by the backside gas pressure, are more complex. Specifically, each possible setting of the external parameter generates a different look-up table or surface of the type illustrated in FIG. 26. As illustrated in FIG. 27, two surfaces or look-up tables represent the temperature behavior for two of many possible settings of the backside gas pressure by the valve 229. Many such look-up tables would represent the thermal behavior for a range of backside pressure values. The skilled worker can readily generate such look-up tables for a particular reactor design from measurement data.

Referring again to FIG. 23, the thermal model 288 of FIG. 24 may be used with the multiple temperature zone reactor of FIG. 13 having multiple temperature zones in independent backside gas pressure control is maintained and independent coolant evaporators are provide with independent sets of temperature sensors in each zone, as described above in this specification. If the thermal model 288 of FIG. 24 is combined with the multi-zone reactor of FIG. 13, then the model 288 can consist of plural thermal models 288-1, 288-2, etc., that simulate the different thermal behavior of the respective plural temperature zones of the electrostatic chuck 105. Each respective model is employed by the agile and large range feedback temperature control processors of each temperature zone in the manner described above for the single temperature zone reactor of FIG. 7. Thus, the processes of FIGS. 19 and 21 are carried out for each temperature zone of FIG. 13 individually and independently, the process in each zone using the corresponding one of the thermal models 288-1, 288-2, etc.

Feed Forward Temperature Control to Compensate for Scheduled RF Heat Load Changes:

Some plasma process recipes may require changing the RF heat load on the wafer to achieve different process effects at different steps in the process, without changing the wafer temperature. The problem is that the thermal mass of the electrostatic chuck imposes a large (e.g., 1 to 2 minute) delay between a change in the cooling system's temperature or cooling rate and the consequent effect on wafer temperature. Thus, the large range temperature control loop (using the evaporator 200) has such a slow response that it cannot compensate for sudden changes in the RF heat load on the wafer without permitting a significant drift in wafer temperature before regaining stability. On the other hand, depending upon the initial RF heat load and ESC base temperature, agile temperature control through the backside gas pressure valve 229 (e.g., the agile temperature control loop) might not be able to compensate for large changes in RF heat load on the wafer. Specifically, if either the ESC base temperature is too high or initial RF heat load is too great, controlling only the backside gas pressure valve 229 ("agile temperature control") may not be sufficient to compensate for a sudden large increase in RF heat load. Conversely, if either ESC base temperature is too low or the initial RF heat load is insufficient, then agile temperature control may not be sufficient to compensate for a sudden large decrease in RF heat load.

These problems are solved in accordance with one aspect of the invention by analyzing (in the thermal model 288) the magnitude and time of the next scheduled change in RF head load. The thermal model 288 yields a correction in ESC base temperature which is most likely to compensate for the RF heat load change and maintain constant wafer temperature. The thermal model predicts the amount of time it takes for this temperature correction to propagate through the ESC 105 and reach the wafer 110. The temperature controller 228 implements the recommended change in ESC base temperature sufficiently early (based upon the predicted propagation time) so that the temperature shift in the ESC base reaches the wafer at the time of the scheduled change in RF power level/RF heat load.

Figure 28A:
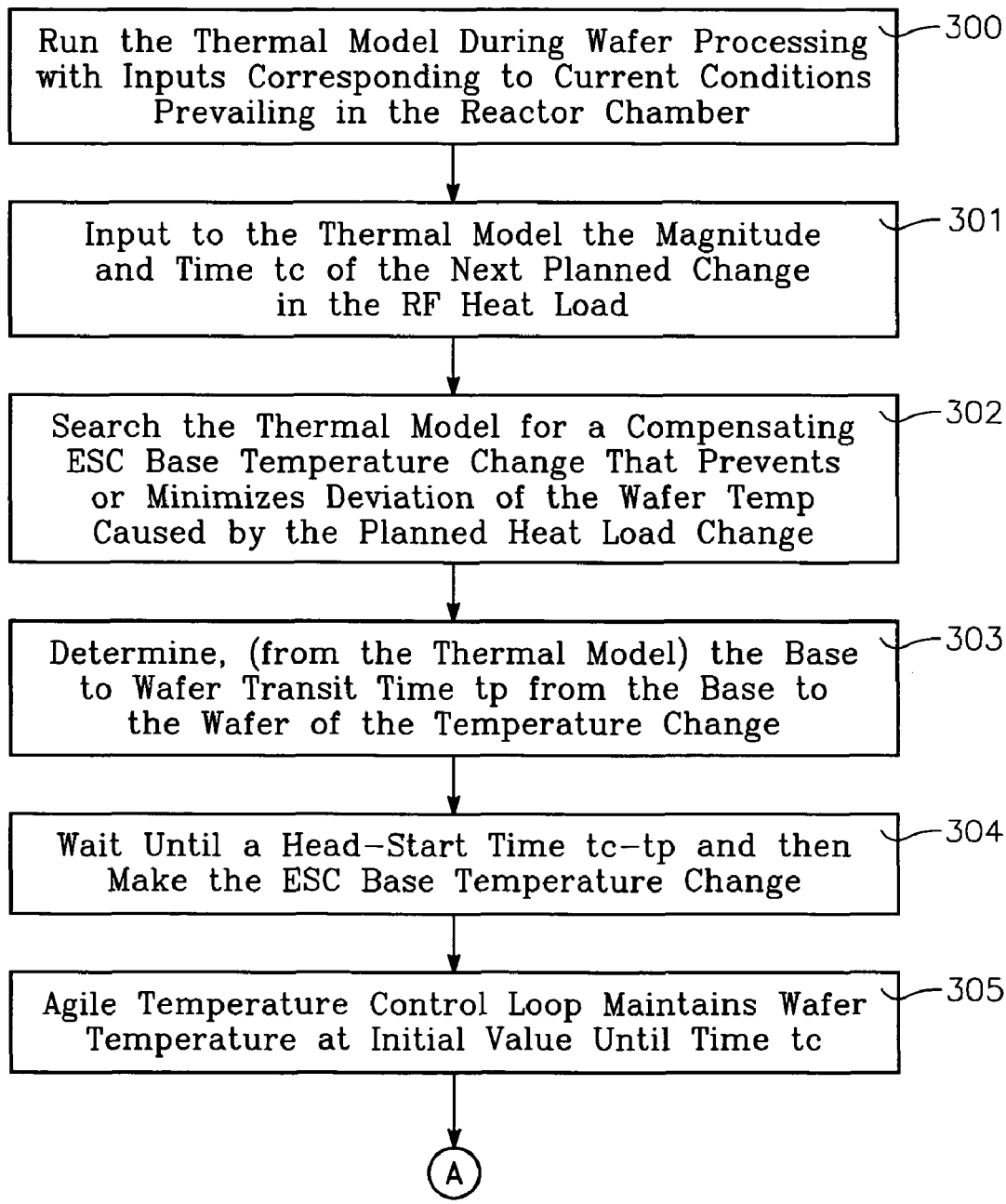
FIGS. 28A and 28B are block diagrams of a feed forward process of the invention for accommodating scheduled RF heat load changes.
Figure 28B:
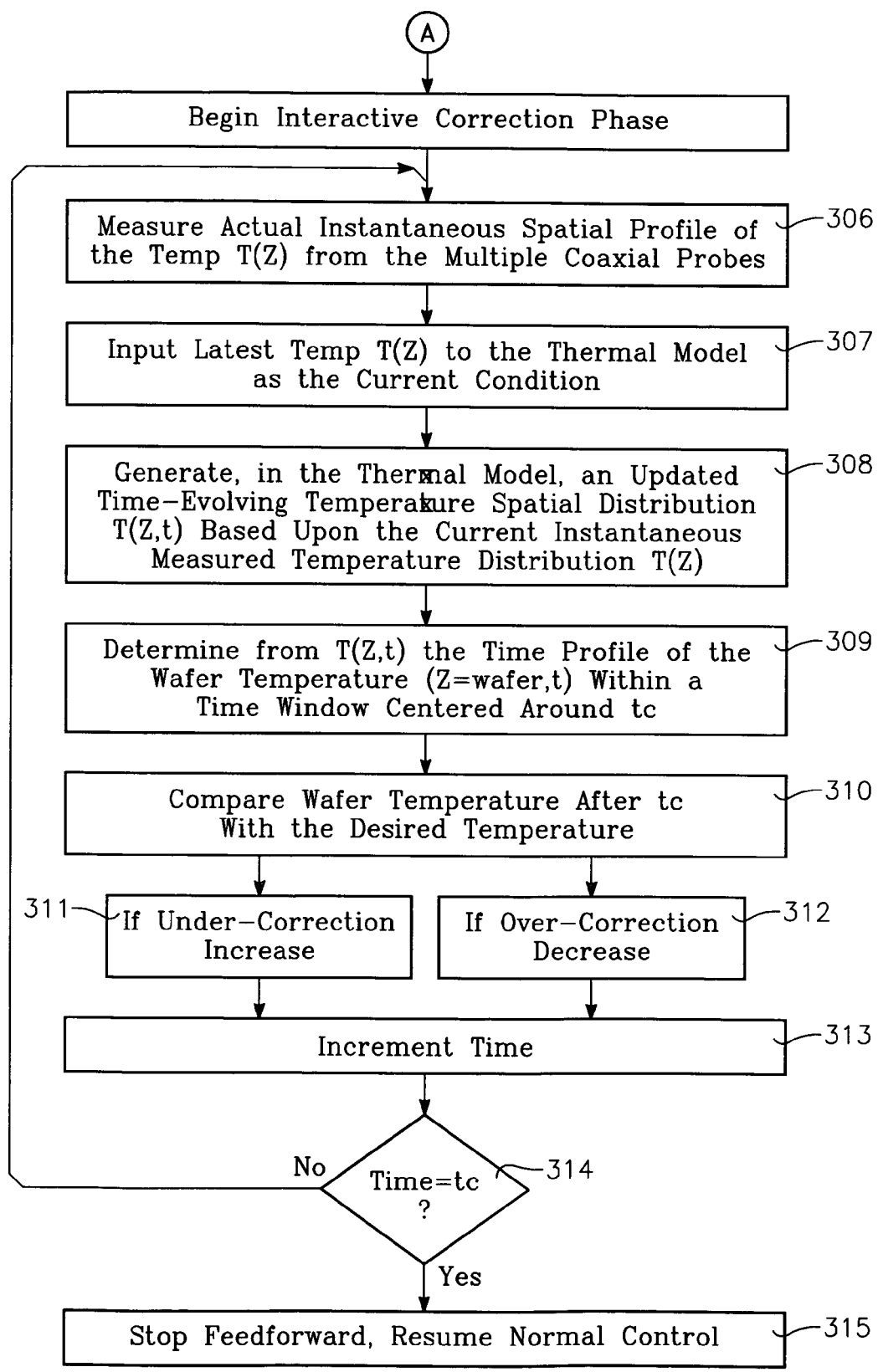

This feed forward feature is illustrated in FIGS. 28A and 28B (hereinafter referred to collectively as FIG. 28) and can be carried out, for the most part, by the large range control loop and its processor 230. Initially, the thermal model 288 is furnished with the current process conditions, such as the RF power (RF wafer heat load), wafer temperature, ESC base temperature, backside gas pressure, and the like (block 300 of FIG. 28). If the current plasma processing recipe calls for a change in RF power level to be made at some later time, then the magnitude and time of this RF power change is input to the thermal model 288 (block 301 of FIG. 28). The thermal model 288 then simulates the effects on wafer temperature of this planned change in RF power. The thermal model 288 is searched for a change in ESC base temperature that would precisely compensate for the planned change in RF power level. This is accomplished by changing (at the input 289 to the thermal model 288) the ESC base temperature and observing the changing effect on the wafer temperature behavior simulated by the model 288. The ESC base temperature change that best compensates for the change in RF heat load is selected (block 302 of FIG. 28). Also, the thermal model 288 can compute or indicate the transit time required for the temperature change at the ESC base 5 to reach the wafer 110 (block 303 of FIG. 28). The compensating change in ESC base temperature is then made in advance of the time of the planned change in RF power by a lead time equal to the base-to-wafer transit time of the compensating base temperature change (block 304 of FIG. 28). (This advance in timing may be included in the simulation of the step of block 302.) In order to guard against wafer temperature drift during the period in which the compensating change in ESC base temperature propagates from the ESC base 5 to the wafer 110, the agile temperature control loop 229, 230 maintains a constant wafer temperature (block 305 of FIG. 28). If, for example, the compensating base temperature change causes a premature drop in ESC puck temperature prior to the planned change in RF power level, then the backside gas pressure would be automatically decreased by the agile temperature control processor 230 to decrease heat conductance from the wafer and thereby hold the wafer temperature constant during this period.

Because the compensating ESC base temperature correction is performed in the step of block 304 well before the planned RF power level change by a lead time corresponding to the base-to-wafer transit time, there is an opportunity for the large range temperature control processor 230 to monitor the propagation of the compensating temperature shift and to make a number of fine corrections to the base temperature change. Therefore, performance is improved by carrying out an iterative correction cycle illustrated in FIG. 28B. This correction cycle can include simultaneously monitoring plural temperature sensors periodically placed in axial alignment along the Z-axis inside the ESC 105, such as the temperature sensors 220, 221 of FIG. 7 (although more than two axially aligned periodically spaced sensors may be employed in this step). From such multiple contemporaneous measurements, an instantaneous temperature profile T(Z) may be deduced (block 306 of FIG. 28B). This instantaneous temperature distribution is input to the thermal model 288 (block 307 of FIG. 28B). Using the instantaneous temperature distribution of the step of block 307 as the updated "initial" condition, the thermal model 288 generates a new updated version of the time-evolving temperature profile T(Z,t). From this, the thermal model 288 can predict the behavior of the wafer temperature around the time (tc) of the scheduled RF power level change (block 309 of FIG. 28A). Using these results, the predicted wafer temperature (or its average) at time tc is compared (block 310 of FIG. 28B) with the initial wafer temperature to determine whether the corrective action taken earlier will cause an overcorrection or an undercorrection in the wafer temperature at or shortly after time tc. If an under-correction is predicted (block 311) then the large temperature control loop decreases the compensating temperature change at the ESC base 5, and if an overcorrection is predicted (block 312) then the compensating temperature change is increased. Thereafter the time is incremented by one cycle time (block 313). If the time has reached tc, the time for the scheduled change in RF power (YES branch of block 314), then the feed forward process is halted and normal temperature control of the wafer is resumed (block 315). Otherwise (NO branch of block 314), the process cycles back to the step of block 306.

Figure 29:
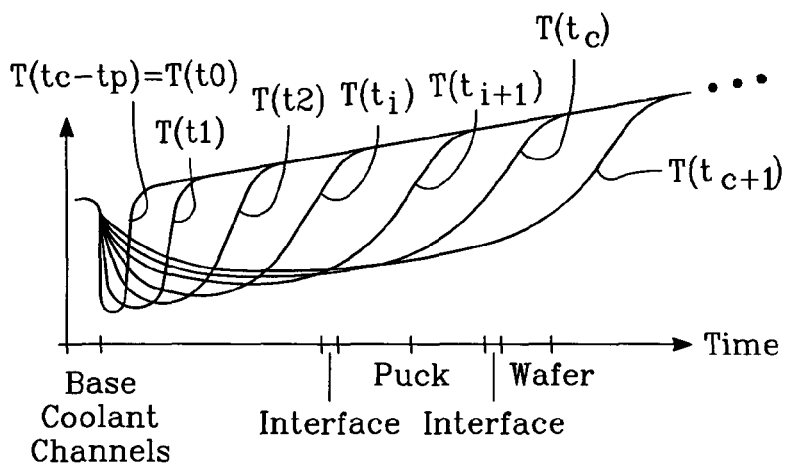
FIG. 29 is a graph depicting the propagation of temperature change through the ESC in the process of FIGS. 28A and 28B.
Figure 30A:
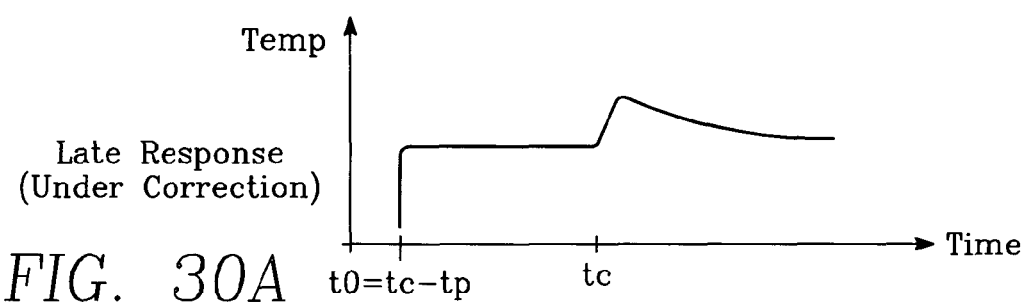
FIGS. 30A, 30B and 30C depict wafer temperature behavior in response to ESC temperature changes compensating for an RF heat load change, in cases in which the compensation is late, on time and early, respectively.
Figure 30B:
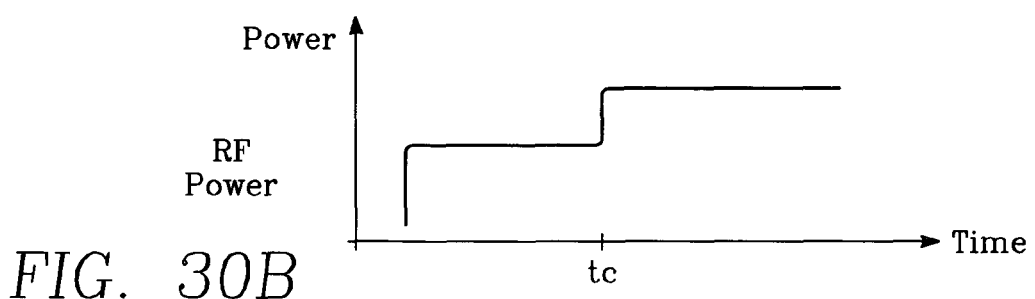
Figure 30C:
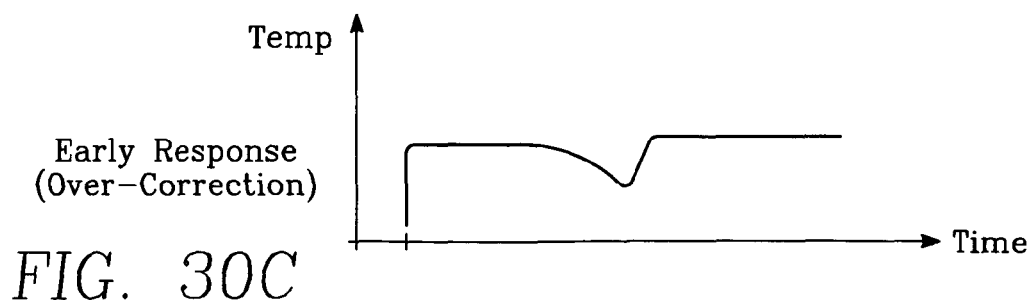

FIG. 29 is a graph depicting the time evolution of the spatial temperature distribution in which the feed forward feature of FIGS. 28A and 28B responds to a planned step up in applied RF power at a future time tc by reducing the ESC base temperature at time t0. At successive times (t1, t2, t3, etc.), the step down in temperature propagates toward the wafer plane in the direction of the Z axis. The maximum temperature depression reaches the wafer plane at time tc, so that there is no overcorrection or undercorrection in this idealized example. The contemporaneous time plots of FIGS. 30A through 30C depict the effects of overcorrection and undercorrection. FIG. 30A depicts applied RF power as a function time, in which a step-up in power occurs at time tc. FIG. 30B depicts wafer temperature behavior over time, in which the corrective step-down in ESC base temperature is undertaken too late or with insufficient temperature change. In either case, the wafer temperature begins to climb above the desired temperature at time tc and begins to return toward the desired level only after making a significant deviation. FIG. 30C depicts wafer temperature behavior over time, in which the corrective step-down in ESC base temperature is undertaken too earlier or with an excessive temperature change. In such a case, the wafer temperature begins to fall at time tc, and begins to return toward the desired level only after making a significant deviation. In the ideal case, the wafer temperature remains constant before, during and after the RF power step-up at time tc.

Feed Forward Control for Temperature Profiling:

Some plasma process recipes may require changing the wafer temperature during plasma processing to achieve different process effects at different steps in the process. With such changes, the process recipe may (or may not) leave the RF heat load on the wafer unchanged. The problem is that the thermal mass of the electrostatic chuck imposes a large (e.g., 1 to 2 minute) delay between a change in the cooling system's temperature or cooling rate and the consequent effect on wafer temperature. Thus, the large range temperature control loop (using the evaporator 200) has such a slow response that it may not be able to make sudden wafer temperature changes required by the process recipe. On the other hand, depending upon the initial RF heat load and ESC base temperature, the agile temperature control loop 229, 230 might not be able to make extremely large changes in wafer temperature that may be required by the process recipe. Specifically, if either the ESC base temperature is too high or initial RF heat load is too great, the agile control loop 229, 230 may not be able to carry out a large decrease in wafer temperature required by the process recipe. Conversely, if either ESC base temperature is too low or the initial RF heat load is insufficient, then the agile control loop 229, 230 may not be able to carry out a large increase in wafer temperature required by the process recipe.

These problems are solved in accordance with one aspect of the invention by analyzing (in the thermal model 288) the magnitude and time of the next scheduled change in wafer temperature called for by the process recipe. If the temperature change is beyond the capability of the agile temperature control loop 229, 230 (the backside gas pressure control), then the large range control loop 224, 210 (the refrigeration control) is employed to effect the desired temperature change. In this case, the thermal model 288 yields an ESC base temperature change which is most likely to effect the desired wafer temperature change. The thermal model predicts the amount of time it takes for this temperature correction to propagate through the ESC 105 and reach the wafer 110. The temperature controller 224 implements the recommended change in ESC base temperature sufficiently early (based upon the predicted propagation time) so that the temperature shift in the ESC base reaches the wafer at the time of the scheduled change in wafer temperature. Just before this, the agile temperature control loop 229, 230 (using backside gas pressure)) maintains the wafer temperature constant until the scheduled time of wafer temperature change.

However, if the agile temperature control 229, 230 (backside gas pressure) is capable by itself of making the desired wafer temperature change, then the agile control loop 229, 230 is called upon to perform the change at the scheduled time, in which case the large range control loop 224, 210 can leave the ESC temperature constant or change it in preparation for a later wafer temperature change.

Figure 26:
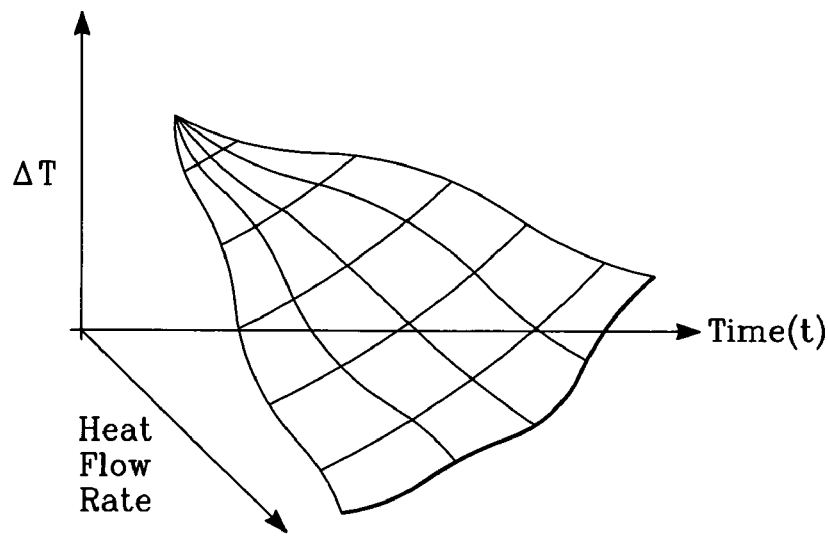
FIG. 26 depicts a 3-dimensional surface corresponding to a look-up table characterizing one layer of the thermal model of FIG. 24.
Figure 27:
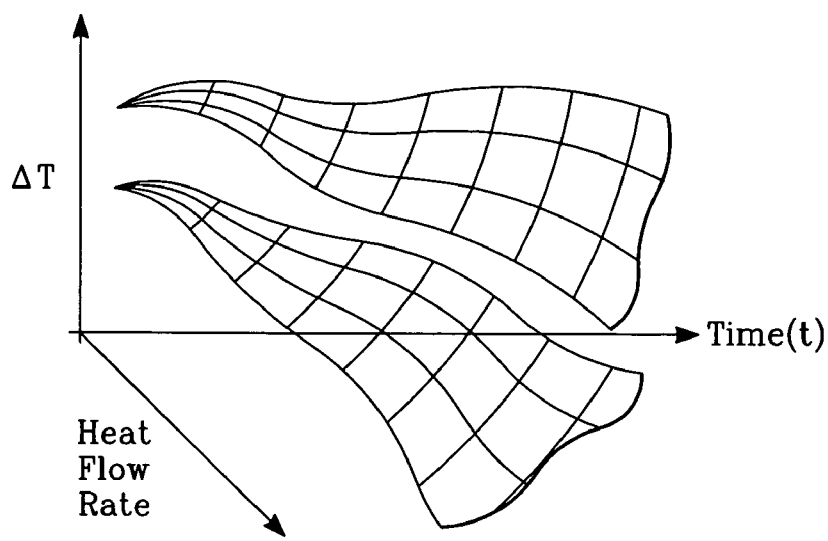
FIG. 27 depicts plural 3-dimensional surfaces corresponding to look-up table characterizing the wafer-puck interface for different backside gas pressures in the thermal model of FIG. 24.
Figure 31A:
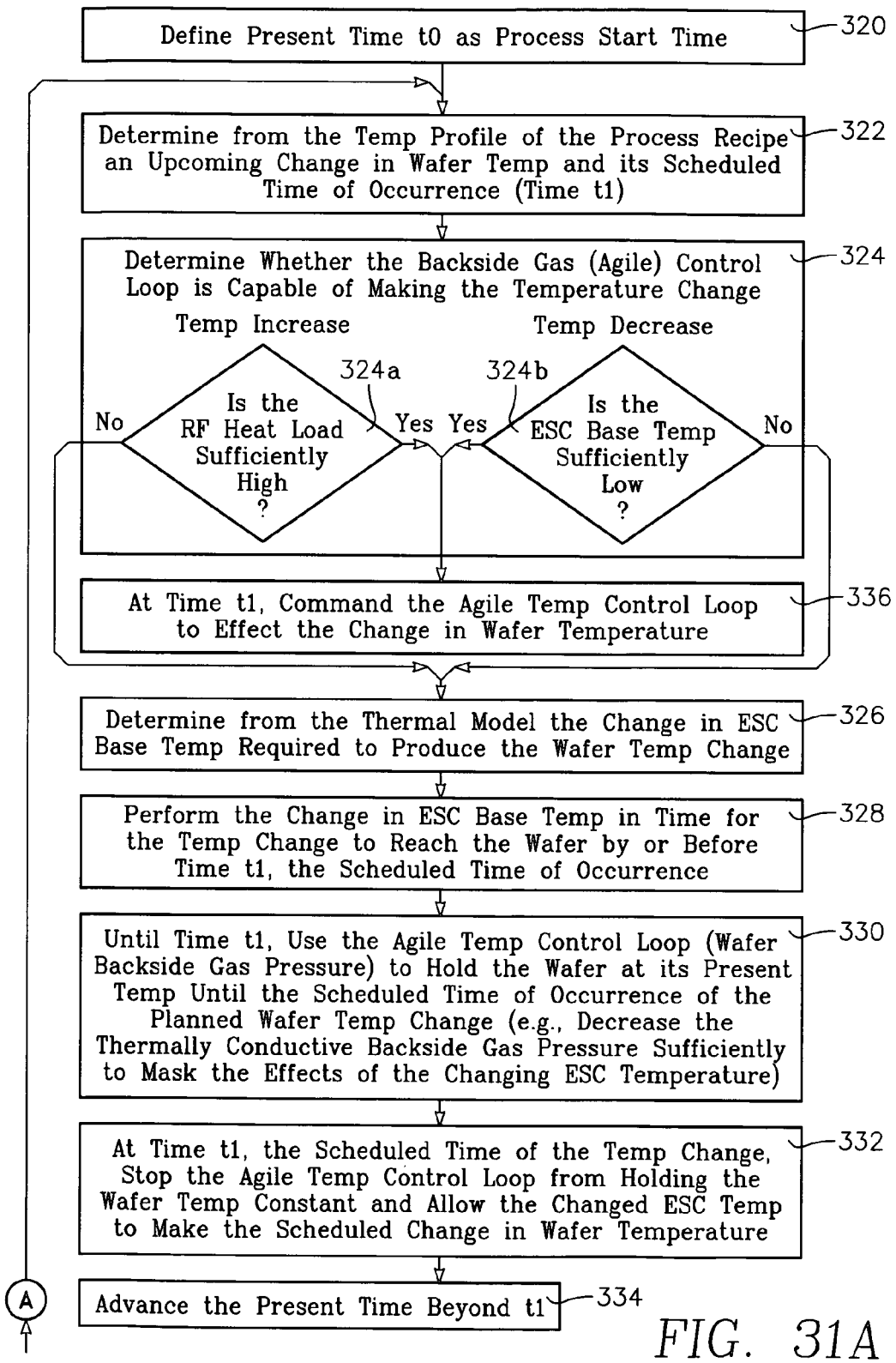
FIGS. 31A, 31B and 31C constitute a flow diagram of a feed forward process of the invention for effecting scheduled temperature changes.
Figure 31B:
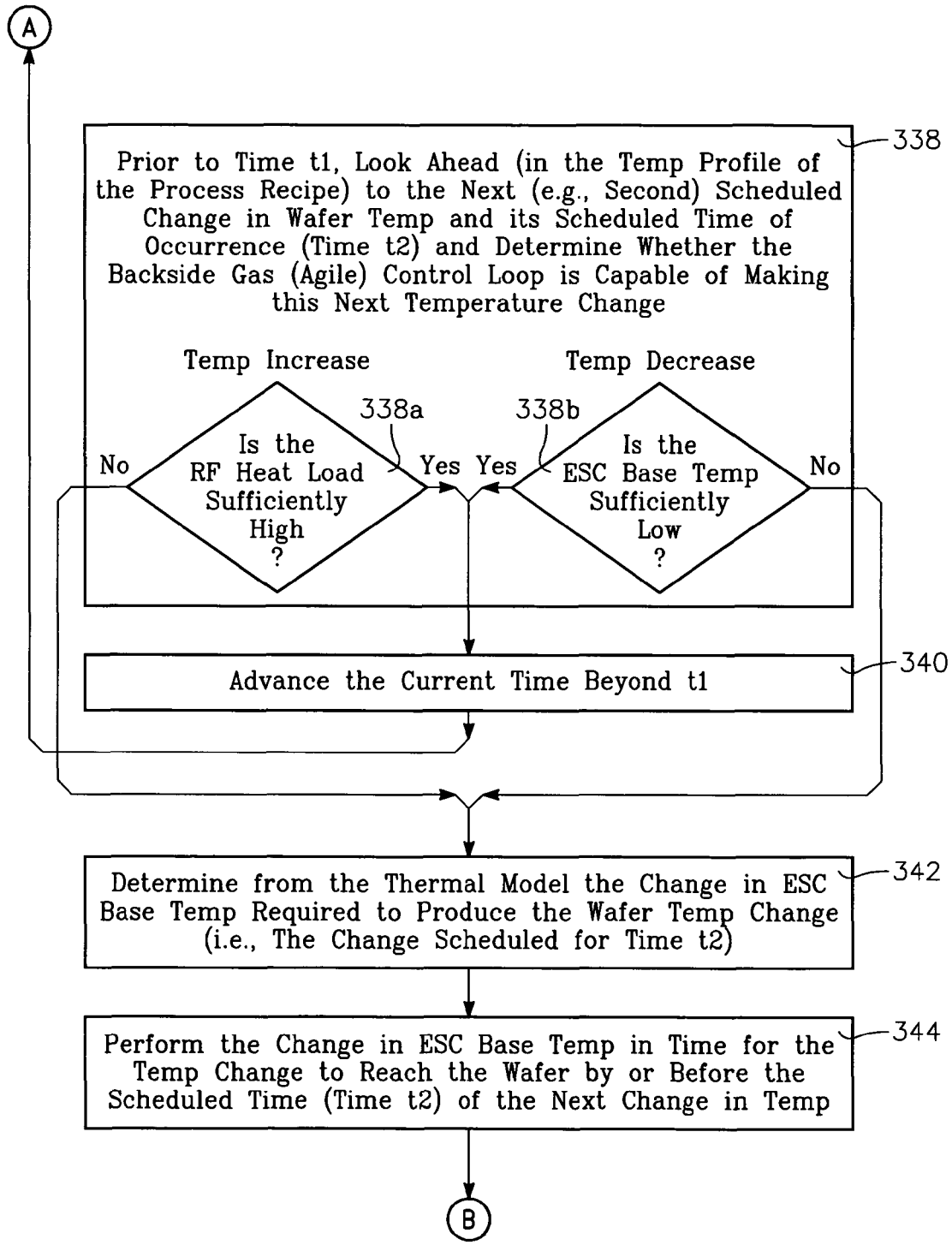
Figure 31C:
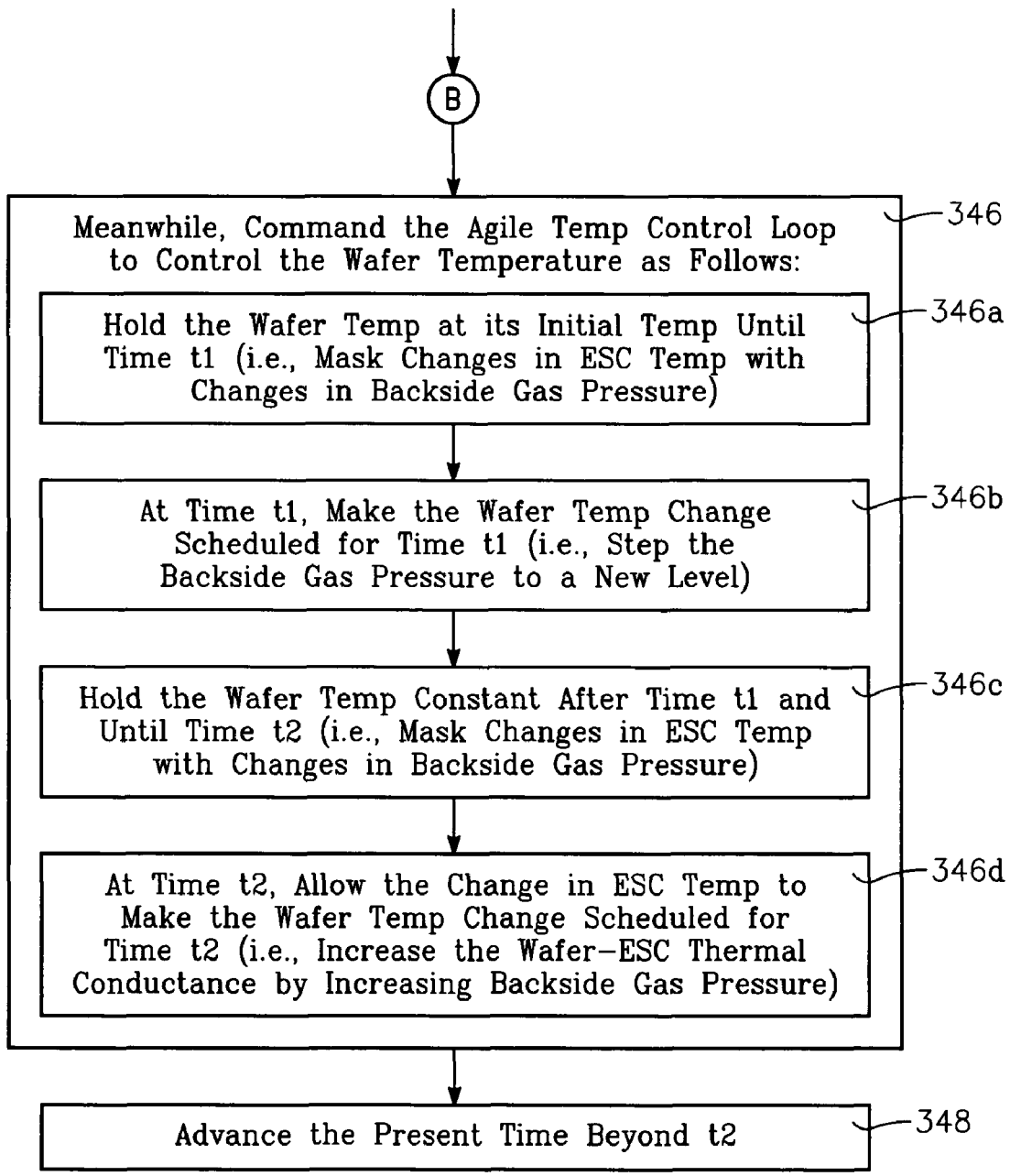

This feed forward feature is illustrated in the block flow diagram of FIGS. 31A, 31B and 31C (hereinafter referred to collectively as FIG. 31) and can be carried out by the master processor 232 of FIG. 7 using the thermal model of FIGS. 24-26. Initially, a time value t0 is set to the process start time (block 320 of FIG. 31). As the plasma processing of the wafer begins and the initial process recipe parameters (chamber pressure, source and bias power, wafer temperature, etc.) are established in the reactor, the process recipe is inspected to find the next scheduled change in wafer temperature and its scheduled time, t1 (block 322 of FIG. 31). A determination is made whether the agile temperature control loop 229, 230 is capable of effecting the planned wafer temperature change (block 324). This determination can entail determining whether the RF heat load on the wafer is sufficiently high if the change is a temperature increase (block 324a), or determining whether the ESC temperature is sufficiently low if the change is a temperature decrease (block 324b). If the planned temperature change is beyond the present capability of the agile temperature control loop 229, 230 (NO branch of block 324a or 324b), then the large range temperature control loop 224, 210 is used. First, the thermal model 288 is queried to find a change in ESC base temperature that would most likely create the desired change in wafer temperature (block 326). This change is made (by servoing the expansion valve 210) beginning at time sufficient for the desired temperature change to propagate through the ESC 105 and reach the wafer by the scheduled time t1 (block 328). Meanwhile, until time t1, the agile temperature control loop 229, 230 is commanded to maintain the wafer temperature at the initial temperature (block 330). To do this, the agile temperature control processor 230 servoes the backside gas pressure valve 229 (to change the thermal conductance through the wafer-ESC interface) so as to compensate for changes in the ESC temperature. Then, at time t1, the agile control loop processor 230 is commanded to allow the wafer temperature to follow the change in ESC temperature so as to effect the desired wafer temperature change (block 332). The present time is advanced beyond time t1 (block 334) and the process cycles back to the step of block 322.

Returning now to the step of block 324, if the agile temperature control loop 229, 230 is found to be capable of making the desired wafer temperature change (YES branch of block 324a or 324b), then the process proceeds to the step of block 336, in which the agile temperature control processor 230 is commanded to wait until time t1 and then make the desired wafer temperature change (by servoing the backside gas pressure valve 229). However, prior to time t1, a look-ahead step (block 338) is performed whose main purpose is to ensure timely preparation of the ESC temperature for a very large scheduled swing in wafer temperature, in order to allow for thermal propagation delay through the ESC 105. This step minimizes (or eliminates) the possibility that a scheduled large swing in wafer temperature requiring a corresponding change in ESC temperature is not addressed in time to allow for thermal propagation delay from the ESC evaporator 200 to the wafer 110. In the look-ahead step of block 338 of FIG. 31B, the process recipe is scanned beyond time t1 to find the next change in wafer temperature and its scheduled time of occurrence t2. A determination is made whether the agile temperature control loop 22, 230 is capable of making this next change. This determination can entail determining whether the RF heat load on the wafer is sufficiently high if the change is a temperature increase (block 338a), or determining whether the ESC temperature is sufficiently low if the change is a temperature decrease (block 338b). If it is determined that the agile temperature control loop 229, 230 is capable of making the desired wafer temperature change (YES branch of block 338a or 338b), then the change is effected by servoing the backside gas pressure valve 229 to effect the desired temperature change (block 339). The present time is advanced beyond t1 (block 340) and the process cycles back to the step of block 322. If, however, it is determined that the agile temperature control loop 22, 230 is not capable of making the desired wafer temperature change (NO branch of block 338), then the ESC temperature must be changed by the large range temperature control loop 228, 210, 200, etc., to effect the desired temperature change. For this purpose, the thermal model 288 is used to determine a change in ESC base temperature that will produce the desired change in wafer temperature (block 342) and this change is performed by servoing the expansion valve 210 either at the present time or at a later time which is, nevertheless, sufficiently early to allow for the thermal propagation delay through the ESC 105 (block 344) to effect the needed change by the scheduled time t2. During the interim, the agile temperature control processor 230 is commanded to regulate the wafer temperature (block 346 of FIG. 31C) as follows: From the present time until time t1, the backside gas pressure is varied as necessary to hold the wafer temperature constant against any changes in ESC temperature (block 346a). At time t1, the backside gas pressure is stepped to make the wafer temperature changed scheduled in the process recipe for time t1 (block 346b). From time t1 and until time t2, the backside gas pressure is varied to compensate for changes in ESC temperature and hold the wafer temperature constant at the new temperature (block 346c). At time t2, the agile temperature control processor 230 stops its efforts to hold the wafer temperature constant and allows (by increasing the backside gas pressure to increase thermal conductance) the new ESC temperature to drive the wafer temperature in accordance with change scheduled for time t2 (block 346d). Then, the present time is advanced past time t2 (block 348) and the process cycles back to the step of block 322. The process continues in this manner until completion of the process recipe.

Figure 32A:
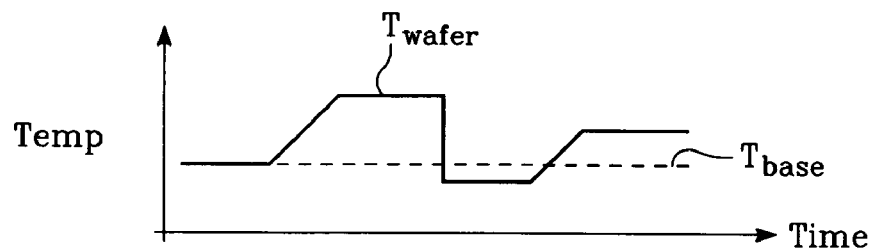
FIGS. 32A and 32B are contemporaneous time diagrams of wafer temperature, ESC temperature (FIG. 32A and backside gas pressure (FIG. 32B) in a first mode of the feed forward process.
Figure 32B:
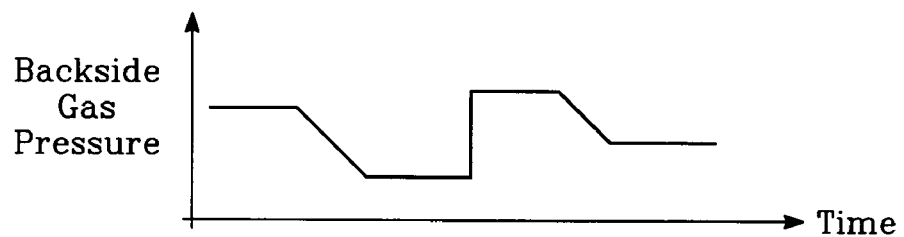

In the process of FIG. 31, with each successive temperature change specified in the process recipe, the step of block 324 determines whether the agile temperature control loop 229, 230 (using backside gas pressure changes) alone is capable of making the desired wafer temperature change, as discussed above. If the answer is always "yes" (at least over a number of successive temperature changes), then the ESC base temperature can be relegated to a constant role and the only changes made are successive changes in the backside gas pressure valve 229. This corresponds to the case of the process of FIG. 31 taking the YES branch of blocks 324*a* or 324*b* over successive iterations. The result is illustrated in FIGS. 32A and 32B in which the ESC base temperature remains at a constant level indicated by the dashed line of FIG. 32A (e.g., by leaving the expansion valve 210 of FIG. 7 at a constant setting) while the backside gas pressure (FIG. 32B) is servoed to follow successive changes in the wafer temperature specified by the process recipe. The corresponding wafer temperature behavior (solid line of FIG. 32A) appears as an inverse of the backside gas pressure behavior (FIG. 32B), in the general case in which the ESC acts as a heat sink for the RF heat load on the wafer. (There is a special but rare case in which the required wafer temperature is so high—or the RF heat load is so low—that the ESC 105 is employed as a heat source.) FIGS. 32A and 32B therefore correspond to a simple mode of the invention in which the ESC base temperature is held at a constant level while the wafer backside gas pressure is varied as required by the process recipe. This mode may be implemented with any cooling device coupled to the ESC 105, such as the constant temperature refrigeration loop of FIG. 7 of the present invention or (alternatively) a conventional prior art refrigeration apparatus.

Figure 33A:
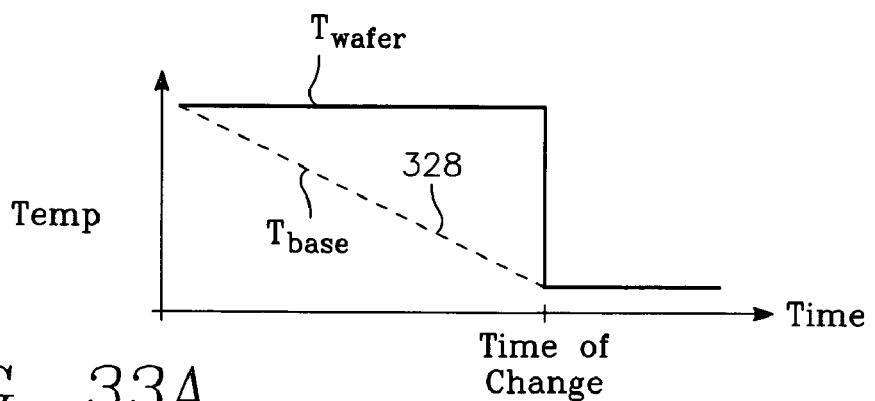
FIGS. 33A and 33B are time diagrams of wafer temperature, ESC temperature (FIG. 33A) and backside gas pressure (FIG. 33B) in a second mode of the feed forward process.
Figure 33B:
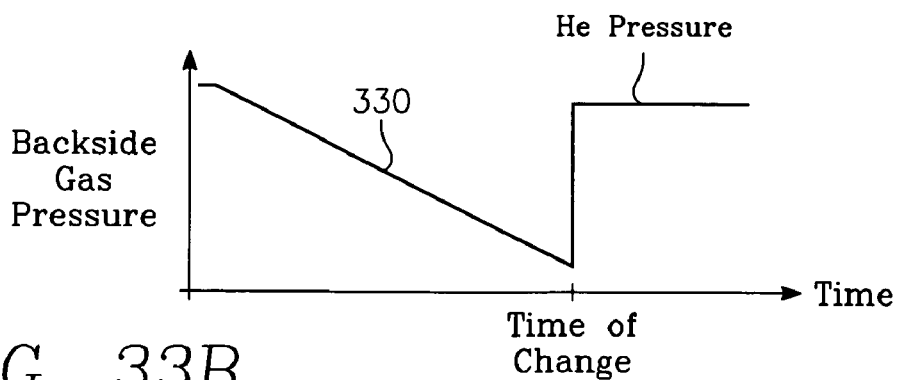

FIGS. 33A and 33B illustrate base and wafer temperature behavior and backside gas pressure profile for the case in which the step of 324 finds that the agile control loop 229, 230 is not capable of making the required change in wafer temperature. In this case, the large range control loop 228, 210, 200, etc., begins to change the ESC base temperature prior to the scheduled time of change in the step of block 328. This causes the ESC base temperature to change (i.e., drop, in the case of an up-coming temperature change that is a decrease in wafer temperature), as illustrated in dashed line in FIG. 33A. At the same time, in the step of block 330 the agile control loop 229, 230 holds the wafer temperature constant until the scheduled time of change (solid line of FIG. 33A). This is done by offsetting the ESC base temperature change with a corresponding change (decrease) in backside gas pressure, as illustrated in FIG. 33B. At the time of change, the backside gas pressure is stepped up to enable the wafer to follow the latest change in ESC temperature.

Figure 34A:
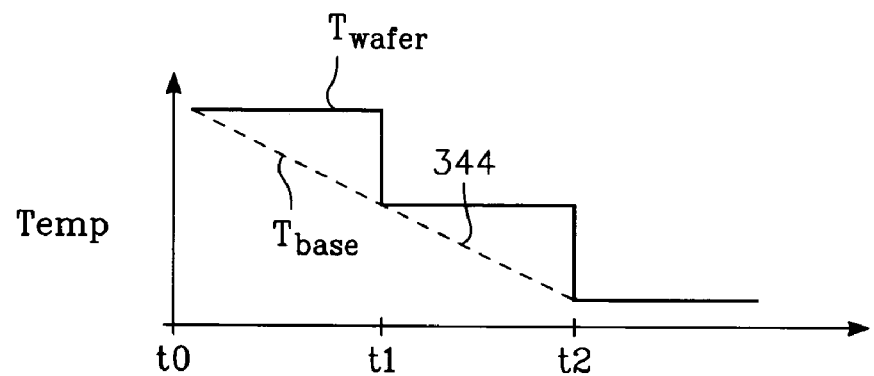
FIGS. 34A and 34B are time diagrams of wafer temperature, ESC temperature (FIG. 34A) and backside gas pressure (FIG. 34B) during operation of a look-ahead loop of the feed forward process of FIGS. 31A-13C.
Figure 34B:
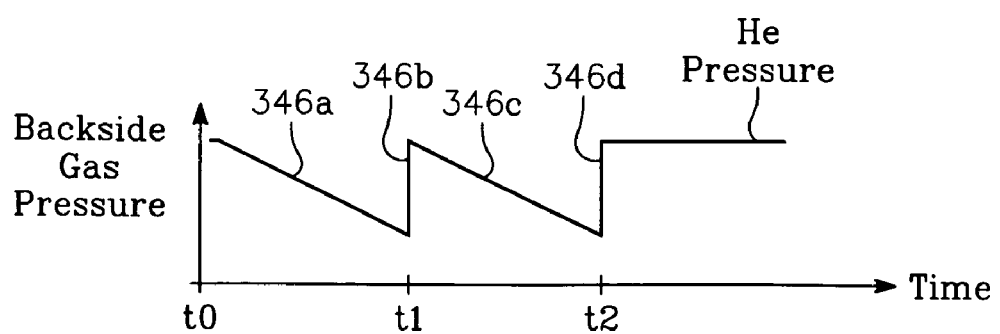

FIGS. 34A and 34B depict the operation of the look-ahead loop of blocks 338-346 of FIG. 31. At time t0, the step of block 338 discovers that, even though the agile temperature control loop can make the next wafer temperature change (scheduled for time t1), it is incapable of making the subsequent change scheduled for time t2. Therefore, the decision is made to use the large range temperature control loop 224, 210, 200, etc. of FIG. 7 to effect the desired wafer temperature change. Moreover, in this example, it is discovered that the required change in ESC base temperature must begin immediately in order for its full effect to reach the wafer by time t2. Therefore, the required change in position of the expansion valve 210 is made at time t0, so that the ESC temperature begins to change (e.g., decrease, in this example), as indicated by the dashed line of FIG. 34A. FIG. 34A shows that the ESC temperature (as measured near the wafer) reaches the required level just before time t2, and therefore is held at that new temperature thereafter. However, from time t0 to time t1, the backside gas pressure (FIG. 34B) decreases in order to hold the wafer temperature constant, in accordance with the step 346*a* of FIG. 31. At time t1 the backside gas pressure is stepped to a different level to achieve the wafer temperature change scheduled for time t1, in accordance with the step of block 346*b* of FIG. 31. From time t1 to time t2, the wafer temperature is held at this new level by varying the backside gas pressure to offset the effect at the wafer of the changing ESC temperature, in accordance with the step of block 346*c* of FIG. 31. Finally, at time t2, the backside gas pressure is restored to a high thermal conductance level to permit the new ESC temperature to bring about the change in wafer temperature scheduled for time t2.

Figure 35A:
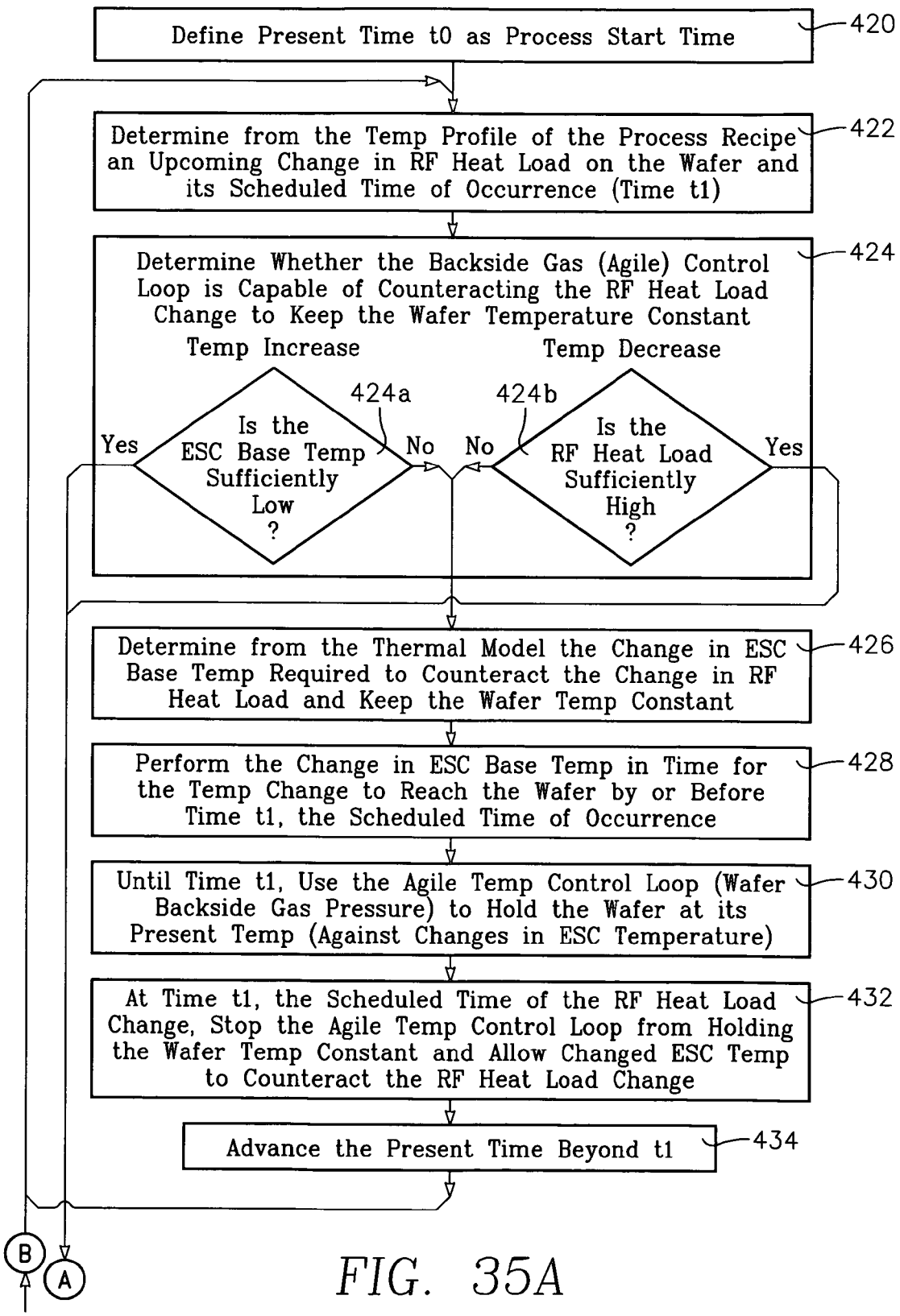
FIGS. 35A, 35B and 35C constitute a flow diagram of a feed forward process corresponding to that of FIGS. 31A-31C, but adapted to compensated for scheduled changes in RF heat load on the wafer.
Figure 35B:
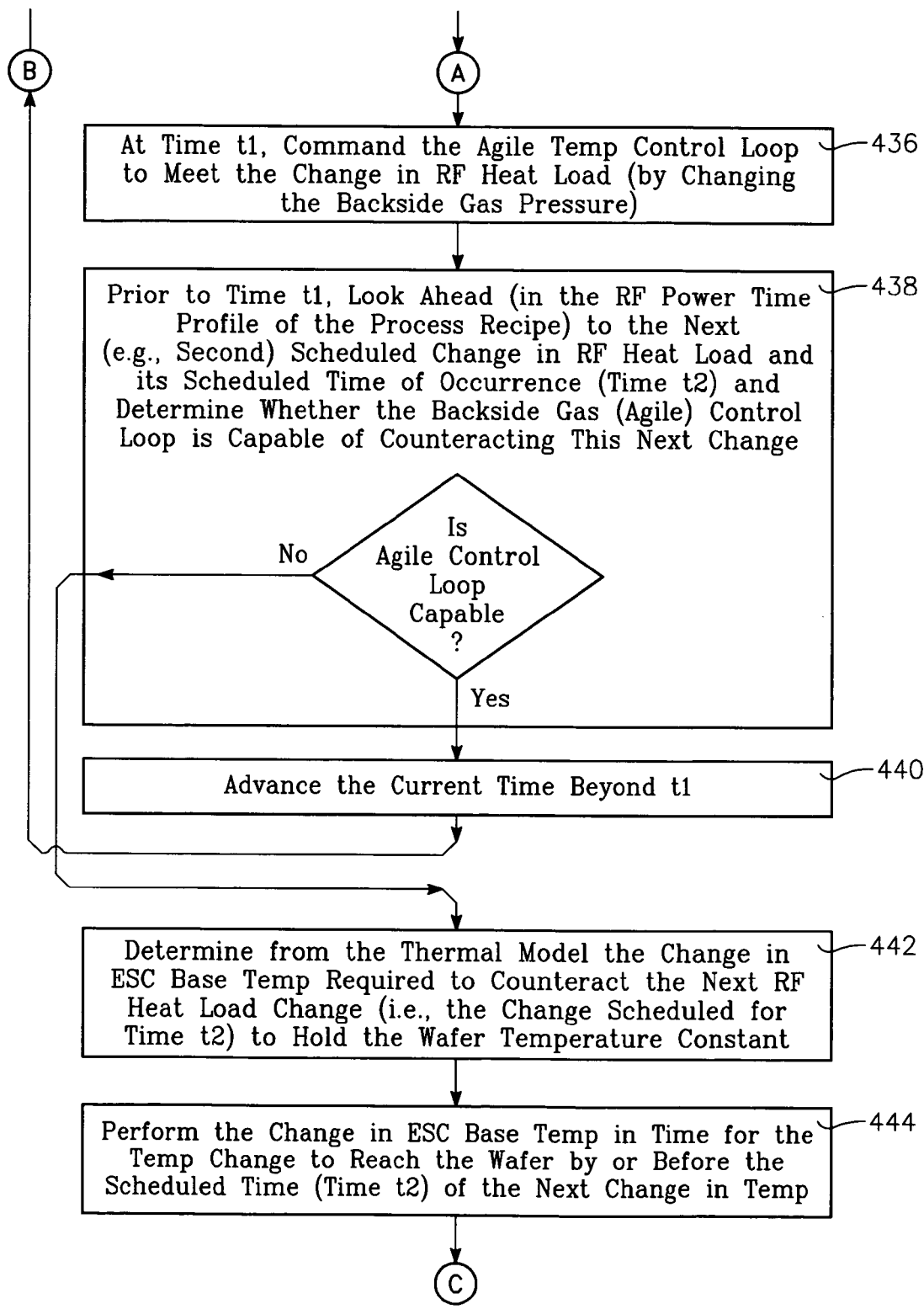
Figure 35C:
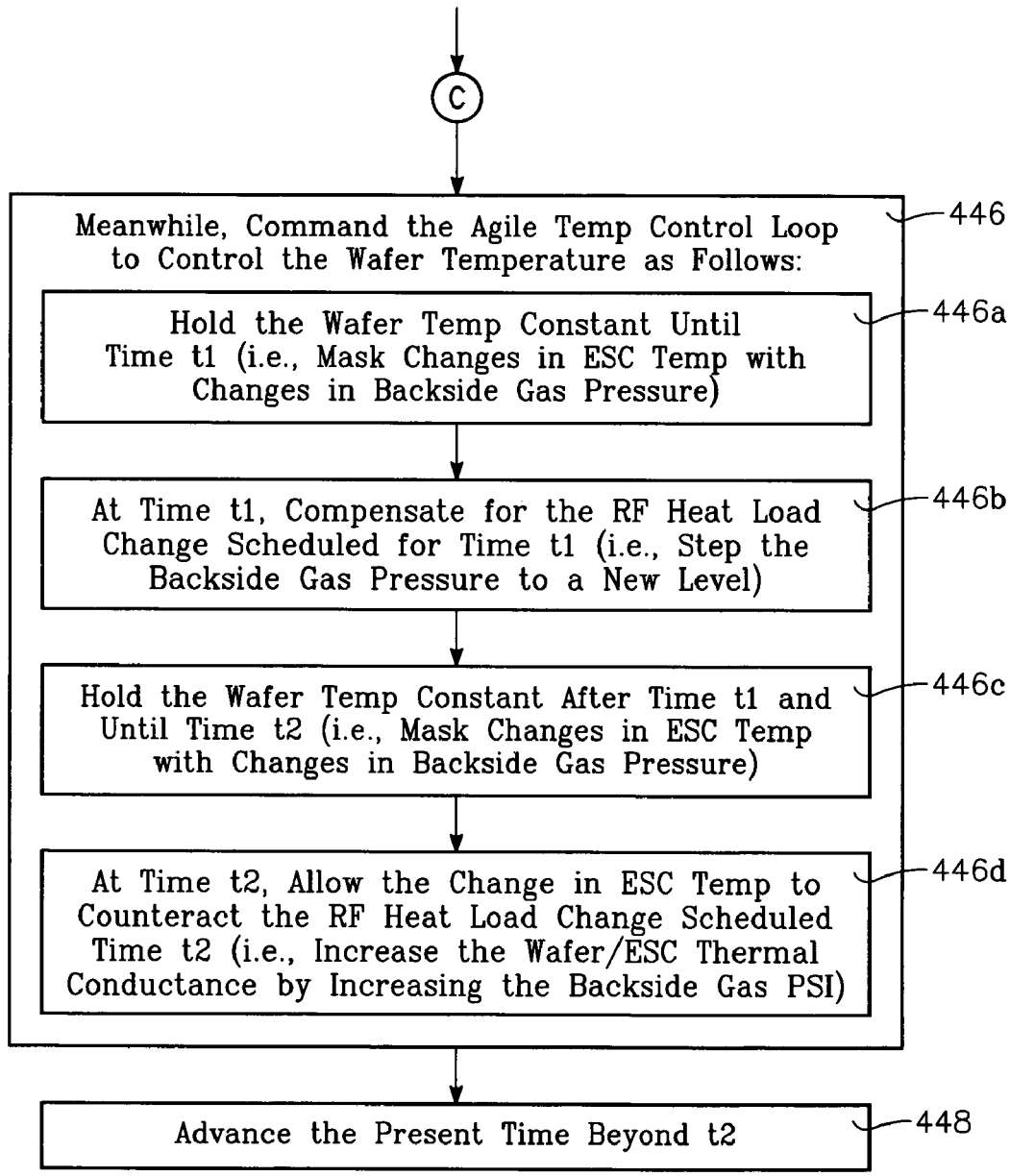

Feed Forward Temperature Control to Compensate for Scheduled RF Heat Load Changes Using Both Agile and Large Range Temperature Control Loops:

While the feed forward process of FIG. 31 is described as carrying out scheduled changes in wafer temperature, it may be modified to counteract scheduled changes in RF heat load on the wafer. Such a process is illustrated in FIGS. 35A, 35B and 35C, which will now be described. The first step, block 420, defines present time t0 as process start time. The next step, block 422, determines from the temperature profile of the process recipe an upcoming change in RF heat load on the wafer its scheduled time of occurrence (time t1). In the step of block 424, it is determined whether the agile control loop 229, 230 is capable of counteracting the RF heat load change to keep wafer temperature constant. To do this, the following determinations may be made: whether the change is an increase in RF heat load, is the present ESC base temperature sufficiently low (block 424*a*); whether the change is a decrease in RF heat load, is the present RF heat load sufficiently high or will the changed RF heat load be sufficiently high (block 424*b*).

If it is found that the agile temperature loop is not capable of meeting the change in RF heat load (NO branch of blocks 424*a* or 424*b*), then the large range temperature control loop 224, 210, 200, etc. controlling the ESC temperature must be used instead. Therefore, the next step (block 426) is to determine from the thermal model 288 the change in ESC base temperature required to counteract the change in RF heat load and keep the wafer temperature constant. This change in ESC base temperature is then performed (by controlling the refrigeration loop expansion valve 210) in time for the temperature change to reach the wafer by or before time t1, the scheduled time of occurrence (block 428). In the meanwhile, until time t1, the agile temperature control loop 229, 230 is used to hold the wafer at its present temperature against changes in ESC temperature (block 430).

At time t1, the scheduled time of the RF heat load change, the agile temperature control loop processor 230 allows the changed ESC temperature to counteract the RF heat load change (block 432). The time index (present time) is then advanced beyond time t1 (block 434) and the process loops back to the step of block 422.

If the step of block 424 determines that the agile control loop 229, 230 is capable of meeting the change in RF heat load (YES branch of blocks 438*a* or 438*b*), then later, at time t1, the agile temperature control loop 229, 230 changes the backside gas pressure to meet the change in RF heat load (block 436). Meanwhile, prior to time t1, the process looks ahead (in the RF power time profile of the process recipe) to the next (e.g., second) scheduled change in RF heat load and its scheduled time of occurrence (time t2) and determines whether the agile control loop 229, 230 is capable of counteracting this next RF heat load change (block 438). This determination is carried out in much the same manner as the step of block 424. If the determination is positive (YES branch of block 438), then no action is taken, and time is advanced beyond the current time t1 (block 440) and the process loops back to the step of block 422.

Otherwise, if it is found that the agile control loop 229, 230 cannot meet the change in RF heat load scheduled for time t2 (NO branch of block 438), then the large range temperature control loop controlling ESC temperature must be used instead. Therefore, in the next step, the thermal model 288 is used to determine the change in ESC base temperature required to counteract the next RF heat load change (i.e., the change scheduled for time t2) to hold the wafer temperature constant (block 442). This change in ESC base temperature is then performed by the large range control loop 224, 210, 200 in time for the temperature change to reach the wafer by or before the scheduled time (time t2) of next change in wafer temperature (block 444). During this time the agile temperature control loop 229, 230 regulates the wafer temperature against the changing ESC temperature (block 446). It does this as follows: hold the wafer temperature constant until time t1 (i.e., mask changes in ESC temperature with changes in backside gas pressure) (block 446a); at time t1, compensate for the RF heat load change scheduled for time t1 (i.e., step the backside gas pressure to a new level) (block 446b); hold the wafer temperature constant after time t1 and until time t2 (i.e., mask changes in ESC temperature with changes in backside gas pressure) (block 446c); at time t2, allow the change in ESC temperature to counteract the RF heat load change scheduled for time t2 (i.e., increase the wafer-ESC thermal conductance by increasing the backside gas pressure) (block 446d). Thereafter, the present time index is advanced beyond time t2 (block 448) and the process loops back to the step of block 422.

Simultaneous Control of Scheduled Changes in RF Heat Load and Wafer Temperature:

In some applications, it may be necessary to accommodate, simultaneously, a certain wafer temperature profile over time specified by the process recipe (such as the complex profile of the solid line of FIG. 32A) and a complex RF power (or wafer heat load) profile over time that may vary in a manner completely different from the temperature profile. In other words, a complex wafer temperature time profile may have to be implemented while accommodating scheduled swings in RF heat load on the wafer. This can be achieved by operating the RF heat load feed forward loop of FIGS. 28A-B and the temperature profile feed forward loop of FIG. 31 together, using the master processor to arbitrate or superimpose different control commands from the two feed forward loops addressed to the large range control loop processor 224 (governing the expansion valve 210 of FIG. 7) as well as different control commands from the two feed forward loops addressed to the agile control loop processor 230 (governing the backside gas pressure valve 229 of FIG. 7). Such a combination is depicted in FIG. 36 discussed below.

Figure 36:
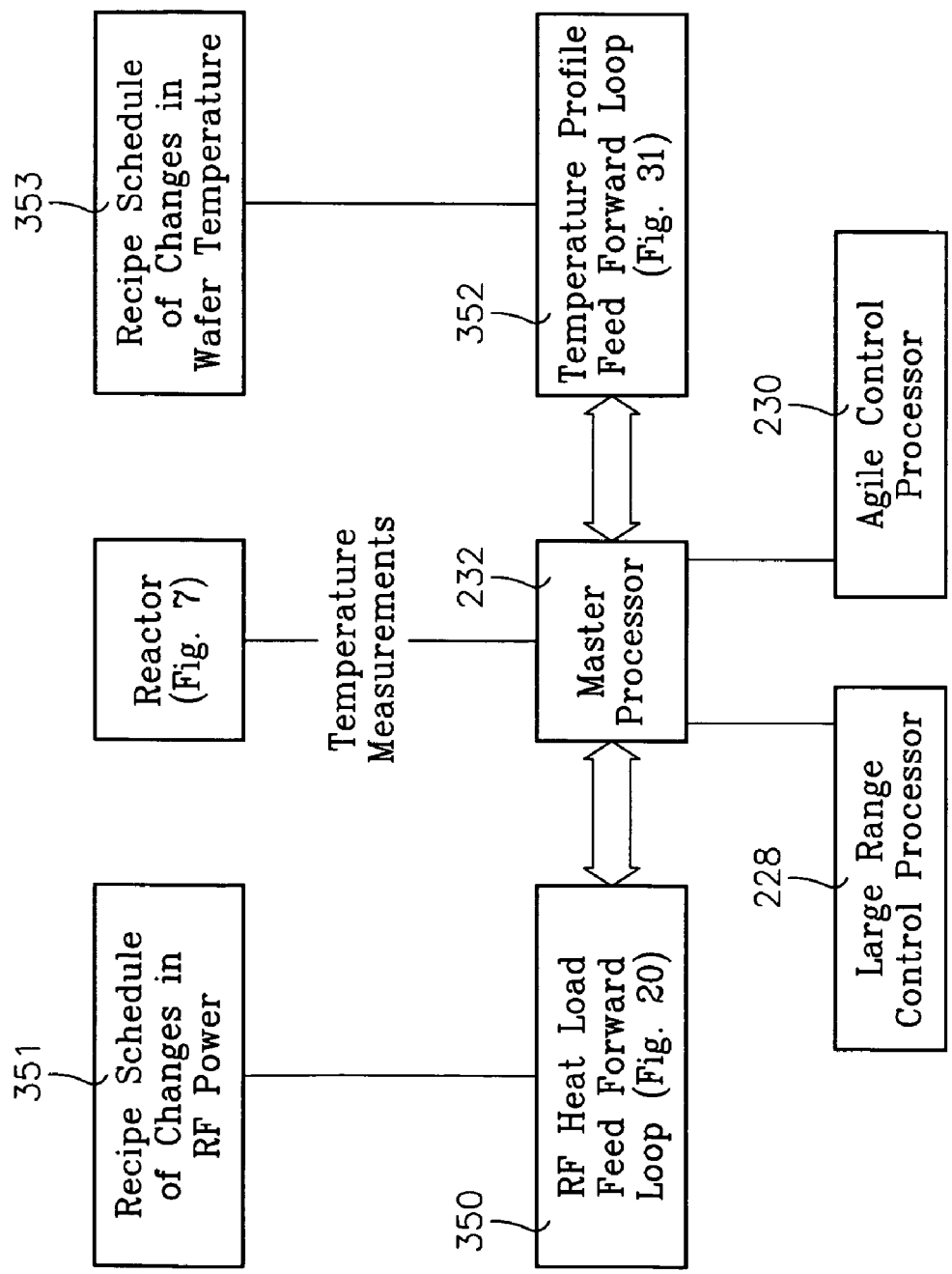
FIG. 36 is a block diagram of a control system capable of operating both the feed forward process of FIGS. 31A-C and 35A-C simultaneously.

In FIG. 36, the two feed forward processes (of FIGS. 28 and 31) are implemented simultaneously based upon temperature measurements from the reactor forwarded through the master processor 232. In FIG. 36, the RF heat load feed forward process 350 (corresponding to FIG. 28) is furnished with the schedule 351 of changes in RF power or heat load specified by the process recipe. The temperature profile feed forward process 352 (corresponding to FIG. 31) is furnished with the schedule 353 of wafer temperature changes specified by the process recipe. This produces simultaneous commands for adjustments to the refrigeration loop expansion valve 210 and simultaneous commands for adjustments to the backside gas pressure valve 229. The master processor 232 combines these simultaneous commands and forwards them to the expansion valve 210 and the backside gas pressure valve 229 through the large range control processor 224 and the agile control processor 230 respectively.

While the invention has been described in detail by specific reference to preferred embodiments, it is understood that variations and modifications thereof may be made without departing from the true spirit and scope of the invention.

What is claimed is:

1. A plasma reactor, comprising:
   a reactor chamber and an electrostatic chuck having a surface for holding a workpiece inside said chamber and having respective inner and outer zones;
   inner and outer zone backside gas pressure sources coupled to said electrostatic chuck for applying a thermally conductive gas under respective pressures to respective inner and outer zones of a workpiece-surface interface formed by a workpiece held on said surface;
   inner and outer zone heat exchangers coupled to said respective inner and outer zones of said electrostatic chuck;
   inner and outer zone temperature sensors coupled to inner and outer zones of said electrostatic chuck;
   a memory storing a schedule of changes in RF power;
   a thermal model capable of simulating heat transfer through said inner and outer zones, respectively, to said surface based upon measurements from said inner and outer temperature sensors, respectively;
   inner and outer zone first control processors coupled to said thermal model and governing said inner and outer zone backside gas pressure sources, respectively, in response to predictions from said model of changes in said respective pressures that would compensate for the effect of the next scheduled change in RF power in each respective one of said zones.

2. The reactor of claim 1 further comprising:
   inner and outer zone second control processors coupled to said thermal model and governing said inner and outer zone heat exchangers, respectively, in response to predictions from said model of changes thermal conditions in or near said inner and outer zones, respectively, that would compensate for the effect of the next scheduled change in RF power in each respective one of said zones.

3. The reactor of claim 2 wherein said model comprises:
   plural cascaded simulation elements representing thermal properties of corresponding layers of said electrostatic chuck for each one of said inner and outer zones.

4. The reactor of claim 3 wherein each of said simulation elements of said model comprises a heat capacitance value and a thermal resistance value representative of the corresponding layer of said electrostatic chuck for each one of said inner and outer zones.

5. The reactor of claim 1 further comprising an overhead electrode, a plasma source power RF generator, an impedance matching tuning stub having a stub resonant frequency and coupled between said plasma source power RF generator and said overhead electrode, said overhead electrode forming a resonance with plasma in said chamber at a plasma-electrode resonant frequency, said plasma-electrode resonant frequency, said stub resonant frequency and the frequency of said plasma source power RF generator being VHF frequencies that are nearly equal with a small offset between them.

6. The reactor of claim 1 wherein said electrostatic chuck comprises:
   an insulating puck layer having a top surface for receiving a wafer;
   a conductive base layer supporting said insulating puck layer;
   an ESC electrode buried in said insulating puck layer;
   a bias power feed conductor extending axially through said base and puck layers of said electrostatic chuck and having a top end connected to a feed point of said ESC electrode and a bottom end coupled to said RF plasma bias power generator; and a plurality of dielectric cylindrical sleeves surrounding respective portions of said bias power feed conductor and having respective lengths and dielectric constants that optimize uniformity of electric field distribution across said top surface of said insulating puck layer.

7. The reactor of claim 1 further comprising a dielectric ring lying on or in a plane of said top surface of said puck layer and surrounding a circumference corresponding to a workpiece diameter of said electrostatic chuck, said dielectric ring having a dielectric constant enabling said ring to compensate for RF edge effects over said electrostatic chuck during plasma processing of a workpiece.

8. The reactor of claim 1 wherein said electrostatic chuck comprises an upper insulating puck layer having a top surface for supporting a workpiece and a lower conductive base layer, and an axially extending cylindrical probe hole through said base layer and through a into said puck layer, and wherein at least one of said inner and outer zone temperature sensors comprises:

an upper probe comprising:

an elongate opaque insulative cylindrical upper probe housing extending axially into said probe hole beginning at a bottom end of the upper probe housing and terminating at a top end of the upper probe housing, said top end being located at a top end of said probe hole beneath said top layer, said bottom end being located at a bottom opening of said probe hole;

an optically responsive temperature transducer within said upper probe housing at said top end;

an optical fiber having a top end coupled to said optically responsive temperature transducer and extending axially through said upper probe housing.

9. The reactor of claim 8 wherein said one temperature sensor further comprises a lower probe comprising:

an elongate cylindrical lower probe housing extending axially from a top end facing and contacting said bottom end of said upper probe housing;

an optical fiber having a top end coupled to a bottom end of said optical fiber of said upper probe and extending axially through said lower probe housing.

10. The reactor of claim 8 wherein said upper probe housing has a diameter less than a Debeye length of a plasma in said reactor.

11. The reactor of claim 9 wherein said one temperature sensor further comprises:

an upper coil spring biasing said upper probe housing toward said top end of said probe hole; and a lower coil spring biasing said lower probe housing toward the bottom end of said upper probe housing, said upper coil spring having greater stiffness than said lower coil spring.

* * * * *

UNITED STATES PATENT AND TRADEMARK OFFICE
CERTIFICATE OF CORRECTION

PATENT NO. : 8,012,304 B2
APPLICATION NO. : 11/408559
DATED : September 6, 2011
INVENTOR(S) : Brillhart et al.

It is certified that error appears in the above-identified patent and that said Letters Patent is hereby corrected as shown below:

At Title page 2, Item (56) column 2, Line 64, under Other Publications, change "SAVC" to --SACV--.

At Title page 3, Item (56) column 1, Line 12, under Other Publications, change "(JWJx) ," to --(JWJx),--.

At Title page 3, Item (56) column 1, Line 14, under Other Publications, change "Inc.," to --Inc., Civil Action No.--.

At Title page 3, Item (56) column 1, Line 22, under Other Publications, change "(JWJx) ," to --(JWJx),--.

At Title page 3, Item (56) column 1, Line 32, under Other Publications, change "Peding" to --Pending--.

At column 4, Line 54, change "31A-13C." to --31A-31C.--.

At column 6, Line 57, change "MHz(due" to --MHz (due--.

At column 8, Line 63, change "CPHT" to --PCHT--.

At column 17, Line 29, change "Debeye" to --Debye--.

At column 19, Line 30, change "served" to --servoed--.

At column 32, Line 14, change "by" to --whenever--.

At column 32, Line 14, after "workpiece" insert --is--.

At column 33, Line 20, change "a" to --and--.

Signed and Sealed this
Twenty-eighth Day of February, 2012

David J. Kappos
*Director of the United States Patent and Trademark Office*

CERTIFICATE OF CORRECTION (continued)
U.S. Pat. No. 8,012,304 B2

At column 33, Line 23, after "upper probe" insert --within said puck layer and--.

At column 34, Line 9, after "lower probe" insert --within said base layer and--.

At column 34, Line 17, change "Debeye" to --Debye--.